US009337919B2

(12) United States Patent
Kikuchi et al.

(10) Patent No.: US 9,337,919 B2
(45) Date of Patent: May 10, 2016

(54) SIGNAL TRANSMISSION SYSTEM, CONNECTOR APPARATUS, ELECTRONIC DEVICE, AND SIGNAL TRANSMISSION METHOD

(75) Inventors: Hidekazu Kikuchi, Kanagawa (JP); Takayuki Mogi, Kanagawa (JP); Yoshiyuki Akiyama, Kanagawa (JP); Hirofumi Kawamura, Chiba (JP)

(73) Assignee: SONY CORPORATION, Tokyo (JP)

( * ) Notice: Subject to any disclaimer, the term of this patent is extended or adjusted under 35 U.S.C. 154(b) by 86 days.

(21) Appl. No.: 13/697,210

(22) PCT Filed: May 11, 2011

(86) PCT No.: PCT/JP2011/060824

§ 371 (c)(1), (2), (4) Date: Jan. 8, 2013

(87) PCT Pub. No.: WO2011/145491

PCT Pub. Date: Nov. 24, 2011

(65) Prior Publication Data

US 2013/0109317 A1 May 2, 2013

(30) Foreign Application Priority Data

May 18, 2010 (JP) ................................ 2010-114123

(51) Int. Cl.

*H04B 7/00* (2006.01)
*H04B 7/24* (2006.01)

(Continued)

(52) U.S. Cl.

CPC *H04B 7/24* (2013.01); *H01P 3/121* (2013.01); *H01P 5/107* (2013.01); *H01R 13/665* (2013.01); *H04B 3/56* (2013.01); *H05K 1/0239* (2013.01); *H01R 13/6461* (2013.01); *H01R 24/28* (2013.01); *H01R 24/76* (2013.01);

(Continued)

(58) Field of Classification Search

None

See application file for complete search history.

(56) References Cited

U.S. PATENT DOCUMENTS 6,324,379 B1 * 11/2001 Hadden .................. H04B 1/408 455/3.01
2002/0054746 A1 * 5/2002 Knighten ............ G02B 6/4292 385/134

(Continued)

FOREIGN PATENT DOCUMENTS

JP 10-154211 6/1998
JP 11-261533 A 9/1999

(Continued)

OTHER PUBLICATIONS

Jackson et al., Surface-to-Surface Transtion via Electromagnetic Coupling of Coplanar Waveguides, IEEE, VOL-MTT-35, No. 11, Nov. 1987, pp. 1027-1032.*

(Continued)

*Primary Examiner* — Mohammed Rachedine

(74) *Attorney, Agent, or Firm* — Oblon, McClelland, Maier & Neustadt, L.L.P.

(57) ABSTRACT

A signal transmission system including: a first connector apparatus, and a second connector apparatus that is coupled with the first connector apparatus. The first connector apparatus and the second connector apparatus are coupled together to form an electromagnetic field coupling unit, and a transmission object signal is converted into a radio signal, which is then transmitted through the electromagnetic field coupling unit, between the first connector apparatus and the second connector apparatus.

27 Claims, 29 Drawing Sheets

(51) Int. Cl.

| | |
|---|---|
| ***H01P 3/12*** | (2006.01) |
| ***H01P 5/107*** | (2006.01) |
| ***H04B 3/56*** | (2006.01) |
| ***H01R 13/66*** | (2006.01) |
| *H01R 103/00* | (2006.01) |
| *H01R 13/6461* | (2011.01) |
| *H01R 24/28* | (2011.01) |
| *H01R 24/76* | (2011.01) |
| *H05K 1/02* | (2006.01) |

(52) U.S. Cl.

CPC .......... *H01R2103/00* (2013.01); *H05K 1/0225* (2013.01); *H05K 2201/093* (2013.01); *H05K 2201/0969* (2013.01); *H05K 2201/09672* (2013.01); *H05K 2201/09754* (2013.01)

(56) References Cited

U.S. PATENT DOCUMENTS

| | | | | |
|---|---|---|---|---|
| 2003/0109284 | A1* | 6/2003 | Akerberg | H04W 16/10 455/561 |
| 2003/0112091 | A1* | 6/2003 | Lemke | H01P 3/08 333/33 |
| 2004/0111045 | A1* | 6/2004 | Sullivan | A61B 5/11 600/595 |
| 2004/0113239 | A1* | 6/2004 | Prokofiev | H01L 23/48 257/662 |
| 2006/0121944 | A1* | 6/2006 | Buscaglia | H04B 1/126 455/561 |
| 2006/0159158 | A1* | 7/2006 | Moore | G06F 1/1632 375/130 |
| 2007/0232232 | A1* | 10/2007 | Matsuo | G06K 7/10237 455/41.1 |
| 2008/0291324 | A1 | 11/2008 | Hong et al. | |
| 2011/0136554 | A1* | 6/2011 | Wong | H04M 1/0208 455/575.4 |

FOREIGN PATENT DOCUMENTS

| | | | | |
|---|---|---|---|---|
| JP | 2004-62158 | A | 2/2004 | |
| JP | 2004-318451 | | 11/2004 | |
| JP | 2005-92107 | A | 4/2005 | |
| JP | 2006-301610 | A | 11/2006 | |
| JP | 2008-526066 | A | 7/2008 | |
| JP | 2008-277253 | A | 11/2008 | |
| JP | 2009-268022 | | 11/2009 | |
| WO | WO 2006/013638 | A1 | 2/2006 | |
| WO | WO 2006013638 | A1 * | 2/2006 | H01R 13/6461 |
| WO | WO 2009/048063 | A1 | 4/2009 | |
| WO | WO 2009048063 | A1 * | 4/2009 | G02B 6/4201 |
| WO | WO 2010/035660 | A1 | 4/2010 | |

OTHER PUBLICATIONS

Jackson et al., IEEE Transaction on Microwave Theory and Techniques, vol. MTT-35, No. 11, Nov. 1987, pp. 1027-1032.*

Combined Chinese Office Action and Search Report issued Feb. 11, 2014 in Patent Application No. 201180023214.5 (with English language translation).

Office Action issued Jun. 11, 2013 in Japanese Patent Application No. 2010-114123.

"Gdps to Desktop: Speed Improvement is Pursued by UTP", http://www.atmarkit.co.jp/ait/articles/0303/29/news001.html, Mar. 29, 2003, 4 pages with English translation.

"Renesas", Downward Compatibility: Renesas Electronics, Jun. 27, 2013, 2 pages with English translation.

"Brief overview of PLC system", PLC-J, Jun. 27, 2013, 4 pages with English translation.

Extended European Search Report issued Dec. 16, 2014 in Patent Application No. 11783425.9.

Office Action issued Nov. 17, 2015 in Japanese Patent Application No. 2015-064172.

* cited by examiner

<FIRST EMBODIMENT: UNIDIRECTIONAL RADIO TRANSMISSION + CONDUCTING WIRE TRANSMISSION>

<FIRST EMBODIMENT: UNIDIRECTIONAL RADIO TRANSMISSION + CONDUCTING WIRE TRANSMISSION>

1A SIGNAL TRANSMISSION SYSTEM (FIRST EMBODIMENT: SECOND EXAMPLE)

<ELECTROMAGNETIC FIELD COUPLING UNIT: FIRST EXAMPLE>

<SPECIFIC STRUCTURE OF ELECTROMAGNETIC FIELD COUPLING UNIT: FIRST EXAMPLE (1 THEREOF)>

<SPECIFIC STRUCTURE OF ELECTROMAGNETIC FIELD COUPLING UNIT: FIRST EXAMPLE (2 THEREOF)>

<SPECIFIC STRUCTURE OF ELECTROMAGNETIC FIELD COUPLING UNIT: SECOND EXAMPLE>

(1) CONNECTOR SHAPE OF HDMI (2) CONNECTOR SHAPE OF USB 3.0

<SPECIFIC STRUCTURE OF ELECTROMAGNETIC FIELD COUPLING UNIT: THIRD EXAMPLE>

<SPECIFIC STRUCTURE OF ELECTROMAGNETIC FIELD COUPLING UNIT: THIRD EXAMPLE>

<FIRST EMBODIMENT: WIRED TRANSMISSION USING ELECTRICAL WIRING LINE>

FIG. 10A (1) EXAMPLE OF PIXEL CLOCK FREQUENCY USED IN COMPUTER DISPLAY

| FORMAT | FREQUENCY |
|---|---|
| VGA | 25MHz |
| SVGA | 40MHz |
| XGA | 65MHz |
| UXGA | 162MHz |

(2) EXAMPLE OF PIXEL CLOCK FREQUENCY USED IN DIGITAL TELEVISION

| FORMAT | FREQUENCY |
|---|---|
| 480p | 27MHz |
| 720p | 74. 25MHz |
| 1080p | 148. 5MHz |
| 2160p | 594MHz |

<FIRST EMBODIMENT: WIRED TRANSMISSION USING ELECTRICAL WIRING LINE>

404A WIRED COMMUNICATION UNIT (FIRST EMBODIMENT)

<FIRST EMBODIMENT: WIRED TRANSMISSION USING ELECTRICAL WIRING LINE>

800A BROADBAND INFORMATION PROCESSING UNIT (FIRST EMBODIMENT)

<SECOND EMBODIMENT: BIDIRECTIONAL RADIO TRANSMISSION>

<SECOND EMBODIMENT: BIDIRECTIONAL RADIO TRANSMISSION>

1B SIGNAL TRANSMISSION SYSTEM (SECOND EMBODIMENT: FIRST EXAMPLE)

<SECOND EMBODIMENT: BIDIRECTIONAL RADIO TRANSMISSION>

SIGNAL TRANSMISSION SYSTEM (SECOND EMBODIMENT: SECOND EXAMPLE)

<THIRD EMBODIMENT: CONNECTION DETECTION MECHANISM>

1C SIGNAL TRANSMISSION SYSTEM (THIRD EMBODIMENT: FIRST EXAMPLE)

<THIRD EMBODIMENT: CONNECTION DETECTION MECHANISM>

1C SIGNAL TRANSMISSION SYSTEM (THIRD EMBODIMENT: SECOND EXAMPLE)

<FIFTH EMBODIMENT: APPLICATION OF RADIO TRANSMISSION WITH RESPECT TO POWER SUPPLY CABLE>

1E SIGNAL TRANSMISSION SYSTEM (FIFTH EMBODIMENT: FIRST EXAMPLE)

<SPECIFIC STRUCTURE OF ELECTROMAGNETIC FIELD COUPLING UNIT: FIFTH EMBODIMENT>

<FIFTH EMBODIMENT: APPLICATION OF RADIO TRANSMISSION WITH RESPECT TO POWER SUPPLY CABLE>

1E SIGNAL TRANSMISSION SYSTEM (FIFTH EMBODIMENT: SECOND EXAMPLE)

<FIFTH EMBODIMENT: APPLICATION OF RADIO TRANSMISSION WITH RESPECT TO POWER SUPPLY CABLE>

1E SIGNAL TRANSMISSION SYSTEM (FIFTH EMBODIMENT: APPLICATION EXAMPLE)

SIGNAL TRANSMISSION SYSTEM, CONNECTOR APPARATUS, ELECTRONIC DEVICE, AND SIGNAL TRANSMISSION METHOD

TECHNICAL FIELD

The present invention relates to a signal transmission system, a connector apparatus, an electronic device, and a signal transmission method.

BACKGROUND ART

When a signal is transmitted from one device to the other device, signal transmission (including power supply) may be performed through a connector.

In this case, when electrical connection is performed through the connector, there are standards in a casing shape and a signal interface including a terminal unit and a fitting structure and electrical and mechanical interfaces of one device and the other device are defined according to the standards.

For example, recently, downsizing of electronic devices such as a mobile phone, a PDA, a video camera, and a digital camera has progressed and new interfaces that enable high-speed transmission have been standardized. In addition, a shape of a small connector has been standardized to correspond to the downsizing of devices such as a mini-USB and an HDMI (High-Definition Multimedia Interface (HDMI) type C, in the individual interface standard (refer to Patent Literature 1).

CITATION LIST

Patent Literature

Patent Literature 1: JP 2008-277253A

SUMMARY OF INVENTION

Technical Problem

However, when a connection interface is realized by an electrical contact (that is, electrical wiring line) of the terminal unit of the connector, there occur the following problems.

1) In signal transmission using the electrical contact, there are limitations in a transmission speed and a transmission capacity. This is because shapes and placements of connector electrodes designed for old generations are not suitable for a broadband. In order to overcome the limitations, a method using signal shaping techniques such as a cable equalizer, an echo canceller, and a crosstalk canceller is considered. However, if a wider bandwidth is required (for example, more than 5 Gb/s), it is very difficult to manufacture the connector using the signal shaping techniques.

2) A method of increasing the number of wiring lines and decreasing a transmission speed per signal line by parallelization of signals is considered to cope with a problem of high-speed data transmission. However, if the method is used, this may increase the number of input/output terminals, which results in deteriorating compatibility with the existing connector.

3) A method of adding a new signal interface for high-speed transmission from USB 2.0 to USB 3.0, separately from the existing signal interface, is also known. However, it is difficult for the method to be applied to the case of a shape of a connector in which it is difficult to add pins under constraints where the pins can be inserted into a connector of a current generation.

The present invention has been made in view of the above circumstances and it is an object of the present invention to provide a new structure to realize connection interfaces of signals such as a video signal and a computer image for which high speed and large capacity are required, while resolving at least one of the problems 1) to 3) described above, when a signal interface is realized by connector connection.

Solution to Problem

According to one aspect of the present invention in order to achieve the above-mentioned object, there is provided a signal transmission system including a first connector apparatus and a second connector apparatus coupled with the first connector apparatus. In addition, the first connector apparatus and the second connector apparatus are coupled together to form an electromagnetic field coupling unit and a transmission object signal is converted into a radio signal, which is then transmitted through the electromagnetic field coupling unit.

Specifically, the signal transmission system includes a first signal converting unit that executes modulation processing on the basis of the transmission object signal and converts the signal into a high-frequency signal and a second signal converting unit that executes demodulation processing on the basis of a received radio signal and converts the signal into a baseband signal. The first connector apparatus has a first radio coupling unit that is electrically connected to the first signal converting unit and the second connector apparatus has a second radio coupling unit that is electrically connected to the second signal converting unit.

In addition, the first connector apparatus and the second connector apparatus are coupled together to form the electromagnetic field coupling unit between the first radio coupling unit and the second radio coupling unit, the transmission object signal is converted into the high-frequency signal by the first signal converting unit, and a radio signal based on the high-frequency signal is transmitted to the second signal converting unit through the electromagnetic field coupling unit.

In short, connector connection of signals is realized by radio transmission using electromagnetic field coupling. Therefore, high-frequency-related constraints of shapes and placements of connector electrodes designed for old generation interfaces can be eliminated and an application of signal shaping techniques is not necessarily required.

Advantageous Effects of Invention

According to the present invention, connection interfaces of signals for which high speed and large capacity are required can be realized, different from connection interfaces using contacts.

The present invention can be applied to a connector not having a structural room in which contact pins cannot be additionally provided. The connection interfaces using the contacts can be continuously maintained. In this case, connection interfaces of signals for which high speed and large capacity are required can be realized while backward compatibility with an existing connector is maintained.

BRIEF DESCRIPTION OF DRAWINGS

FIG. 10A is an illustration of an example of a clock frequency of digital image data.

DESCRIPTION OF EMBODIMENTS

Figure 1:
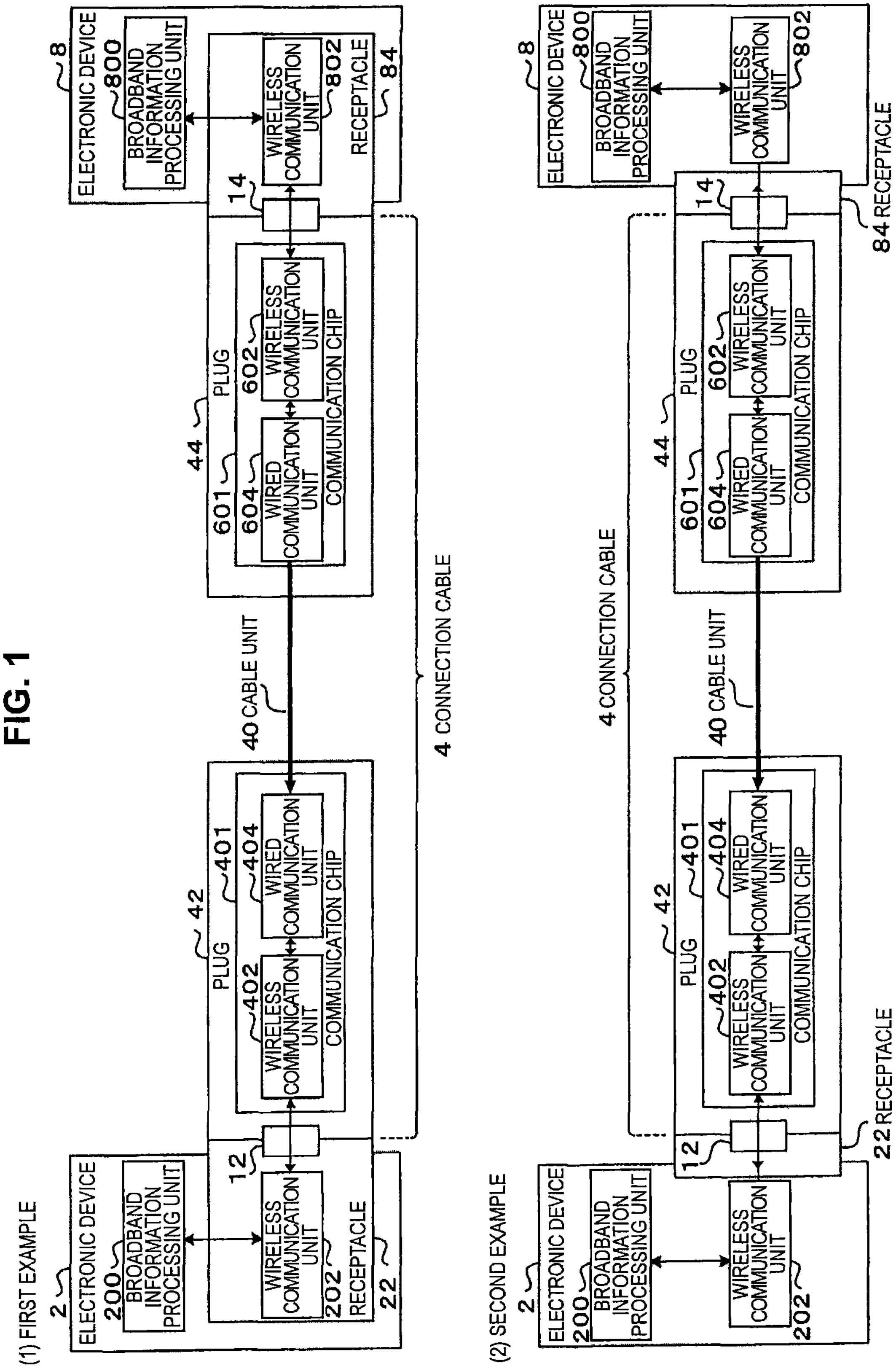
FIG. 1 is an illustration of a basic configuration of a signal transmission system according to this embodiment.

When functional elements are distinguished for each embodiment, reference letters of English capital letters such as A, B, C, . . . are added to the reference signs and the structural elements are added to the reference signs. When the functional elements do not need to be distinguished for each embodiment, the reference letters are omitted. This is applicable to the drawings.

The following description will be made in the order described below.

1. Entire Outline (Basic Concept and Basic Configuration)
2. First Embodiment (Unidirectional Signal Transmission: Transmission using Conducting Wire in Cable)
3. Second Embodiment (Bidirectional Signal Transmission: Transmission using Conducting Wire in Cable)
4. Third Embodiment (Connection Compatibility Detection Mechanism)
5. Fourth Embodiment (Optical Transmission in Cable)
6. Fifth Embodiment (Application with respect to Power Supply Cable)
7. Comparison with Examples <Entire Configuration>

[Basic Concept]

A structure according to this embodiment is characterized in that, when a first electronic device and a second electronic device are connected by a cable, a signal transmission in a connector portion is performed using radio transmission, not an electrical contact based on a contact (pin). When the electronic device and the cable are connected (fitted) by a connector (that is, in a state in which both the electronic device and the cable are arranged at a relatively short distance), a transmission object signal is converted into a radio signal, which is then transmitted through a radio signal transmission path. As a mechanism for achieving the configuration described above, a coupling unit that is connected to a signal converting unit (hereinafter, also called a wireless communication unit) to execute modulation processing or demodulation processing is provided in each connector unit and connectors are coupled together to form an electromagnetic field coupling unit between both the coupling units.

When (a coupling structure of) the connector apparatus is configured according to a certain standard (for example, industry standard), the electromagnetic field coupling unit that is formed to have a waveguide structure to satisfy a shape of the coupling structure according to the standard. Preferably, configurations of each signal coupling unit and the radio signal transmission path may be applied to a coupling structure when a receptacle and a plug are fitted. For example, a method using a hole (or porosity) provided in the coupling structure, a resin mold, or a metal material in the waveguide structure is considered. For example, according to the standard, the shape and the position of the coupling structure may be standardized. In this case, compatibility with an existing connector can be easily secured by applying a configuration in which the radio transmission path is coupled to a predetermined place of the coupling structure.

The standards (which are also called standard interfaces) are not limited to a current standard and include standards established in the future. For example, the standard is typically a public interface used to establish uniformity in a domain of hardware development or software development, according to a fair (legal) technical guideline (de jure technical guideline) approved by a non-commercial organization or a government organization (public standard group) such as IEEE (Institute of Electrical and Electronics Engineers, Inc.) or JIS (Japanese Industrial Standard). However, the standard is not limited to the public interface and may be a personal standard interface gathered in a private sector or a single company, that is, a so-called industry standard interface (industrial standard interface) or a virtual industry standard interface. At all events, the standard may be connection interface to satisfy a certain constant decision. For example, even when a product or an idea is developed by a certain company, is used widely, and becomes an actual (de facto) technical guideline (unofficial standard), the corresponding standard becomes the standard according to this embodiment.

Fro example, a connector fitting unit may be covered with a metal material (shield case) and a lock mechanism that includes a combination of a concave portion and a convex portion may be provided in a part of the metal material to make joining between connector strong. In this case, a thin electromagnetic field coupling unit (which is configured using a pair of coupler units of both the connectors) is buried in a side of the metal material forming the shield case and when the connectors are coupled, both the coupler units face each other and radio transmission is performed. At this time, if the electromagnetic field coupling unit is configured using the metal material and the lock mechanism, the electromagnetic field coupling unit can be configured without changing a shape of the connector from the existing shape.

A millimeter waveband is described as a carrier frequency used by a signal transmission system (radio transmission system) according to this embodiment. A structure according to this embodiment is not limited to the millimeter waveband and is applicable to the case in which a carrier frequency of a submillimeter waveband having a wavelength shorter than that of the millimeter waveband is used. The signal transmission system according to this embodiment is applied to connection between devices in a digital record reproducing device, a terrestrial television receiver, a mobile phone, a game machine, and a computer, as a preferable example.

As an application place of the connector, the connector is typically provided in each of the side of an electronic device and the side of a cable, when a plurality of (typically, two) electronic devices are connected by the cable. However, the present invention is not limited to the above aspect. The two electronic devices may be connected without using the cable. In this case, the structure according to this embodiment may be applied to the connector of the connection place of each electronic device. For example, a connector in the case in which a USB memory is inserted into a body of an electric device corresponds to the above case. A single side of the cable may be integrated with the electronic device. In this case, the structure according to this embodiment may be applied to the connector of the side that is not integrated with the electronic device. Because the side integrated with the electronic device is not the connector connection, it is needless to say that it becomes unnecessary to apply the radio transmission to the corresponding place. For example, a video cable of a display monitor or an AC cable of the electronic device corresponds to the cable. When the cable is not connected to the electronic device and the connection cables are connected to each other, one connection cable may be an extension cable. The extension cable may have a plurality of connection ports. For example, a hub, a router, and a table tap correspond to the connection ports.

A combination of a pair of a transmitting unit and a receiving unit with the radio transmission path therebetween is disposed in a connector pair (each of a receptacle and a plug). A signal transmission between both the connectors may be a unidirectional signal transmission and may be a bidirectional signal transmission. For example, when the receptacle becomes the transmission side and the plug becomes the reception side, the transmitting unit is disposed in the receptacle and the receiving unit is disposed in the plug. When the plug becomes the transmission side and the receptacle becomes the reception side, the transmitting unit is disposed in the plug and the receiving unit is disposed in the receptacle.

For example, in the case of the connector that connects the device and the cable, a contact electrode to transmit power or a signal and the electromagnetic field coupling unit (radio coupler) in which a relative position with the electrode is determined are provided in the receptacle and the plug. When the plug is inserted into the receptacle, electrodes contact (are connected) and radio couplers face each other. The transmitting unit or the receiving unit is connected to the radio coupler. Thereby, a radio signal transmission can be performed in a connector connection portion.

The transmitting unit includes, for example, a signal generating unit of the transmission side that executes signal processing on a transmission object signal and generates a millimeter-wave signal (signal converting unit that converts a transmission object electrical signal into a millimeter-wave signal) and a signal coupling unit of the transmission side that couples the millimeter-wave signal generated by the signal generating unit of the transmission side to a transmission path (millimeter-wave signal transmission path) to transmit the millimeter-wave signal. Preferably, the signal generating unit of the transmission side may be integrated with a functional unit that generates the transmission object signal.

For example, the signal generating unit (signal converting unit) of the transmission side has a modulation circuit that modulates the transmission object signal. The signal generating unit of the transmission side performs frequency conversion on the signal modulated by the modulation circuit and generates the millimeter-wave signal (high-frequency signal). In principle, a method of directly converting the transmission object signal into the millimeter-wave signal is also considered. The signal coupling unit of the transmission side supplies the millimeter-wave signal generated by the signal generating unit of the transmission side to a millimeter-wave signal transmission path.

Meanwhile, the receiving unit includes, for example, a signal coupling unit of the reception side that receives the millimeter-wave signal transmitted through the millimeter-wave signal transmission path and a signal generating unit of the reception side that executes signal processing on the millimeter-wave signal (input signal) received by the signal coupling unit of the reception side and generates a normal electrical signal (transmission object signal) (signal converting unit that converts the millimeter-wave signal into a transmission object electrical signal). Preferably, the signal generating unit of the reception side may be integrated with a functional unit that receives the transmission object signal. For example, the signal generating unit of the reception side has a demodulation circuit. The signal generating unit performs frequency conversion on the millimeter-wave signal and generates an output signal. Then, the demodulation circuit demodulates the output signal and generates the transmission object signal.

In principle, a method of directly converting the millimeter-wave signal into the transmission object signal is also considered.

That is, when a signal interface between the receptacle and the plug is taken, the transmission object signal is transmitted contactlessly by the millimeter-wave signal (is transmitted without using an electrical wiring line). Preferably, at least a signal transmission (in particular, transmission of a signal for which a high-speed transmission is required) is transmitted contactlessly by a communication interface based on the millimeter-wave signal. In short, the signal transmission that is performed by an electrical contact (electrical wiring line) through the coupling structure between the receptacle and the plug is performed by wireless by the millimeter-wave signal. By performing the signal transmission by the millimeter waveband, a high-speed signal transmission of the Gbps order can be realized. In addition, the extent of the millimeter-wave signal can be limited and an effect due to this property is also obtained.

With respect to a signal in which the high-speed transmission is not required, the signal may be performed contactlessly by the communication interface based on the millimeter-wave signal.

In this case, each signal coupling unit may be configured such that the receptacle and the plug can transmit the millimeter-wave signal through the millimeter-wave signal transmission path. For example, each signal coupling unit may include an antenna structure (antenna coupling unit) and take electromagnetic coupling or may not include the antenna structure and take electrostatic or magnetic coupling using resonance.

The "millimeter-wave signal transmission path to transmit the millimeter-wave signal" may be air (so-called free space). However, preferably, the millimeter-wave signal transmission path has a structure to transmit the millimeter-wave signal while confining the millimeter-wave signal in the transmission path. For example, a millimeter-wave signal transmission path (called a dielectric transmission path or a transmission path in a millimeter-wave dielectric) that is made of a dielectric material capable of transmitting the millimeter-wave signal or a millimeter-wave signal transmission path in which a shield material to form a transmission path and suppress external radiation of the millimeter-wave signal is provided and an inner portion of the shield material is used as a hollow waveguide is considered. For example, a shield case may exist as an exterior of the connector. However, the shield case can be used as the shield material. In this case, a configuration in which a thin radio coupling unit is buried in a side of the shield case and when connectors are coupled, both coupling units face each other and radio transmission is performed is considered. When the receptacle and the plug are fitted, the distance between the millimeter-wave coupling units can be significantly decreased. For this reason, even when there is no secure confinement structure, external radiation or external influence can be suppressed.

In addition, in the case of the air (so-called free space), each signal coupling unit takes the antenna structure or the resonance structure to transmit a signal through a short-distance space. Meanwhile, when the signal transmission path is configured using the dielectric material, each signal coupling unit can take the antenna structure. However, it is not essential to take the antenna structure and a high-frequency signal may be transmitted through the waveguide.

Preferably, the other connector unit includes a determining unit (hereinafter, also called a connection compatibility determining unit) that determines whether a radio signal can be transmitted. Preferably, the other connector unit includes a notifying unit that notifies a determination result of the connection compatibility determining unit using display or sound.

Preferably, the connection compatibility determining unit determines whether the other connector unit has a radio coupling unit and can form an electromagnetic field coupling unit and determines a specification of a radio signal is common between the connector unit and the other connector unit. In the case in which the other connector unit has the radio coupling unit and the specification of the radio signal is common between the connector unit and the other connector unit, the connection compatibility determining unit determines that the radio signal can be transmitted. In the other cases, the connection compatibility determining unit determines that the radio signal cannot be transmitted through the radio coupling unit.

As the connection compatibility determining unit, a power detecting unit that detects power of a signal component or a code detecting unit that detects a predetermined code on the basis of a reception signal received by the wireless communication unit is used. For example, a function for detecting presence of the facing coupler units and a function for recognizing that a radio signal transmission is valid, when there are the facing coupler units, may be provided, corresponding information may be shared between devices connected by the connectors, and radio utilization may be controlled. That is, a control operation is performed such that radio transmission of a transmission object signal through each connector apparatus is allowed in the case in which all of the connector apparatuses have the radio coupling unit and the radio transmission of the transmission object signal is forbidden in the other cases. Even though the interface according to this embodiment and the interface according to the related art are used together, a narrowband transmission and a broadband transmission can be selected timely by mutually recognizing compatibility of the radio function and backward compatibility from a viewpoint of the signal transmission can be secured.

When the electronic devices are connected by the connection cable, broadband information is transmitted by the connection cable after an interface in a connector connecting unit is realized by wireless. In this case, preferably, a synchronization clock that is used in signal processing to transmit the broadband information by the connection cable may be generated on the basis of a carrier signal to perform the radio transmission. Because a circuit to generate the synchronization clock can be simplified and the signal can be processed in a state in which the synchronization clock and the carrier signal are synchronized with each other, a characteristic of a radio circuit (a modulation circuit or a demodulation circuit) is avoided from being changed by low-frequency beats of the synchronization clock and the carrier signal.

Preferably, a timing signal used at the time of signal processing may be generated on the basis of a carrier signal used for modulation processing or demodulation processing and the timing signal and the carrier signal may be synchronized with each other, so that a circuit scale of a timing signal generating unit is decreased and a modulation characteristic is suppressed from being changed.

Preferably, the connection cable transmits an optical signal. In this case, an electrical signal obtained by demodulating the radio signal is converted into an optical signal and the optical signal is supplied to the connection cable. The optical signal transmitted through the connection cable is converted into the electrical signal and the electrical signal is used as a transmission object signal for the modulation processing. If the signal transmission in the connection cable before and after the radio transmission is realized by the optical transmission, a high speed and a large capacity can be realized with regard to the signal transmission of the connection cable.

[Basic Configuration]

FIG. 1 is an illustration of a basic configuration of a signal transmission system according to this embodiment. A signal transmission system 1 includes a first electronic device 2, a connection cable 4 (one aspect of a connector apparatus: called a harness or a cable connector), and a second electronic device 8.

The connection cable 4 includes a cable unit 40, a connector unit (a connector plug: hereinafter, called a plug 42) that is provided in an end of the cable unit 40 at the side of the electronic device 2, and a connector unit (a connector plug: hereinafter, called a plug 44) that is provided in an end of the cable unit 40 at the side of the electronic device 8.

In the electronic device 2, a connector unit (a connector receptacle: hereinafter, called a receptacle 22) into which the plug 42 of the connection cable 4 can be fitted is provided. In the electronic device 8, a connector unit (a connector receptacle: hereinafter, called a receptacle 84) into which the plug 44 of the connection cable 4 can be fitted is provided. By connecting the electronic device 2 and the electronic device 8 by the connection cable 4, a signal transmission from the electronic device 2 to the side of the electronic device 8 or a signal transmission from the electronic device 8 to the side of the electronic device 2 can be performed.

In this case, in the signal transmission system 1 according to this embodiment, in addition to a normal electrical connection system using a contact electrode, a system for performing radio signal connection is provided. Hereinafter, focusing on the radio connection system, explanation is given.

In the connection cable 4, the plug 42 includes a communication chip 401 that is an integrated circuit including a wireless communication unit 402 and a wired communication unit 404 and the plug 44 includes a communication chip 601 that is an integrated circuit including a wireless communication unit 602 and a wired communication unit 604.

The electronic device 2 includes a broadband information processing unit 200 that processes broadband data to be an example of a baseband signal becoming a radio signal transmission object and a wireless communication unit 202 that corresponds to the wireless communication unit 402 of the plug 44. A portion between the wireless communication unit 202 and the wireless communication unit 402 is a portion to perform radio signal connection and an electromagnetic field coupling unit 12 is configured in the portion.

The electronic device 8 includes a broadband information processing unit 800 that processes broadband data to be an example of a baseband signal becoming a radio signal transmission object and a wireless communication unit 802 that corresponds to the wireless communication unit 602 of the plug 46. A portion between the wireless communication unit 602 and the wireless communication unit 802 is a portion to perform the radio signal connection and an electromagnetic field coupling unit 14 is configured in the portion.

Although not shown in the drawings, each of the electronic device 2 and the electronic device 8 may include a narrowband information processing unit that processes narrowband data to be an example of a signal not becoming a radio signal transmission object, a clock processing unit that processes a clock signal, and a power supply unit, which are not essential elements. For example, when signal processing to perform wired transmission by the cable unit 40 is executed or data reproduction processing is executed by the electronic device 2 and the electronic device 8 of the reception side, a synchronization clock (which is also called a data clock) that is equal to that of the data generation side may be used. A method of transmitting data after overlapping the synchronization clock to the data is also considered. However, to transmit the synchronization clock and the data in a separated state is a simplest method. Instead of the synchronization clock, a reference lock in which a phase with the data is not fixed, but only a frequency has an accurate integration ratio with a data rate may be transmitted.

In the case of a first configuration example illustrated in FIG. 1(1), the wireless communication unit 202 is stored inside the receptacle 22 and the wireless communication unit 802 is stored inside the receptacle 84. Meanwhile, in the case of a second configuration example illustrated in FIG. 1(2), the wireless communication unit 202 is stored outside the receptacle 22 (inside a casing of the electronic device 2) and the wireless communication unit 802 is stored outside the receptacle 84 (inside a casing of the electronic device 8). The other point is the same as the first configuration example. The case of the second example is advantageous in that the wireless communication unit 202 and the broadband information processing unit 200 (and a narrowband information processing unit) can be stored in one semiconductor integrated circuit and the wireless communication unit 802 and the broadband information processing unit 800 (and a narrowband information processing unit) can be stored in one semiconductor integrated circuit.

The broadband information processing unit 200 and the broadband information processing unit 800 and the wireless communication unit 202 and the wireless communication unit 802 may correspond to one of processing of a transmission system and processing of a reception system or both the processing of the transmission system and the processing of the reception system. For example, when the signal transmission of the broadband information from the side of the electronic device 2 to the side of the electronic device 8 is performed, the broadband information processing unit 200 functions as a broadband information generating unit, the wireless communication unit 202 functions as a radio transmitting unit, the broadband information processing unit 800 functions as a broadband information reproducing unit, and the wireless communication unit 802 functions as a radio receiving unit. The broadband information processing unit 200 generates a baseband signal of a broadband and transmits the baseband signal to the wireless communication unit 202. The broadband information processing unit 800 executes predetermined signal processing on the basis of the baseband signal of the broadband demodulated by the wireless communication unit 802.

When the signal transmission of the broadband information from the side of the electronic device 8 to the side of the electronic device 2 is performed, the broadband information processing unit 800 functions as a broadband information generating unit, the wireless communication unit 802 functions as a radio transmitting unit, the broadband information processing unit 200 functions as a broadband information reproducing unit, and the wireless communication unit 202 functions as a radio receiving unit. The broadband information processing unit 800 generates a baseband signal of a broadband and transmits the baseband signal to the wireless communication unit 802. The broadband information processing unit 200 executes predetermined signal processing on the basis of the baseband signal of the broadband demodulated by the wireless communication unit 202.

When the signal transmission system corresponds to the bidirectional communication, the broadband information processing unit 200, the broadband information processing unit 800, the wireless communication unit 202, and the wireless communication unit 802 are operated to realize both the functions. That is, the broadband information processing unit 200 generates the baseband signal of the broadband and executes the signal processing on the basis of the baseband signal demodulated by the wireless communication unit 202. The broadband information processing unit 800 generates the baseband signal of the broadband and executes the signal processing on the basis of the baseband signal demodulated by the wireless communication unit 802.

The wired communication unit 404 and the wired communication unit 604 are connected by the cable unit 40 such as a conducting wire (an electrical wiring line) or an optical wiring line (an optical cable or an optical sheet bus) and the baseband signal (broadband data) of the broadband is transmitted between the wired communication unit 404 and the wired communication unit 604 by wire.

If the structure described above is adopted, a signal interface of a transmission speed and a transmission capacity that are rarely realized by the electrical wiring line can be realized, when the signal transmission is performed in a state in which the receptacle and the plug are coupled (fitted). At this time, because it is not necessary to provide large wiring lines needed when the connection is performed by the electrical wiring line, a casing shape or structure is not complicated. If the millimeter waveband is used, the high-speed signal transmission can be easily realized without depending on the electrical wiring line and interference with respect to other electrical wiring lines in the cable connection between the devices is not generated. The signal interface between the receptacle and the plug can be constructed with a simple and low-priced configuration using a radio (millimeter-wave) signal unidirectionally or bidirectionally, without depending on a connector having a small shape or a large number of terminals and a signal wiring line.

First Embodiment

Figure 2:
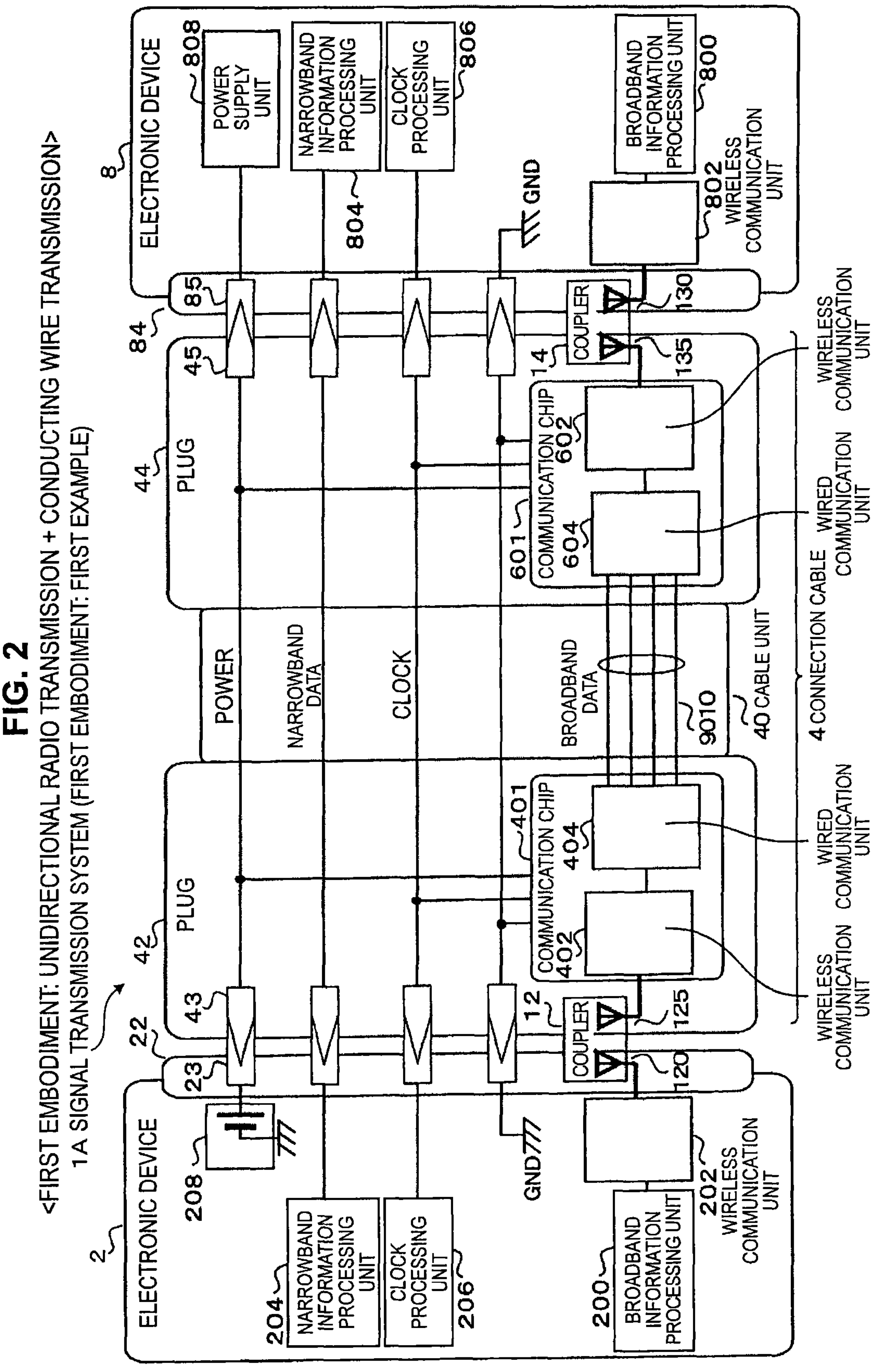
FIG. 2 is an illustration of an entire configuration of a signal transmission system according to a first embodiment (first example).
Figure 2A:
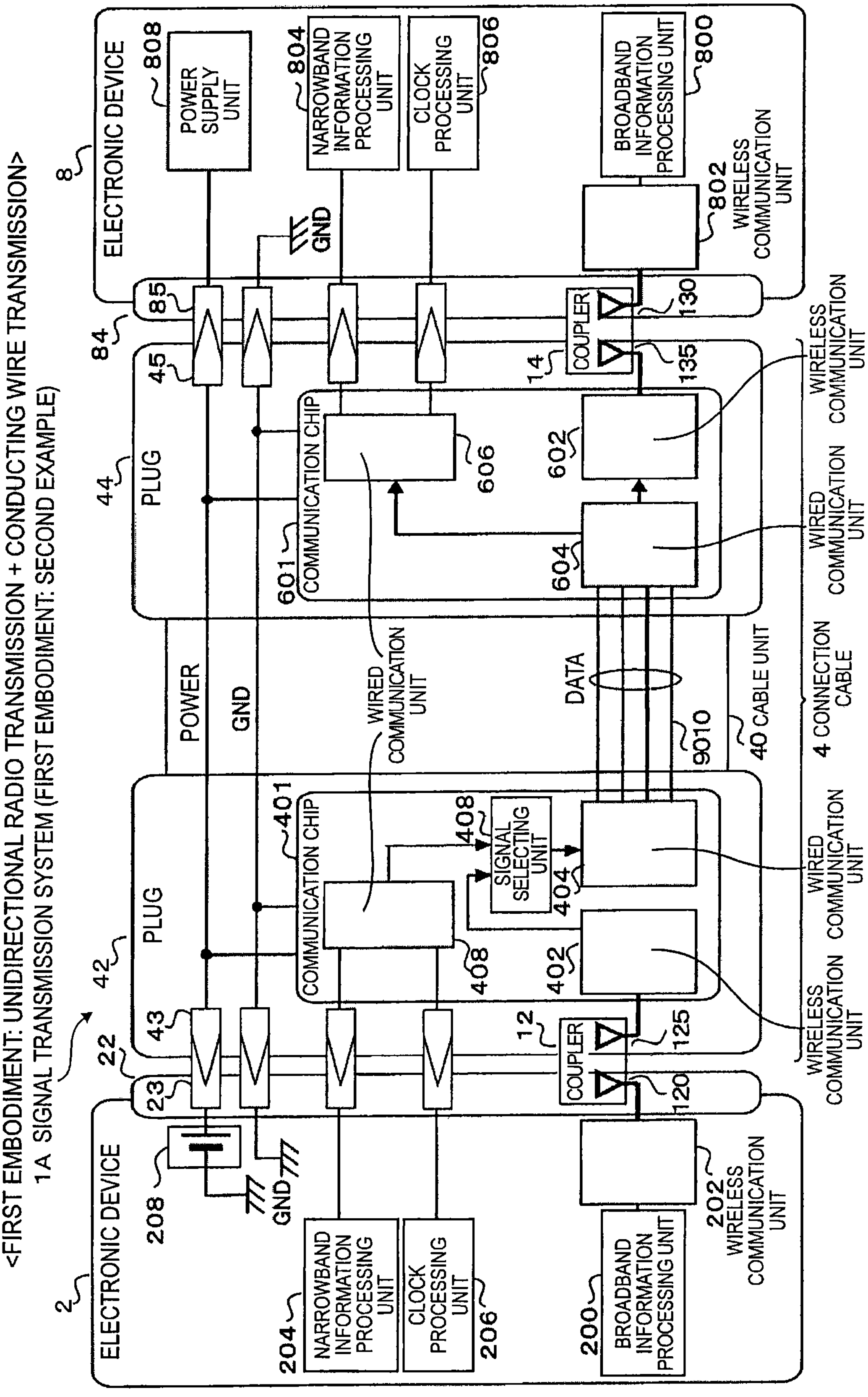
FIG. 2A is an illustration of an entire configuration of a signal transmission system according to the first embodiment (second example).

FIGS. 2 and 2A are illustrations of an entire configuration of the signal transmission system 1 according to the first embodiment. In the first embodiment, a structure according to this embodiment for performing radio transmission of a broadband signal by the connector unit is applied to unidirectional communication in which the signal transmission from the side of the electronic device 2 to the side of the electronic device 8 is performed. In particular, the first embodiment is different from a fourth embodiment to be described below in that unidirectional communication is performed and wired transmission for the broadband signal in the connection cable 4 is performed by an electrical wiring line (conducting wire 9010).

In this case, a configuration of a first example of the first embodiment illustrated in FIG. 2 is an aspect in which the cable unit 40 transmits the narrowband signal and the broadband signal by different wiring lines, respectively. A configuration of a second example of the first embodiment illustrated in FIG. 2A is an aspect in which the cable unit 40 transmits the narrowband signal and the broadband signal by a common wiring line (which is not limited to the electrical wiring line and may include the optical wiring line). FIGS. 2 and 2A illustrate a state in which the first electronic device 2 and the second electronic device 8 are connected by the connection cable 4.

Configuration

First Example

First, the configuration of the first example illustrated in FIG. 2 will be described. The first electronic device 2 includes a broadband information processing unit 200 (broadband information generating unit) and a wireless communication unit 202 (radio transmitting unit). The electronic device 2 includes a narrowband information processing unit 204 (narrowband information generating unit) that processes narrowband data to be an example of a signal not becoming a radio signal transmission object, a clock processing unit 206 (clock generating unit) that processes a clock signal, and a power supply unit 208. The power supply unit 208 has a power supply circuit that supplies power (DC voltage) to the side of the second electronic device 8 through the connection cable 4.

Contact electrodes 23 (contact pins) are provided in the receptacle 22 to perform connection of the narrowband information processing unit 204, the clock processing unit 206, the power supply unit 208, and a reference potential (ground: GND) common to each signal with respect to the side of the electronic device 8 by an electrical wiring line (conducting wire connection). Also, contact electrodes 43 are provided in the plug 42 of the connection cable 4 fitted into the contact electrodes 23 of the receptacle 22. The contact electrodes 23 and the contact electrodes 43 are collectively called contacts.

In order to form the electromagnetic field coupling unit 12 to perform radio signal connection between the wireless communication unit 202 outside the receptacle 22 and the wireless communication unit 402 inside the plug 42, a coupler unit 120 (radio coupling unit) is provided in the receptacle 22 and a coupler unit 125 (radio coupling unit) is provided in the plug 42.

The second electronic device 8 includes a broadband information processing unit 800 (broadband information reproducing unit) and a wireless communication unit 802 (radio receiving unit). The electronic device 8 further includes a narrowband information processing unit 804 (narrowband information reproducing unit) that processes narrowband data to be an example of a signal not becoming a radio signal transmission object, a clock processing unit 806 (clock reproducing unit) that processes a clock signal, and a power supply unit 808. The power supply unit 808 has a power stabilization circuit (direct current-direct current conversion circuit: DC-DC converter) that generates stabilized secondary power, on the basis of the power supplied from the side of the first electronic device 2 through the connection cable 4. The power supply unit 808 can use a power stabilization circuit using a reference power supply such as a three-terminal regulator or a Zener diode. A DC voltage that is generated by the power supply unit 208 may be used at the side of the electronic device 8, without providing the power supply unit 808.

Contact electrodes 85 (contact pins) are provided in the receptacle 84 to perform connection of the narrowband information processing unit 804, the clock processing unit 806, the power supply unit 808, and a reference potential (ground: GND) common to each signal with respect to the side of the electronic device 2 by an electrical wiring line (conducting wire connection). Also, contact electrodes 45 are provided in the plug 44 of the connection cable 4 fitted into the contact electrodes 85 of the receptacle 84. The contact electrodes 45 and the contact electrodes 85 are collectively called contacts.

In order to form the electromagnetic field coupling unit 14 to perform radio signal connection between the wireless communication unit 802 outside the receptacle 84 and the wireless communication unit 602 inside the plug 44, a coupler unit 130 (radio coupling unit) is provided in the receptacle 84 and a coupler unit 135 (radio coupling unit) is provided in the plug 44.

Detailed configurations of the electromagnetic field coupling unit 12 (the coupler unit 120 and the coupler unit 125)

and the electromagnetic field coupling unit 14 (the coupler unit 130 and the coupler unit 135) will be described below.

The contact electrodes (that is, the contact electrode 43 of the plug 42 and the contact electrode 45 of the plug 44) of the connection cable 4 are connected by a conducting wire in the cable unit 40 and the power, the clock signal, and the narrowband signal are transmitted.

In the communication chip 401 in the plug 42, a power supply terminal is connected to a power supply wiring line system between a power supply unit 208 and a power supply unit 808 and a reference terminal is connected to a reference potential wiring line system. A clock signal may be supplied from the clock signal wiring line system between the clock processing unit 206 and the clock processing unit 806 to the communication chip 401, which is not essential. In the communication chip 601 in the plug 44, a power supply terminal is connected to the power supply wiring line system between the power supply unit 208 and the power supply unit 808 and a reference terminal is connected to the reference potential wiring line system. A clock signal may be supplied from the clock signal wiring line system between the clock processing unit 206 and the clock processing unit 806 to the communication chip 601, which is not essential.

A broadband signal of the side of the electronic device 2 is converted into a radio signal by the wireless communication unit 202 and the radio signal is transmitted to the plug 42 through the electromagnetic field coupling unit 12 (the coupler unit 120 and the coupler unit 125). The radio signal is converted into an electrical signal by the communication chip 401 (wireless communication unit 402) in the plug 42 and the electrical signal is transmitted to the side of the electronic device 8 through the conducting wire 9010 in the cable unit 40, by the wired communication unit 404. In detail, first, the electrical signal is transmitted to the plug 44 of the side of the electronic device 8, is received by the communication chip 601 (wired communication unit 604) in the plug 44, and is converted into a radio signal by the wireless communication unit 602. Then, the radio signal is transmitted to the receptacle 84 through the electromagnetic field coupling unit 14 (the coupler unit 130 and the coupler unit 135). The radio signal is converted into an electrical signal by the wireless communication unit 802 of the electronic device 8 and the electrical signal is supplied to the broadband information processing unit 800.

Configuration

Second Example

Next, focusing on a difference with the first example, the configuration of the second example illustrated in FIG. 2A will be described. The communication chip 401 of the plug 42 has a wired communication unit 406 (wired transmitting unit) and a signal selecting unit 408 (selector). The wired communication unit 406 is connected to the narrowband information processing unit 204 and the clock processing unit 206 of the side of the electronic device 2 through the contact electrode 23 and the contact electrode 43 and receives a narrowband signal and a clock signal. The signal selecting unit 408 selects any one of the electrical signal (broadband signal) converted by the wireless communication unit 402 and the electrical signal (the broadband signal and the clock signal) received by the wired communication unit 406 and supplies the selected signal to the wired communication unit 404.

The communication chip 601 of the plug 44 has a wired communication unit 606 (wired receiving unit). The wired communication unit 604 transmits the broadband signal in the demodulated signal to the wireless communication unit 602 and transmits the narrowband signal and the clock signal to the wired communication unit 606. The wired communication unit 606 is connected to the narrowband information processing unit 804 and the clock processing unit 806 of the side of the electronic device 8 through the contact electrode 45 and the contact electrode 85 and transmits the narrowband signal and the clock signal.

In the configuration of the second example described above, the narrowband signal and the clock signal that are input from the side of the electronic device 2 through the contact are received by the wired communication unit 406 in the plug 42, are multiplexed with the broadband signal transmission by the signal selecting unit 408 (any one is selected by time division), and are transmitted. In this way, conducting wires for the broadband signal transmission and conducting wires for the narrowband signal transmission or the clock signal transmission can be commonly used and the total number of conducting wires can be decreased.

Electromagnetic Field Coupling Unit

First Example

Figure 3:
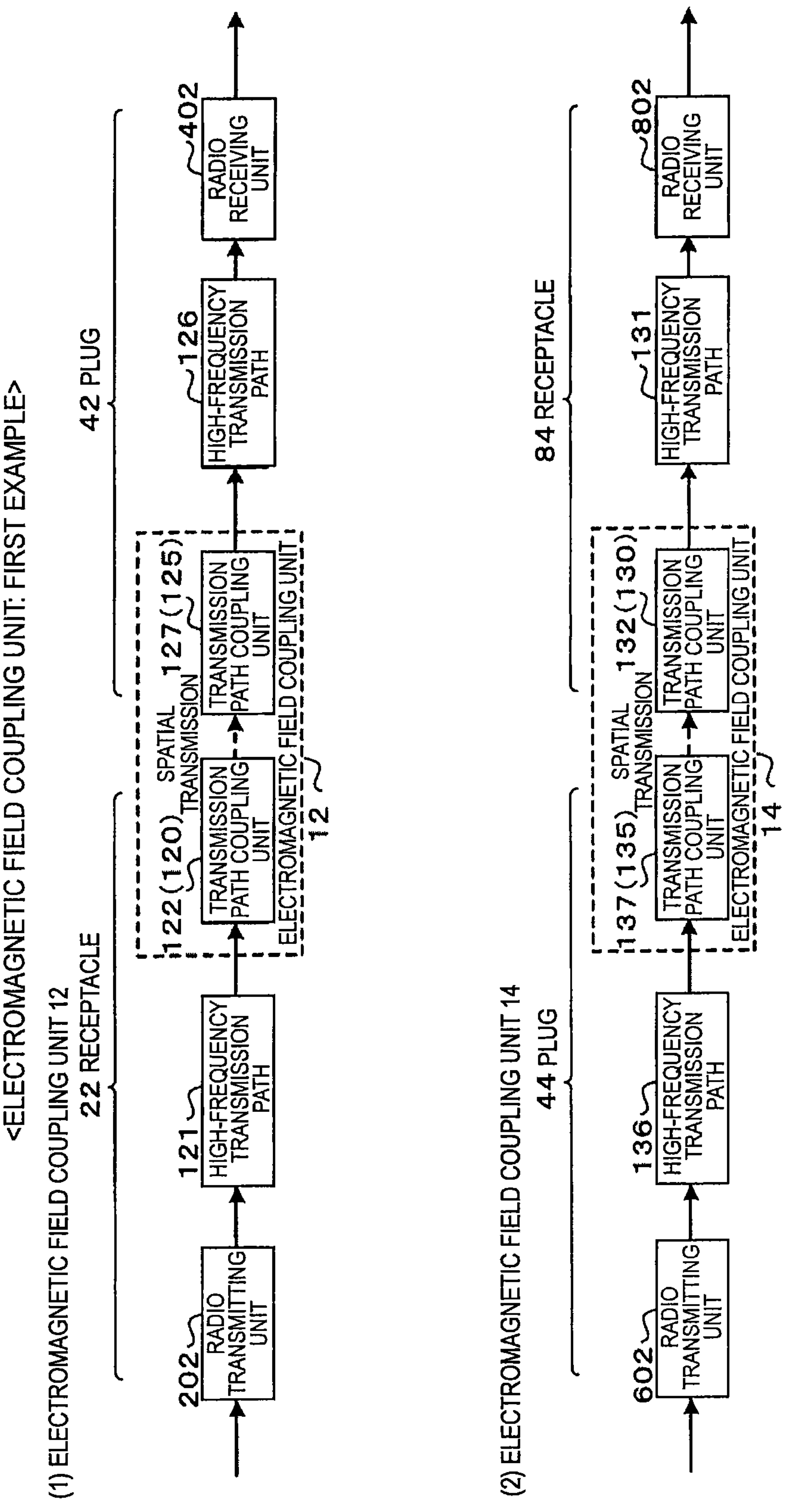
FIG. 3 is an illustration of a first example of an electromagnetic field coupling unit.

FIG. 3 is an illustration of a first example of a radio coupler (the electromagnetic field coupling unit 12 and the electromagnetic field coupling unit 14). In this case, FIG. 3(1) is an illustration of the electromagnetic field coupling unit 12 that is formed when the receptacle 22 of the first electronic device 2 and the plug 42 of the connection cable 4 are fitted. FIG. 3(2) is an illustration of the electromagnetic field coupling unit 14 that is formed when the receptacle 84 of the second electronic device 8 and the plug 44 of the connection cable 4 are fitted. Here, the case in which unidirectional communication from the side of the signal electronic device 2 to the side of the electronic device 8 is performed in a millimeter waveband will be described.

The first example is the case in which both the electromagnetic field coupling unit 12 configured using the coupler unit 120 and the coupler unit 125 and the electromagnetic field coupling unit 14 configured using the coupler unit 130 and the coupler unit 135 apply spatial transmission.

For example, as illustrated in FIG. 3(1), in the electromagnetic field coupling unit 12, the coupler unit 120 of the receptacle 22 is configured using a transmission path coupling unit 122 and the transmission path coupling unit 122 is connected to the wireless communication unit 202 (in this example, the radio transmitting unit) through a high-frequency transmission path 121 (microstripline). The coupler unit 125 of the plug 42 is configured using the transmission path coupling unit 127 and the transmission path coupling unit 127 is connected to the wireless communication unit 402 (in this example, the radio receiving unit) through a high-frequency transmission path 126 (microstripline).

As illustrated in FIG. 3(2), in the electromagnetic field coupling unit 14, the coupler unit 130 of the receptacle 84 is configured using a transmission path coupling unit 132 and the transmission path coupling unit 132 is connected to the wireless communication unit 802 (in this example, the radio receiving unit) through a high-frequency transmission path 131. The coupler unit 135 of the plug 44 is configured using a transmission path coupling unit 137 and the transmission path coupling unit 137 is connected to the wireless communication unit 602 (in this example, the radio transmitting unit) through a high-frequency transmission path 136.

The transmission path coupling unit 122 and the transmission path coupling unit 127 come close to each other, when the receptacle 22 and the plug 42 are fitted. In addition, the transmission path coupling unit 132 and the transmission path coupling unit 137 come close to each other, when the receptacle 84 and the plug 44 are fitted. As a result, a millimeter-wave signal (radio signal of a millimeter waveband) is electromagnetically coupled and the millimeter-wave signal is spatially transmitted. That is, the transmission path coupling units come close to each other, when the plug is coupled with the receptacle. As a result, the radio transmission is performed by "electromagnetic field coupling" in a spatial portion that is formed between both sides.

In this case, the "electromagnetic field coupling" means that the spatial transmission is realized by any one of coupling by the capacity, coupling by the magnetic field, and coupling by the electromagnetic field. As an example of the coupling by the capacity or the magnetic field, a positional relation is set such that probe-shaped transmission path coupling units extended from the microstripline overlap by an amount corresponding to a λ/4 wavelength, when a wavelength of a radio signal (in this case, the millimeter-wave signal) is set to λ and the receptacle and the plug are fitted, a resonance is generated between the probe-shaped transmission path coupling units, and the millimeter-wave signal is transmitted. This form is called a "radio transmission using proximity electromagnetic field coupling". In the case of the coupling by the electromagnetic field, a radio signal is transmitted using a transmission path coupling unit having an antenna shape. This form is called a "radio transmission using electromagnetic field coupling based on an antenna".

Figure 4:
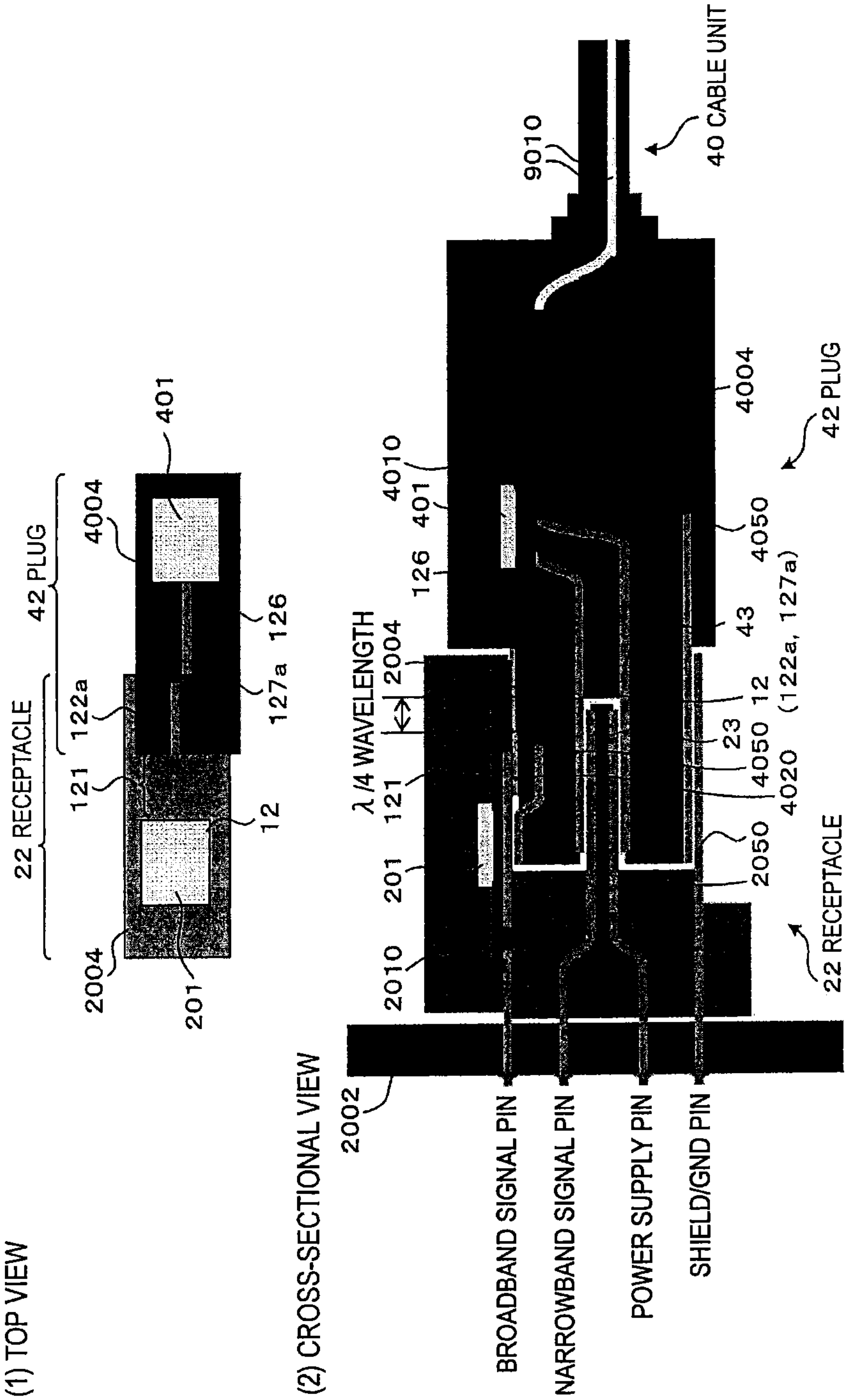
FIG. 4 is an illustration of an example of a specific structure of the electromagnetic field coupling unit (1 thereof) according to the first example.

FIG. 4 is an illustration of an example of a specific structure of the electromagnetic field coupling unit 12 and the electromagnetic field coupling unit 14 (1 thereof: the radio transmission using the proximity electromagnetic field coupling is applied) according to the first example. In this case, FIG. 4 illustrates a state in which the plug is coupled with the receptacle. Hereinafter, the case in which the receptacle 22 and the plug 42 are coupled (that is, the case in which the electromagnetic field coupling unit 12 is formed) will be described. The receptacle 22 is a connector apparatus having a concave shape (Female) and the plug 42 is a connector apparatus having a convex shape (Male). A relation of unevenness may be reversed.

The coupler unit 120 and the coupler unit 125 are formed on a multilayer substrate (dielectric substrate) formed of a dielectric material and the transmission path coupling unit 127 that forms the coupler unit 125 is provided on an end face of a terminal of the plug 42. An integrated circuit is mounted on the same dielectric substrate, a cable conducting wire is connected, and a circuit in the receptacle or a circuit in the plug is configured.

For example, each contact electrode 23 (a broadband signal pin, a narrowband signal pin, a power supply pin, and a shield/GND pin) of the receptacle 22 that is attached to the substrate (device substrate 2002) of the electronic device 2 is soldered to a circuit pattern not illustrated in the drawings at the side of a back surface of the substrate (device substrate 2002) of the electronic device 2. In the receptacle 22, a dielectric substrate 2004 is provided and the communication chip 201 storing the wireless communication unit 202 is mounted. A predetermined terminal of the communication chip 201 at the side of the broadband information processing unit 200 is connected to the contact electrode 23 through a circuit pattern 2010. A predetermined terminal of the wireless communication unit 202 of the communication chip 201 is connected to a high-frequency transmission path 121 that is formed of a circuit pattern. A probe-shaped electromagnetic field coupling unit 122*a* that forms the coupler unit 120 is formed in a leading end of the circuit pattern (high-frequency transmission path 121).

In the plug 42 of the side of the cable unit 40, a dielectric substrate 4004 is provided and the communication chip 401 storing the wireless communication unit 402 and the wired communication unit 404 is mounted. Among the conducting wires 9010 of the cable unit 40, each conducting wire 9010 for the narrowband signal, the power, and the shield/GND other than the broadband signal is connected to the corresponding contact electrode 43 through the circuit pattern 4010 of the dielectric substrate 4004. The circuit pattern 4010 of the power and the shield/GND is also connected to the communication chip 401. The conducting wire 9010 for the broadband signal in the cable unit 40 is connected to the predetermined terminal of the wired communication unit 404 of the communication chip 401 by the circuit pattern 4010. The predetermined terminal of the wireless communication unit 402 of the communication chip 401 is connected to a high-frequency transmission path 126 formed of a circuit pattern. A probe-shaped electromagnetic field coupling unit 127*a* that forms the coupler unit 125 is formed in a leading end of a circuit pattern (high-frequency transmission path 126).

Similar to the existing connector apparatus, in each of the receptacle 22 and the plug 42, a fitting portion is covered with a metal material forming a shield case 2050 and a shield case 4050 (refer to FIG. 8 to be described below). The electromagnetic field coupling unit 127*a* is formed at the side (outer side) of a terminal surface of the dielectric substrate 4004 at the outside more than the shield case 4050 (side of a fitting surface with the receptacle 22) and is covered with an insulation protection film 4020.

If the shield case 4050 of the plug 42 enters the shield case 2050 of the receptacle 22, the coupler units face each other. If the receptacle 22 and the plug 42 are fitted at the regulation position and the electromagnetic field coupling unit 122*a* and the electromagnetic field coupling unit 127*a* face each other, the electromagnetic field coupling unit 122*a* and the electromagnetic field coupling unit 127*a* having the probe shape overlap by an amount corresponding to a λ/4 wavelength, a resonance is generated (thereby, the electromagnetic field coupling unit 12 is formed), and the millimeter-wave is transmitted.

Figure 4A:
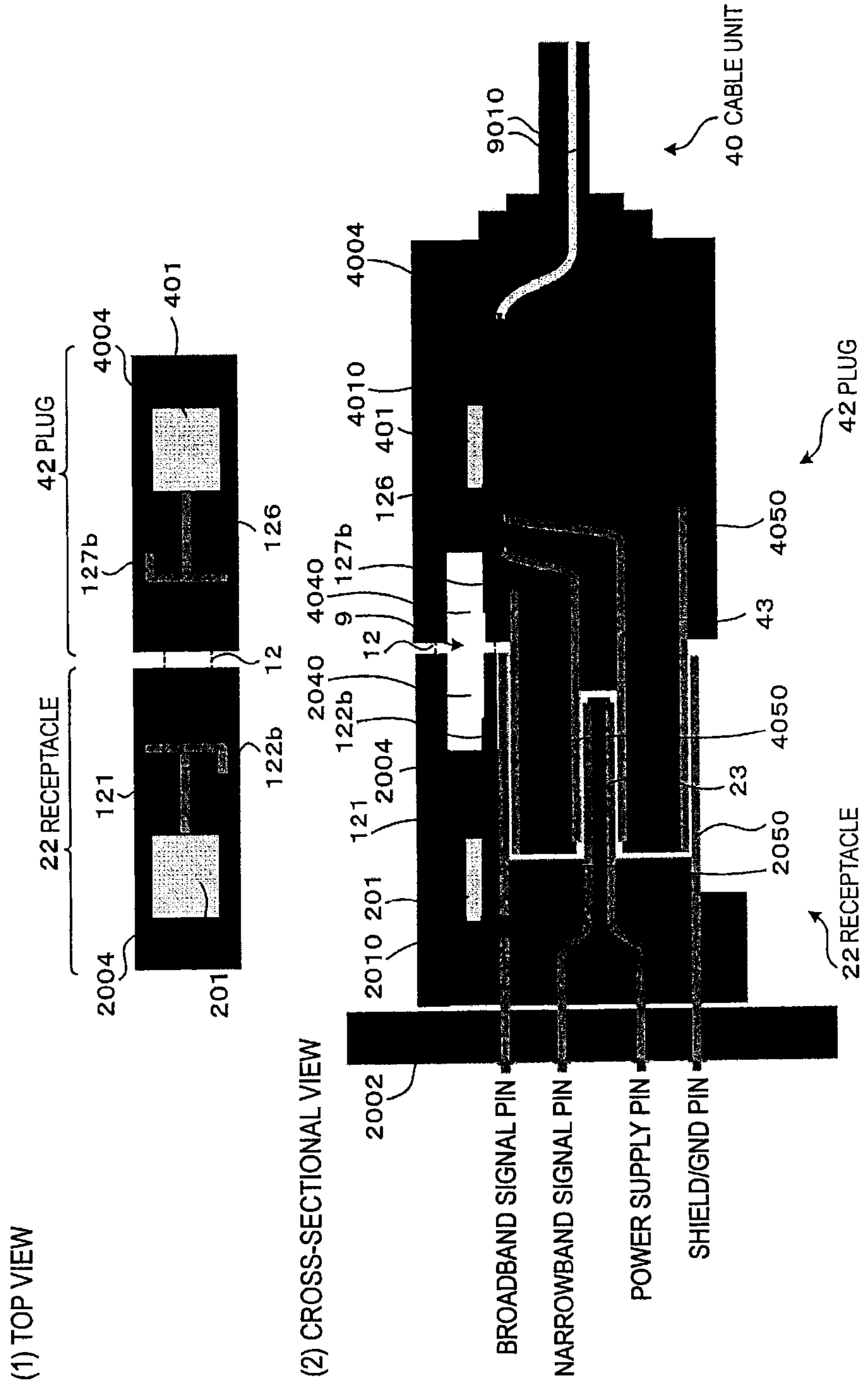
FIG. 4A is an illustration of a specific structure of the electromagnetic field coupling unit (2 thereof) according to the first example.

FIG. 4A is an illustration of an example of a specific structure of the electromagnetic field coupling unit 12 and the electromagnetic field coupling unit 14 (2 thereof: the radio transmission using the electromagnetic field coupling based on the antenna is applied) according to the first example. FIG. 4A illustrates a state in which the plug is coupled with the receptacle. Hereinafter, focusing on a difference with the structure example illustrated in FIG. 4 in which the "radio transmission using the proximity electromagnetic field coupling" is applied, explanation is given.

The antenna that forms the coupler unit 120 and the coupler unit 125 is disposed on an inner surface of the shield case of each of the receptacle 22 and the plug 42 and the millimeter wave transmission is performed through a space formed when the connectors are coupled. For example, the receptacle 22 includes an antenna coupling unit 122*b*, instead of the probe-shaped electromagnetic field coupling unit 122*a*, and the plug 42 includes an antenna coupling unit 127*b*, instead of the probe-shaped electromagnetic field coupling unit 127*a*. A waveguide 2040 made of a space is formed between the antenna coupling unit 122*b* and a casing (mold) of the receptacle 22 and a waveguide 4040 made of a space is formed between the antenna coupling unit 127*b* and a casing (mold) of the plug 42. The waveguide 2040 and the waveguide 4040 are not made of the space and a dielectric material that is suitable for radio transmission in a millimeter waveband may be filled into the waveguide 2040 and the waveguide 4040.

The antenna coupling unit 122*b* and the antenna coupling unit 127*b* may be formed of circuit patterns of the dielectric substrate 2004 and the dielectric substrate 4004. In an example illustrated in the drawings, inverse F antennas that function as antennas having directivity in a transverse direction are used as the antenna coupling unit 122*b* and the antenna coupling unit 127*b*. However, it is not essential to use the inverse F antennas and other antennas such as a monopole antenna, a dipole antenna, and a Yagi antenna may be used.

If the shield case 4050 of the plug 42 enters the shield case 2050 of the receptacle 22, the coupler units face each other. When the receptacle 22 and the plug 42 are fitted at a regular position, a millimeter-wave signal transmission path 9 (including the waveguide 2040 and the waveguide 4040) that uses air as a medium is formed and the electromagnetic field coupling unit 12 is formed.

It is preferable to make a structure of a transmission path, such that both ends of the millimeter-wave signal transmission path 9 configured using the waveguide 2040 and the waveguide 4040 open or short-circuit in terms of electromagnetism. A reflector may be mounted to each of a transmission side and a reception side of the millimeter-wave signal transmission path 9 configured using the waveguide 2040 and the waveguide 4040, so that an advancement direction of a millimeter wave radiated to the side of the millimeter-wave signal transmission path 9 (the waveguide 2040 and the waveguide 4040) by the antenna coupling unit 122*b* and the antenna coupling unit 127*b* is converted into an extension direction of the millimeter-wave signal transmission path 9. In this case, the millimeter wave (electromagnetic wave) that is radiated by the antenna coupling unit (122*b* or 127*b*) of one communication chip (201 or 401) advances in a thickness direction of the millimeter-wave signal transmission path 9. Then, the electromagnetic wave is reflected by the reflector of the transmission side and advances in the extension direction of the millimeter-wave signal transmission path 9. In addition, the electromagnetic wave is reflected by the reflector of the reception side and reaches the antenna coupling units (122*b* and 127*b*) of the other semiconductor package.

Electromagnetic Field Coupling Unit

Second Example

Figure 5:
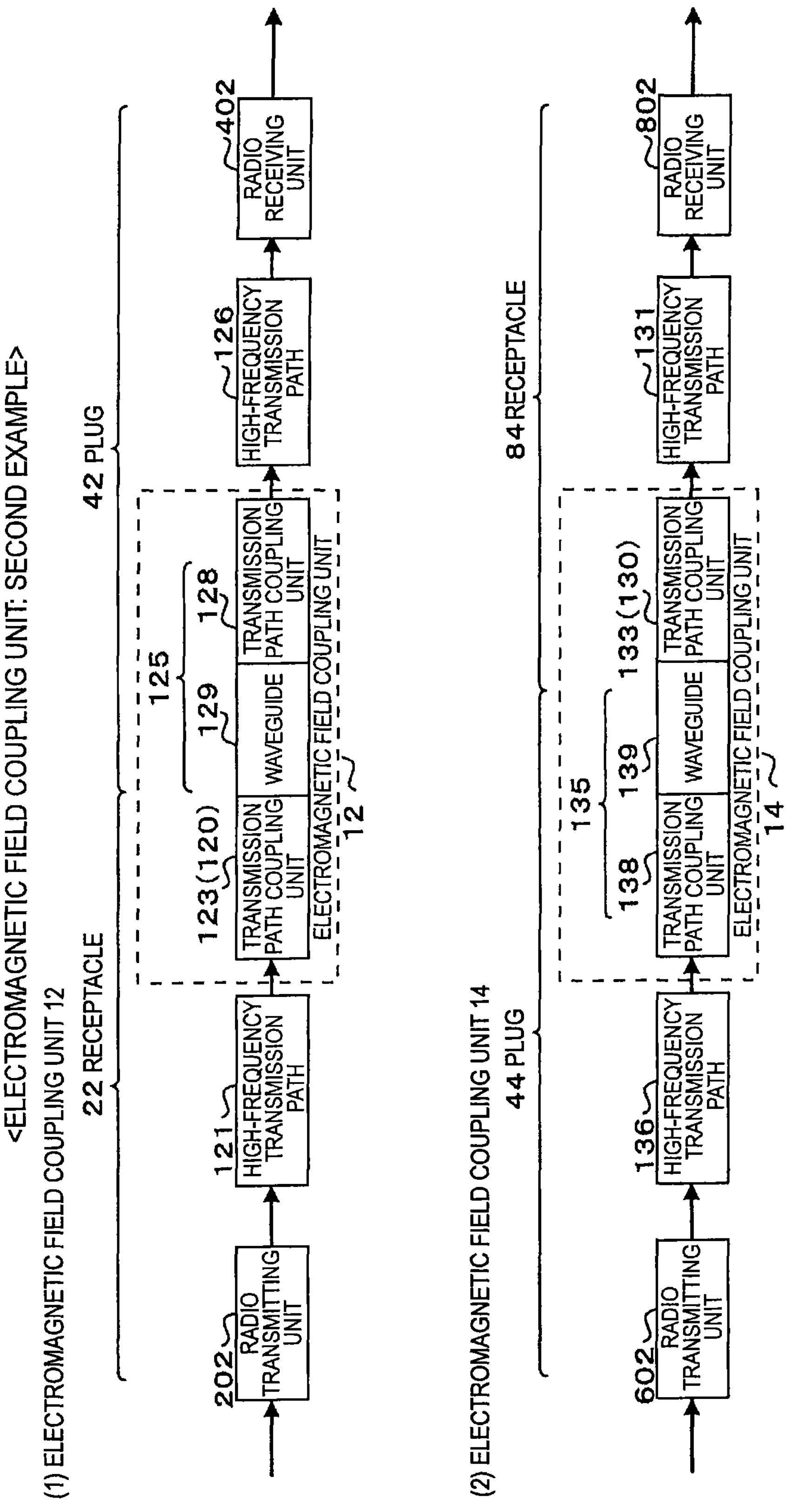
FIG. 5 is an illustration of a second example of the electromagnetic field coupling unit.

FIG. 5 is an illustration of a second example of a radio coupler (the electromagnetic field coupling unit 12 and the electromagnetic field coupling unit 14). In this case, FIG. 5(1) is an illustration of the electromagnetic field coupling unit 12 that is formed when the receptacle 22 of the first electronic device 2 and the plug 42 of the connection cable 4 are fitted. FIG. 5(2) is an illustration of the electromagnetic field coupling unit 14 that is formed when the receptacle 84 of the second electronic device 8 and the plug 44 of the connection cable 4 are fitted. Hereinafter, focusing on a difference with the first example, explanation is given.

The second example is the case in which both the electromagnetic field coupling unit 12 configured using the coupler unit 120 and the coupler unit 125 and the electromagnetic field coupling unit 14 configured using the coupler unit 130 and the coupler unit 135 perform radio transmission through the waveguide. That is, a portion between the plug and the receptacle is relayed by the waveguide coupling unit and the waveguide. A coupler structure is configured using the waveguide and the waveguide coupling unit, the waveguide and the waveguide coupling unit are integrated when the plug is coupled with the receptacle, and the radio transmission is realized.

For example, as illustrated in FIG. 5(1), in the electromagnetic field coupling unit 12, the coupler unit 120 of the second example of the receptacle 22 is configured using a waveguide coupling unit 123 and the waveguide coupling unit 123 is connected to the wireless communication unit 202 (in this example, the radio transmitting unit) through a high-frequency transmission path 121. The coupler unit 125 of the second example of the plug 42 is configured using the waveguide coupling unit 128 and the waveguide 129 and the waveguide coupling unit 128 is connected to the wireless communication unit 402 (in this example, the radio receiving unit) through the high-frequency transmission path 126.

As illustrated in FIG. 5(2), in the electromagnetic field coupling unit 14, the coupler unit 130 of the second example of the receptacle 84 is configured using a waveguide coupling unit 133 and the waveguide coupling unit 133 is connected to the wireless communication unit 802 (in this example, the radio reception circuit) through the high-frequency transmission path 131. The coupler unit 135 of the second example of the plug 44 is configured using the waveguide coupling unit 138 and the waveguide 139 and the waveguide coupling unit 138 is connected to the wireless communication unit 602 (in this example, the radio transmission circuit) through the high-frequency transmission path 136.

The waveguide coupling unit 123 and the waveguide coupling unit 128 are electromagnetically coupled through the waveguide 129, when the plug 42 is fitted into the receptacle 22. In addition, the waveguide coupling unit 133 and the waveguide coupling unit 138 are electromagnetically coupled through the waveguide 139, when the plug 44 is fitted into the receptacle 84. As a result, a millimeter-wave signal (radio signal of a millimeter waveband) is transmitted by wireless. If the radio transmission is performed through the waveguide, radiation of an electromagnetic wave can be decreased and the separation of a radio channel can be easily performed.

Figure 6:
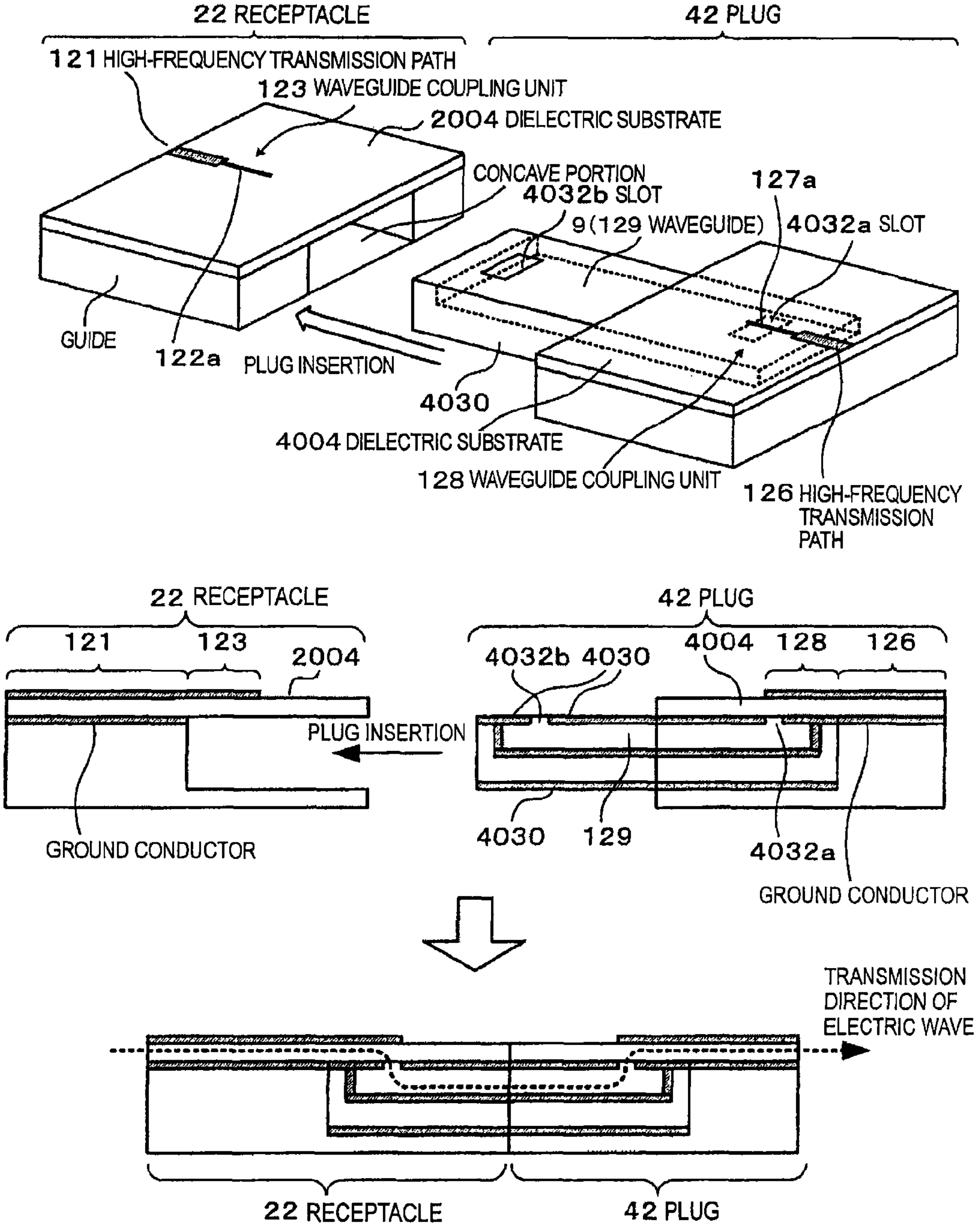
FIG. 6 is an illustration (1 thereof) of an example of a specific configuration of the electromagnetic field coupling unit according to the second example.
Figure 6A:
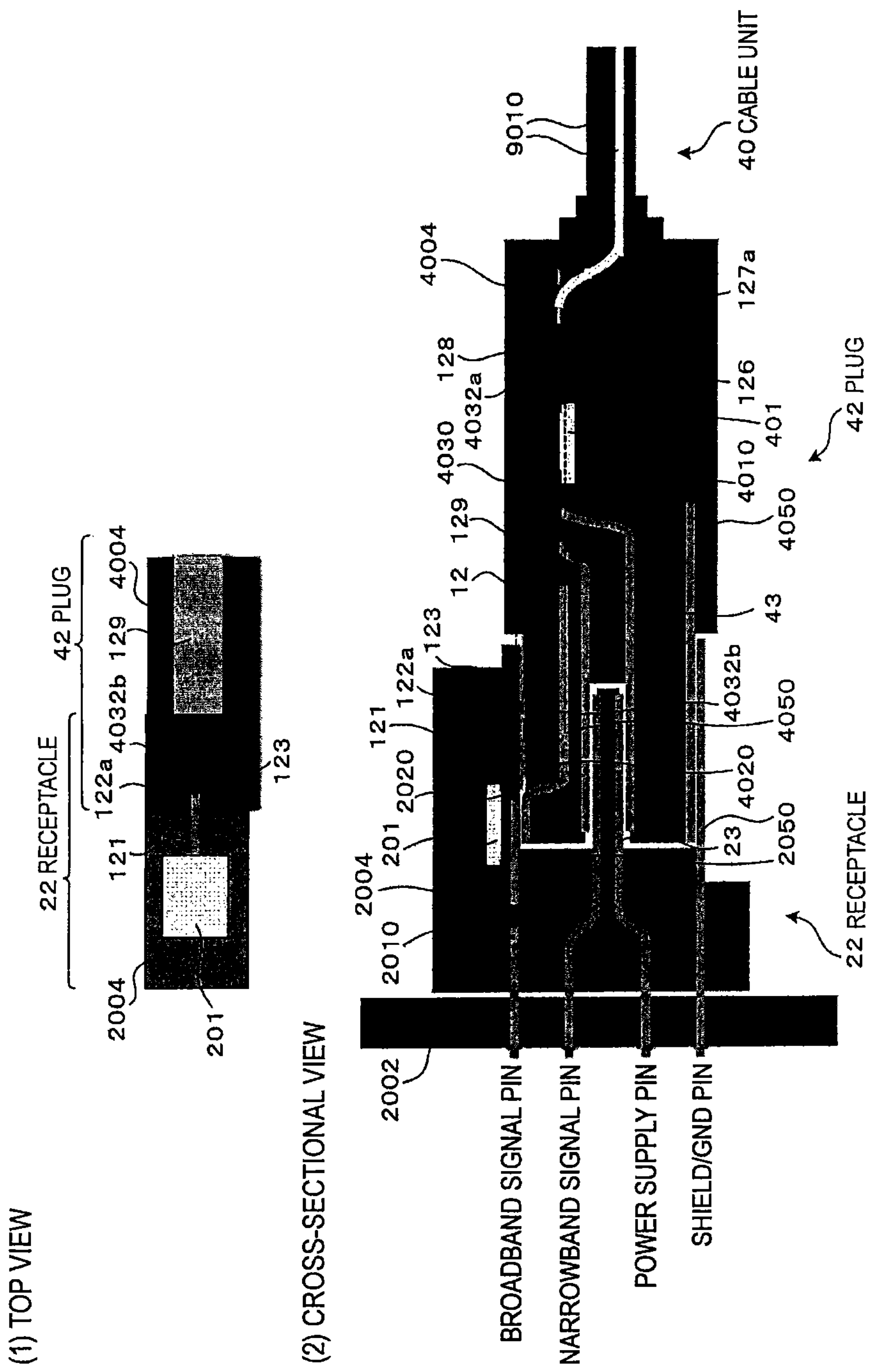
FIG. 6A is an illustration (2 thereof) of an example of a specific configuration of the electromagnetic field coupling unit according to the second example.

FIGS. 6 and 6A are illustrations of examples of a specific configuration of the electromagnetic field coupling unit 12 and the electromagnetic field coupling unit 14 to which the second example is applied. In this case, FIG. 6 illustrates a course of coupling a plug with a receptacle (states before and after the plug is coupled with the receptacle) and FIG. 6A illustrates a state in which the plug is coupled with the receptacle. Hereinafter, focusing on a difference with the structure example to which the first example is applied, explanation is given.

At the side of the receptacle 22, the high-frequency transmission path 121 and the probe-shaped electromagnetic field coupling unit 122*a* forming the coupler unit 120 are formed of a circuit pattern to extend from the communication chip 201, and the structure is similar to the structure to which the "the radio transmission using proximity electromagnetic field coupling" is applied, in the first example. In a portion that faces the insulation protection film 4020 of the plug 42, an insulation protection film 2020 is formed.

As the plug 42, a waveguide in which a cavity is formed in a conducting wall or a waveguide (dielectric waveguide) in which a dielectric material is filled into a cavity portion is use as the waveguide 129, a slot (conductor removal portion: opening) is formed in the waveguide, and the electromagnetic field coupling is performed through a probe extended from a transmission line connected to the wireless communication unit 402. The positions of the probe and the slot are determined such that reflection or attenuation of an electric wave decreases, when a convex portion of the plug 42 is coupled with a concave portion of the receptacle 22.

For example, print patterns are formed in the dielectric substrate 4004, via holes are formed between layers of the print patterns, and the via holes are arranged in a transmission direction, so that a rectangular dielectric waveguide is formed, and the rectangular dielectric waveguide is used as the waveguide 129. The print patterns and a via hole row function as a conducting wall 4030. The attenuation of the electromagnetic wave of the corresponding frequency can be suppressed by selecting a diameter of the waveguide to be suitable for an electromagnetic wave of a predetermined frequency and the electromagnetic wave can be transmitted.

The waveguide 129 is connected to the wireless communication unit 402 through the waveguide coupling unit 128 and the high-frequency transmission path 126. By using the dielectric substrate 4004 as a structural member of the waveguide, the waveguide 129 can be easily formed. The waveguide coupling unit 128 is formed to have a waveguide structure using slot coupling. That is, an antenna structure based on an application of a small aperture coupling element (such as a slot antenna) is made to function as a coupling portion of the waveguide.

A slot pattern structure formed in the dielectric substrate 4004 of the plug 42 functions as an antenna and directly radiates an electromagnetic wave. The high-frequency transmission path 126 (stripline transmission path) is drawn from the communication chip 401, the probe-shaped electromagnetic field coupling unit 127*a* exists in an extension shape thereof, an opening (slot 4032*a*) forming the waveguide coupling unit 128 is formed in the waveguide 129 formed in a part of the dielectric substrate 4004, and a slot pattern structure is configured.

In the millimeter-wave coupling structure described above, the electromagnetic field coupling unit 127*a* electrically connected to a signal wiring line of the wireless communication unit 402 of the communication chip 401 through the high-frequency transmission path 126 and the slot 4032*a* (opening) electromagnetically couple the millimeter-wave signal by a millimeter-wave transmission medium formed in a resin of the dielectric substrate 4004 between both sides. Thereby, the millimeter wave that has been transmitted through the millimeter-wave transmission medium becomes an electromagnetic wave from the slot 4032*a*, is radiated, and is incident on the waveguide 129. That is, the slot pattern structure functions as the antenna and radiates the electromagnetic wave. The radiated electromagnetic wave is coupled to the waveguide 129 and is propagated through the waveguide 129.

Similar to the waveguide coupling unit 128, the waveguide coupling unit 123 is formed to have a waveguide structure using slot coupling. In detail, the probe-shaped electromagnetic field coupling unit 122*a* exists on an extension of the high-frequency transmission path 121 (stripline transmission path) drawn from the communication chip 201, when the convex portion of the plug 42 is coupled with the concave portion of the receptacle 22, and the electromagnetic field is coupled between the opening (slot 4032*b*) of the waveguide 129 formed in the part of the dielectric substrate 4004 and the electromagnetic field coupling unit 122*a*.

Similar to the waveguide 2040 and the waveguide 4040 of the first example, it is preferable to make a structure of a transmission path, such that both ends of the waveguide 129 (millimeter-wave signal transmission path 9) open or short-circuit in terms of electromagnetism. A reflector may be mounted to each of a transmission side and a reception side of the waveguide 129, so that an advancement direction of a millimeter wave radiated to the side of the waveguide 129 by the slot coupling is converted into an extension direction of the waveguide 129.

Figure 6B:
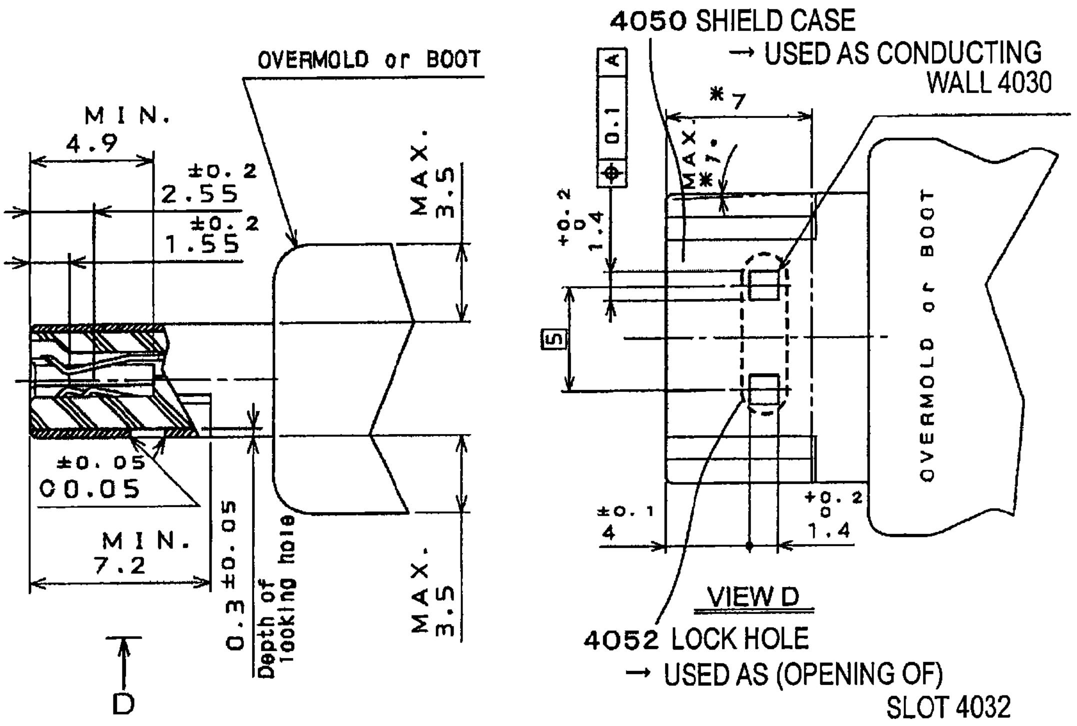
FIG. 6B is an illustration of an example of an application of the electromagnetic field coupling unit according to the second example with respect to an existing connector.
Figure 6B:
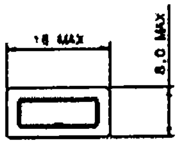
Figure 6B:
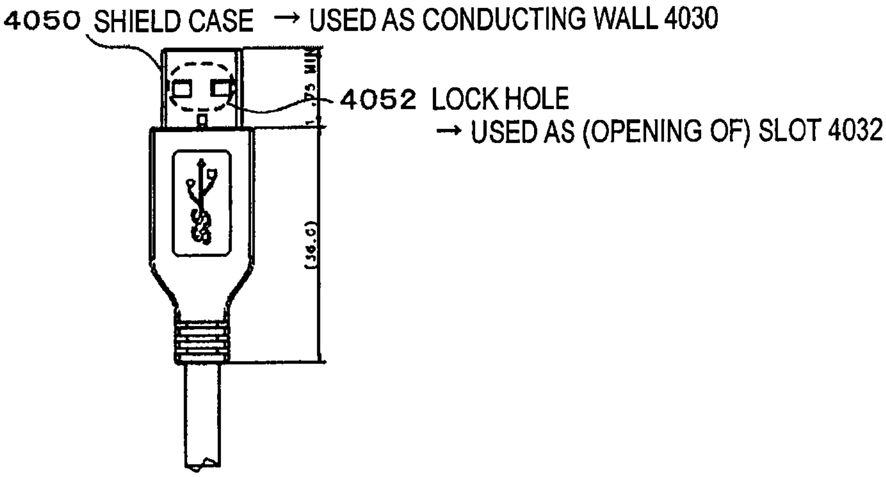

FIG. 6B is an illustration of an example of an application of the electromagnetic field coupling unit of the second example with respect to an existing connector. In this case, FIG. 6B(1) is an illustration of a plug leading end of an HDMI and FIG. 6B(2) is an illustration of a plug leading end of USB 3.0. In the related art, the plug leading end is covered with a conductor (shield case 4050) to protect an electrical terminal or protect electromagnetic field radiation. A lock mechanism including a combination of a concave portion (concave configuration: void) and a convex portion (convex configuration: protrusion) to lock the plug 42 inserted into the receptacle 22 is provided to make joining strong when the receptacle 22 and the plug 42 are coupled. For example, at the side of the plug 42, a fixing hole (lock hole 4050) functioning as the concave portion is provided in a conducting wall. Therefore, the waveguide (waveguide 129) using the shield case 4050 as the conducting wall 4030 or a part of the conducting wall 4030 is configured and the coupler unit 125 (waveguide coupling unit) using the locking hole 4052 as the slot 4032*b* is formed. As a result, the coupler unit 125 can be configured without changing a shape of the plug 42 from the existing shape.

Electromagnetic Field Coupling Unit

Third Example

Figure 7:
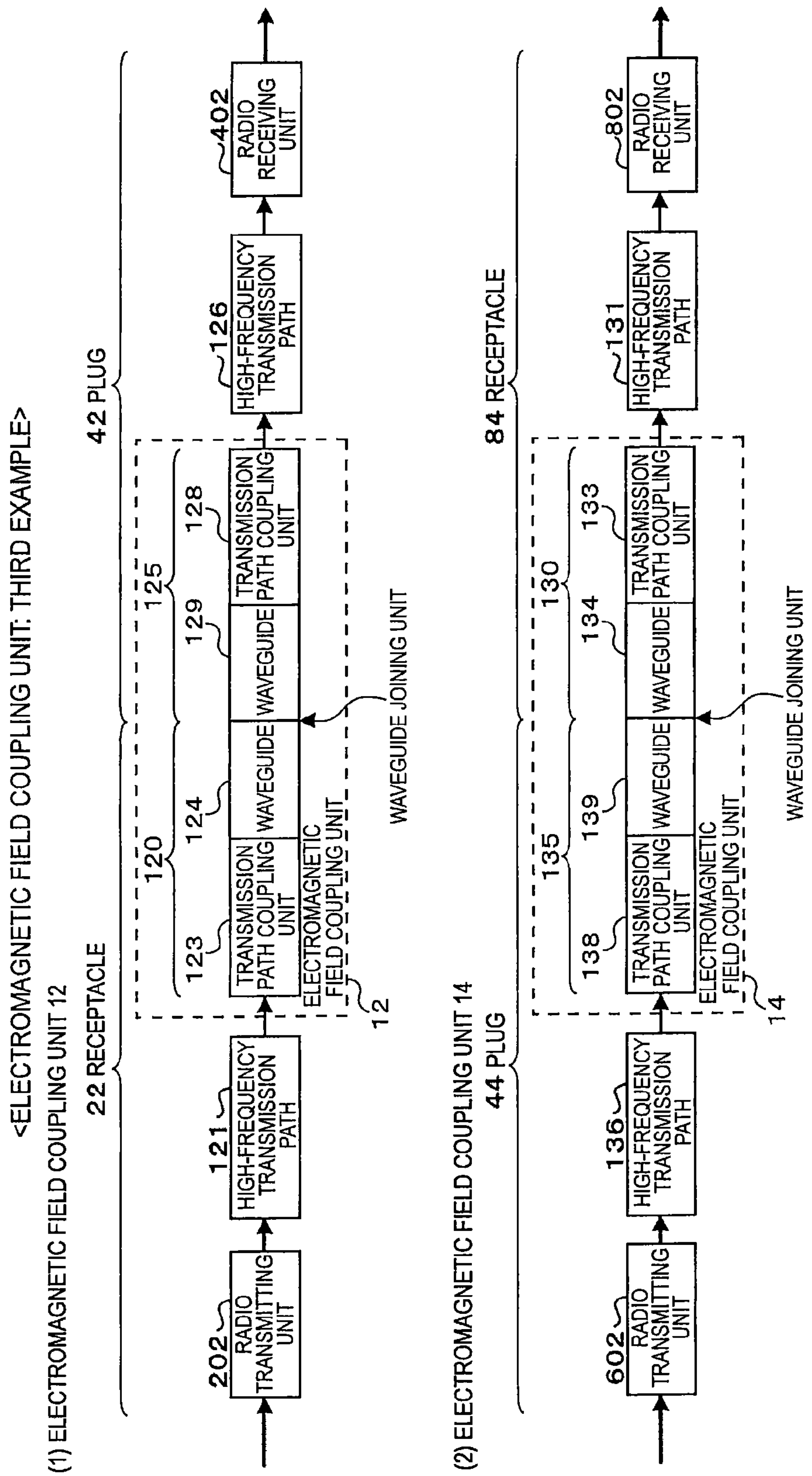
FIG. 7 is an illustration of a third example of the electromagnetic field coupling unit.

FIG. 7 is an illustration of a third example of a radio coupler (the electromagnetic field coupling unit 12 and the electromagnetic field coupling unit 14). In this case, FIG. 7(1) is an illustration of the electromagnetic field coupling unit 12 that is formed when the receptacle 22 of the first electronic device 2 and the plug 42 of the connection cable 4 are fitted. FIG. 7(2) is an illustration of the electromagnetic field coupling unit 14 that is formed when the receptacle 84 of the second electronic device 8 and the plug 44 of the connection cable 4 are fitted. Hereinafter, focusing on a difference with the second example, explanation is given.

The third example is the case in which both the electromagnetic field coupling unit 12 configured using the coupler unit 120 and the coupler unit 125 and the electromagnetic field coupling unit 14 configured using the coupler unit 130 and the coupler unit 135 perform radio transmission through a cross-section of the waveguide. That is, a portion between the plug and the receptacle is relayed by the cross-section of the waveguide. A coupler structure is configured using a pair of the waveguide and the waveguide coupling unit, cross-sections of the waveguides come close to each other when the plug is coupled with the receptacle, and the waveguide coupling unit (waveguide joining unit) is formed. Thereby, the radio transmission is realized.

For example, as illustrated in FIG. 7(1), the coupler unit 120 of the third example of the receptacle 22 is configured using the waveguide coupling unit 123 and the waveguide 124 and the coupler unit 125 of the third example of the plug 42 is configured using the waveguide coupling unit 128 and the waveguide 129. As illustrated in FIG. 7(2), the coupler unit 130 of the third example of the receptacle 84 is configured is configured using the waveguide coupling unit 133 and the waveguide 134 and the coupler unit 135 of the third example of the plug 44 is configured using the waveguide coupling unit 138 and the waveguide 139. Each of the waveguide 124, the waveguide 129, the waveguide 134, and the waveguide 139 is used as the waveguide.

When the receptacle 22 and the plug 42 are fitted, the cross-sections of the waveguides come close to each other and the waveguide coupling unit is formed. In addition, when the receptacle 84 and the plug 44 are fitted, the cross-sections of the waveguides come close to each other and the waveguide joining unit is formed. As a result, the radio transmission is realized. In a relay portion (waveguide joining unit) of the cross-section of the waveguide, because a transmission mode is the same, movement of the electromagnetic wave is easy and deterioration of a transmission characteristic with respect to a deviation or a gap can be decreased.

Figure 8:
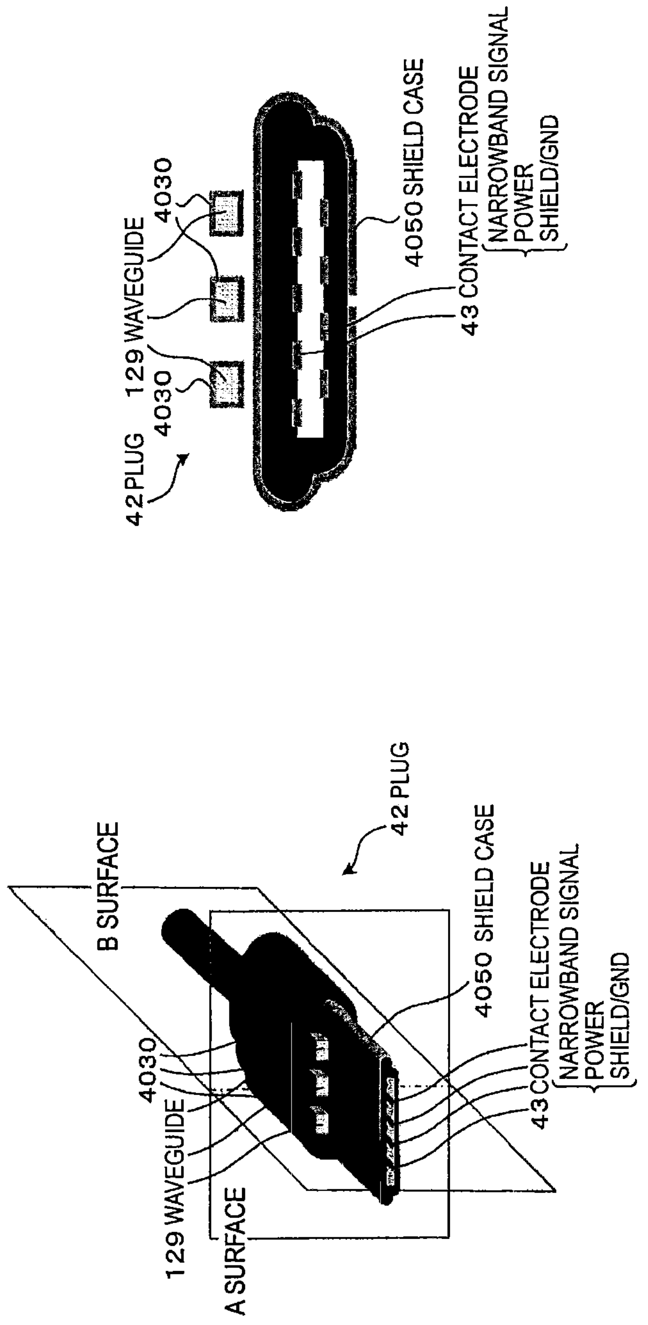
FIG. 8 is an illustration (1 thereof) of an example of a specific configuration of the electromagnetic field coupling unit according to the third example.
Figure 8A:
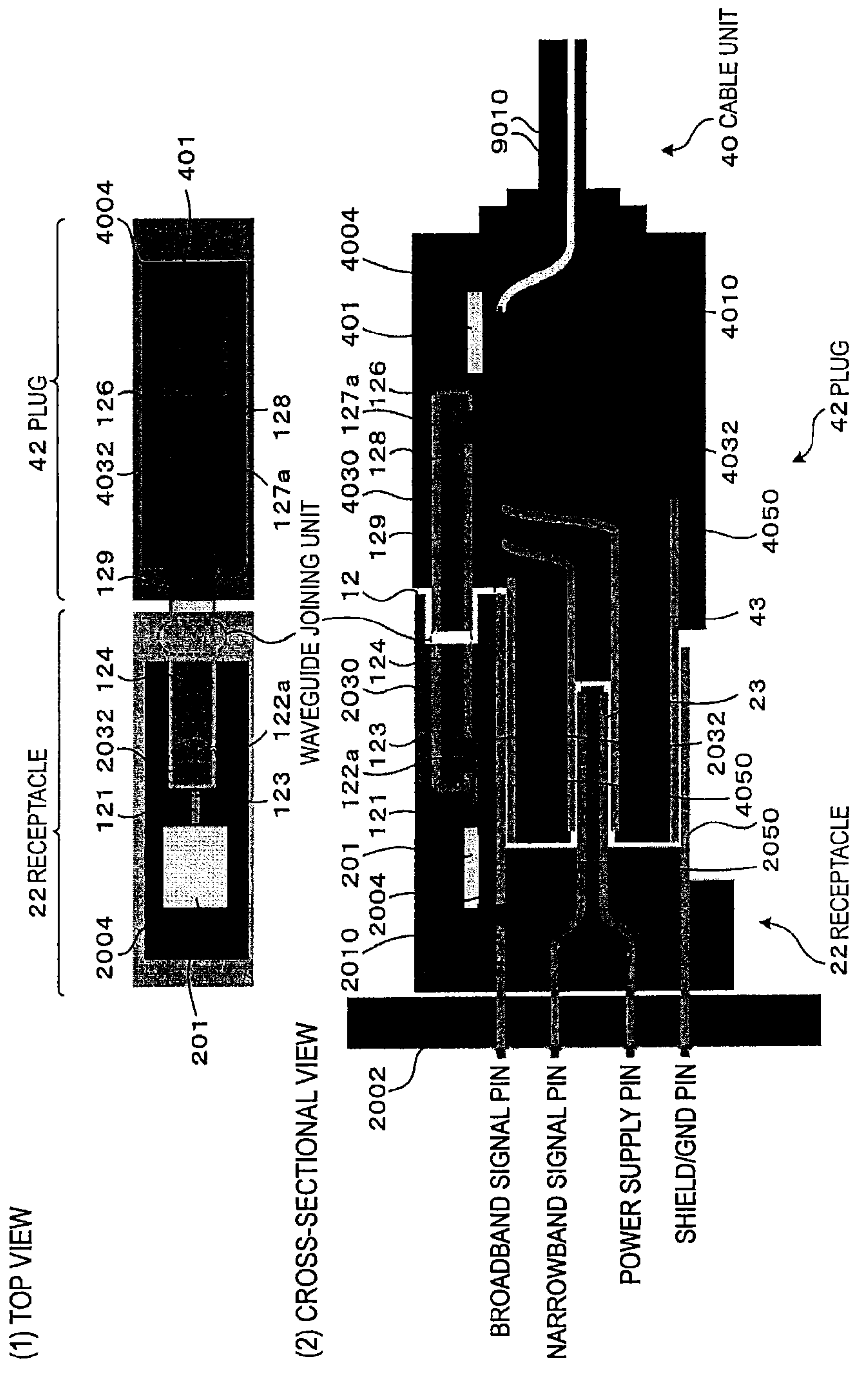
FIG. 8A is an illustration (2 thereof) of an example of a specific configuration of the electromagnetic field coupling unit according to the third example.

FIGS. 8 and 8A are illustrations of examples of a specific configuration of the electromagnetic field coupling unit 12 and the electromagnetic field coupling unit 14 to which the third example is applied. In this case, FIGS. 8(1) and (2) illustrate a state before the plug is coupled with the receptacle and FIGS. 8A(1) and (2) illustrate a state in which the plug is coupled with the receptacle. Hereinafter, focusing on a difference with the structure example to which the second example is applied, explanation is given.

In the plug 42, first, the high-frequency transmission path 126 and the probe-shaped electromagnetic field coupling unit 127*a* forming the coupler unit 125 are formed of a circuit pattern to extend from the communication chip 401 and the structure is similar to the structure to which the "the radio transmission using proximity electromagnetic field coupling" is applied, in the first example. Different from the second example, the dielectric substrate 4004 is not used, the conducting wall 4030 is buried in a resin mold formed of a dielectric material of the plug 42, and the dielectric waveguide forming the waveguide 129 is formed. In the waveguide 129, a slot 4032 is formed at the side of the waveguide coupling unit 128. However, at the side of the fitting portion with the receptacle 22, the slot is not formed and the cross-section of the dielectric waveguide protrudes.

Similar to the second example, the waveguide coupling unit 128 is formed to have a waveguide structure using the slot coupling, by a part of the waveguide 129. That is, the probe-shaped electromagnetic field coupling unit 172*a* exists on an extension of the high-frequency transmission path 126 (stripline transmission path) drawn from the communication chip 401 and the electromagnetic field is coupled between the slot 4032 of the waveguide 129 formed separately from the dielectric substrate 4004 and the electromagnetic field coupling unit 127*a*.

Similar to the plug 42, even in the receptacle 22, the high-frequency transmission path 121 and the probe-shaped electromagnetic field coupling unit 122*a* forming the coupler unit 120 are formed of a circuit pattern to extend from the communication chip 201. The conducting wall 2030 is buried in a resin mold formed of a dielectric material of the receptacle 22 and the dielectric waveguide forming the waveguide 124 is formed. In the waveguide 124, a slot 2032 is formed at the side of the waveguide coupling unit 123. However, at the side of the fitting portion with the plug 42, the slot is not formed and the cross-section of the dielectric waveguide protrudes. The millimeter-wave transmission path 9 is configured using the waveguide 124 and the waveguide 129.

Similar to the waveguide coupling unit 128, the waveguide coupling unit 123 is formed to have a waveguide structure using the slot coupling, by a part of the waveguide 124. That is, the probe-shaped electromagnetic field coupling unit 122*a* exists on an extension of the high-frequency transmission path 121 (stripline transmission path) drawn from the communication chip 201 and the electromagnetic field is coupled between the slot 2032 of the waveguide 124 formed separately from the dielectric substrate 2004 and the electromagnetic field coupling unit 122*a*.

The waveguide 124 (waveguide-type coupler) of the receptacle 22 is disposed such that the receptacle 22 and the plug 42 face each other on an extension of the waveguide 129 (waveguide-type coupler) of the plug 42. If the plug 42 is coupled with the receptacle 22, a cross-section of the waveguide 124 of the receptacle 22 and a cross-section of the waveguide 129 of the plug 42 face each other.

Similar to the waveguide 129 of the second example, it is preferable to make a structure of a transmission path, such that an end of the waveguide 124 (millimeter-wave signal transmission path) at the side of the waveguide coupling unit 123 and an end of the waveguide 129 (millimeter-wave signal transmission path) at the side of the waveguide coupling unit 128 open or short-circuit in terms of electromagnetism. A reflector may be mounted to each of a transmission side and a reception side of each of the waveguide 124 and the waveguide 129, so that an advancement direction of a millimeter wave radiated to the sides of the waveguide 124 and the waveguide 129 by the slot coupling is converted into an extension direction of the waveguide 124 and the waveguide 129.

Front End Portion

First Example

Figure 9:
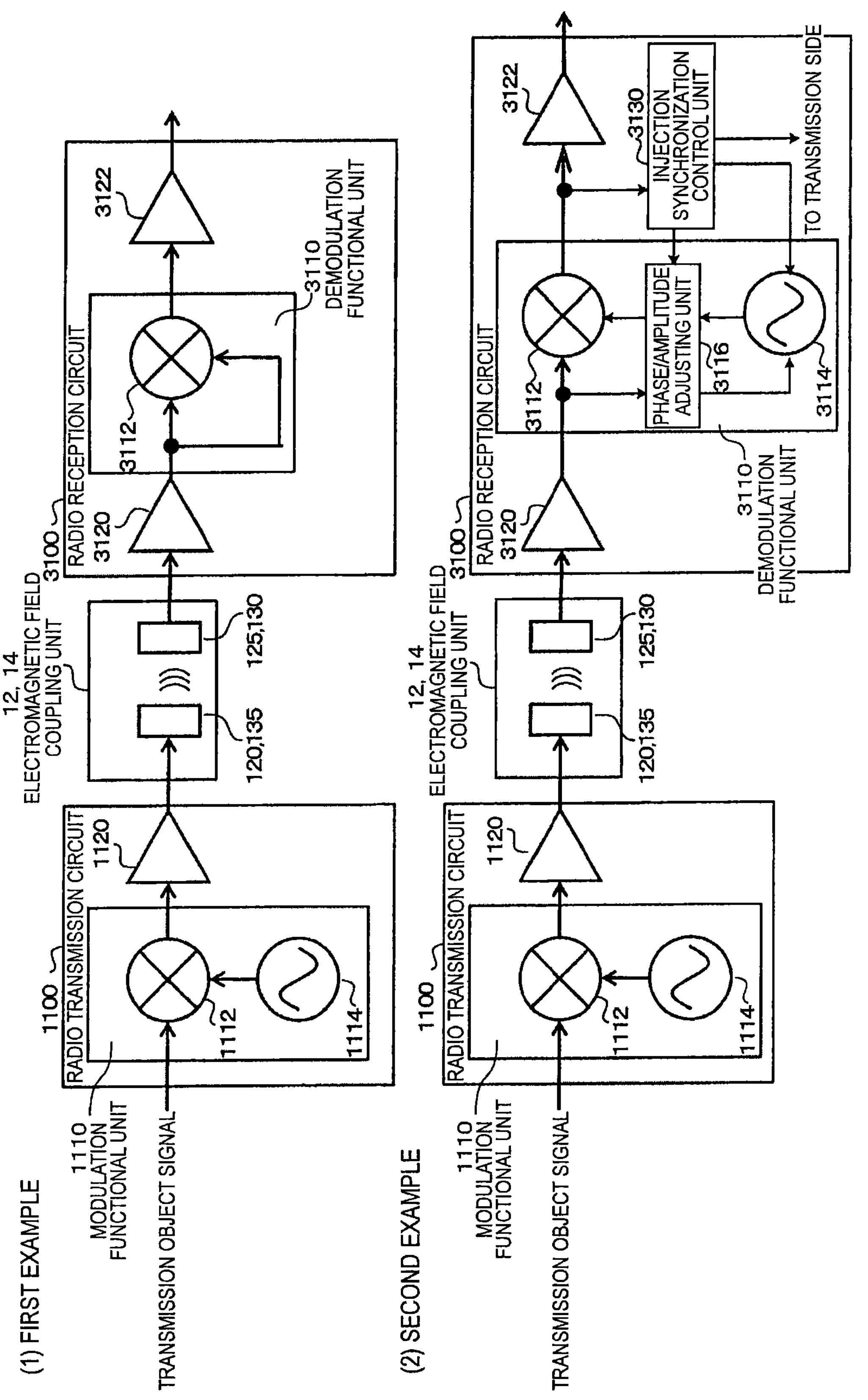
FIG. 9 is an illustration of a front end portion (a modulation functional unit and a demodulation functional unit) of a radio transmission/reception circuit.

FIG. 9(1) is an illustration of a first example of a front end portion (a modulation functional unit and a demodulation functional unit) of a radio transmission/reception circuit.

A radio transmission circuit 1100 (the wireless communication unit 202 and the wireless communication unit 602 in the first embodiment) has a modulation functional unit 1110 and a transmission amplifying unit 1120. A broadband signal (for example, a 12-bit image signal) that becomes a radio transmission object is supplied to the modulation functional unit 1110. As the modulation functional unit 1110, various circuit configurations can be adopted according to modulation methods. For example, if the modulation method is a method of modulating amplitude or a phase, a configuration including a frequency mixing unit 1112 (mixer circuit) and a transmission-side local oscillating unit 1114 may be adopted. The corresponding drawing illustrates the case in which an ASK modulation method is adopted.

The transmission-side local oscillating unit 1114 generates a carrier signal (modulation carrier signal) that is used for modulation. The frequency mixing unit 1112 multiplies (modulates) a carrier of a millimeter waveband generated by the transmission-side local oscillating unit 1114 with the broadband signal, generates a modulation signal of the millimeter waveband, and supplies the modulation signal to the transmission amplifying unit 1120. The modulation signal is amplified by the transmission amplifying unit 1120 and is radiated from a coupler (the coupler unit 120 and the coupler unit 135) of the electromagnetic field coupling unit 14.

The radio reception circuit 3100 (the wireless communication unit 402 and the wireless communication unit 802 in the first embodiment) has a modulation functional unit 3110, a variable gain type reception amplifying unit 3120, and a binarizing unit 3122. In an example illustrated in the drawing, the binarizing unit 3122 is provided at a rear stage of the frequency mixing unit 3112. However, it is not essential to include the binarizing unit 3122. For example, another functional unit of the rear stage of the frequency mixing unit 3112 may be configured to function as the binarizing unit 3122.

The demodulation functional unit 3110 can adopt various circuit configurations in a range according to the modulation method of the transmission side. Here, the case using the method of demodulating the amplitude or the phase will be described to correspond to the explanation of the modulation functional unit 1110.

The demodulation functional unit 3110 includes a two input type frequency mixing unit 3112 (mixer circuit) and uses a square detection circuit that obtains a detection output proportional to the square of amplitude of (an envelope of) a received millimeter-wave signal. Instead of the square detection circuit, a simple envelope detection circuit that does not have a square characteristic may be used.

A millimeter-wave reception signal that is received by the coupler (the coupler unit 125 and the coupler unit 130) is input to the reception amplifying unit 3120 and amplitude adjustment is performed with respect to the millimeter-wave reception signal. Then, the millimeter-wave reception signal is supplied to the demodulation functional unit 3110. The reception signal of which the amplitude has been adjusted is input to two input terminals of the frequency mixing unit 3112 at the same time and a square signal is generated. A high-frequency component of the square signal that is generated by the frequency mixing unit 3112 is removed by a low-pass filter of a filter processing unit not illustrated in the drawings and a waveform (baseband signal) of an input signal that is transmitted from the transmission side is generated and is supplied to the binarizing unit 3122.

In the wireless communication through the coupler (the electromagnetic field coupling unit 12 and the electromagnetic field coupling unit 14), because the leakage or the interference from other channel is small, broadband communication of a low error rate can be performed by a simple AM modulation circuit and a demodulation circuit of a square detection type. Because propagation loss is very small as compared with propagation loss of the free space transmission, the front end circuit can be configured using a small power saving circuit.

Front End Portion

Second Example

FIG. 9(2) is an illustration of a second example of a front end portion (a modulation functional unit and a demodulation functional unit) of a radio transmission/reception circuit. The second example is a configuration in which an injection synchronization (injection lock) method is applied to the first example. Hereinafter, focusing on a difference with the first example, explanation is given.

Although not illustrated in the drawings, when the injection synchronization method is used, the radio transmission circuit 1100 preferably executes appropriate correction processing in advance with respect to a modulation object signal, such that the injection synchronization at the reception side becomes easy. Typically, the modulation object signal is modulated after a direct-current proximity component of the modulation object signal is suppressed, that is, the modulation object signal is modulated after a DC (direct current) proximity reduction component is suppressed (cut), so that a carrier frequency proximity modulation signal component is minimized and the injection synchronization at the reception side becomes easy. Not only the DC but also the DC proximity component is preferably suppressed. In the case of a digital method, DC free encoding is performed to prevent a DC component from being generated by continuation of the same codes.

Together with a signal (modulation signal) modulated in the millimeter waveband, a reference carrier signal that corresponds to a carrier signal used in the modulation and is used as a reference of the injection synchronization at the reception side is preferably transmitted. The reference carrier signal is a signal in which a frequency and a phase (preferably, including amplitude) corresponding to the carrier signal output from the transmission-side local oscillating unit 1114 and used in the modulation are always constant (not changed). Typically, the reference carrier signal is only the carrier signal that is used in the modulation. The referenced carrier signal may be at least synchronized with the carrier signal and is not limited thereto. For example, the reference carrier signal is a signal (for example, a high-frequency signal) of a different frequency synchronized with the carrier signal used in the modulation or a signal of a same frequency. However, the reference carrier signal may be a signal (for example, an orthogonal carrier signal orthogonal to the carrier signal used in the modulation) of a different phase.

The carrier signal may be included in an output signal of the modulation circuit (for example, standard amplitude modulation or ASK) or the carrier may be suppressed (amplitude modulation of a carrier suppressing method or ASK or PSK), according to the modulation method or the modulation circuit. Therefore, as the circuit configuration to transmit the reference carrier signal together with the signal modulated in the millimeter waveband from the transmission side, a circuit configuration according to a kind of the reference carrier signal (whether the carrier signal used in the modulation is used as the reference carrier signal), the modulation method, or the modulation circuit may be adopted.

In the radio reception circuit 3100 of the second example that adopts the injection synchronization method, the demodulation functional unit 3110 includes a reception-side local oscillating unit 3114. The radio reception circuit 3100 supplies an injection signal to the reception-side local oscillating unit 3114 and acquires an output signal corresponding to the carrier signal used in the modulation at the transmission side. Typically, the radio reception circuit 3100 acquires an oscillation output signal that is synchronized with the carrier signal at the transmission side. The radio reception circuit 3100 multiplies the received millimeter-wave modulation signal and a carrier signal for demodulation (demodulation carrier signal: called reproduction carrier signal) based on the output signal of the reception-side local oscillating unit 3114 by the frequency mixing unit 3112 (performs synchronization detection) and acquires a synchronization detection signal. A high-frequency component of the synchronization detection signal is removed by a filter processing unit not illustrated in the drawings and a waveform (baseband signal) of an input signal that is transmitted from the transmission side is obtained. The other configuration is the same as that of the first example.

The frequency mixing unit 3112 performs frequency conversion (down conversion/demodulation) by the synchronization detection, for example, develops the detection into the orthogonal detection in which a bit error rate characteristic is superior. As a result, an advantage of applying phase modulation or frequency modulation is obtained.

When the reproduction carrier signal based on the output signal of the reception-side local oscillating unit 3114 is supplied to the frequency mixing unit 3112 and is demodulated, a phase difference needs to be considered and a phase adjustment circuit needs to be provided in a synchronization detection system.

In the example illustrated in the drawings, a phase/amplitude adjusting unit 3116 that has a function for adjusting injection amplitude as well as a function of the phase adjustment circuit is provided in the demodulation functional unit 3110. The phase adjustment circuit may be applied to an injection signal with respect to the reception-side local oscillating unit 3114 or an output signal of the reception-side local oscillating unit 3114 and may be applied to both sides. The demodulation-side carrier signal generating unit that generates the demodulation carrier signal synchronized with the modulation carrier signal by the reception-side local oscillating unit 3114 and the phase/amplitude adjusting unit 3116 and supplies the demodulation carrier signal to the frequency mixing unit 3112 is configured.

Although not illustrated in the drawings, a direct-current component suppressing unit that removes a direct-current offset component included in a synchronization detection signal, according to a phase of the reference carrier signal synthesized with the modulation signal (specifically, when the modulation signal and the reference carrier signal have the same phases), is provided at a rear stage of the frequency mixing unit 3112.

If a free running oscillation frequency of the reception-side local oscillating unit 3114 is set to fo (ωo), a central frequency of an injection signal (in the case of the reference carrier signal, a frequency thereof) is set to fi (ωi), an injection voltage with respect to the reception-side local oscillating unit 3114 is set to Vi, a free running oscillation voltage of the reception-side local oscillating unit 3114 is set to Vo, and a Q value (Quality Factor) is set to Q, when a lock range is shown by a maximum pull-in frequency range Δfomax, Δfomax is defined by an expression (A). From the expression (A), it can be seen that the Q value affects the lock range and the lock range is widened when the Q value decreases.

$$\Delta fo\max = fo/(2*Q)*(Vi/Vo)*1/sqrt(1-(Vi/Vo)^2) \quad (A)$$

From the expression (A), it can be seen that the reception-side local oscillating unit 3114 acquiring an oscillation output signal by the injection synchronization can be locked (synchronized) with a component within Δfomax in the injection signal, but cannot be locked with a component out of Δfomax, and a band-pass effect is obtained. For example, when a modulation signal having a frequency band is supplied to the reception-side local oscillating unit 3114 and an oscillation output signal is obtained by the injection synchronization, an oscillation output signal that is synchronized with an average frequency of the modulation signal (frequency of a carrier signal) is obtained and the component out of Δfomax is removed.

When the injection signal is supplied to the reception-side local oscillating unit 3114, as illustrated in the drawings, a method of amplifying the received millimeter-wave signal by the reception amplifying unit 3120 and supplying the millimeter-wave signal as the injection signal to the reception-side local oscillating unit 3114 through the phase/amplitude adjusting unit 3116 is considered. In this case, instead of a large number of frequency components of the modulation signal, a small number of frequency components preferably exist within Δfomax. The "reason why the small number of frequency components preferably exist is that the injection synchronization can be performed by appropriately adjusting a signal input level or a frequency, even when the slight frequency components exist. That is, because the frequency components unnecessary for the injection synchronization can be supplied to the reception-side local oscillating unit 3114, it may be difficult to perform the injection synchronization. However, if the transmission side modulates a modulation object signal after suppressing a low-pass component of the modulation object signal (performing DC free encoding) so that there is no modulation signal component in the vicinity of the carrier frequency, a problem does not occur in the configuration illustrated in the drawings.

Although not illustrated in the drawings, a frequency separating unit may be provided between the reception amplifying unit 3120 and the demodulation functional unit 3110, the modulation signal and the reference carrier signal may be frequency-separated from the received millimeter-wave signal, and the separated reference carrier signal component may be supplied as the injection signal to the reception-side local oscillating unit 3114 through the phase/amplitude adjusting unit 3116. In the configuration described above, because the signal is supplied after the frequency components unnecessary for the injection synchronization are suppressed in advance, the injection synchronization is easily performed.

Although not illustrated in the drawings, each of the system for the injection synchronization and the system for the broadband signal transmission may be configured using a different coupler, preferably, a method of receiving a signal not to cause interference. In the configuration described above, the reference carrier signal of which the amplitude is always constant can be supplied to the reception-side local oscillating unit 3114. Therefore, the configuration described above is called an optimal method from a viewpoint of easy injection synchronization performance.

The millimeter-wave reception signal that is received by the coupler (the coupler unit 125 and the coupler unit 130) is supplied to the frequency mixing unit 3112 and the reception-side local oscillating unit 3114 (through the phase/amplitude adjusting unit 3116) by a divider (branching filter) not illustrated in the drawings. The reception-side local oscillating unit 3114 performs the injection synchronization function and outputs a reproduction carrier signal synchronized with the carrier signal used in the modulation at the transmission side.

An injection level (amplitude level of the reference carrier signal input to the oscillation circuit of the injection synchronization method), a modulation method, a data rate, and a carrier frequency are associated with whether the injection synchronization is performed at the reception side (the reproduction carrier signal synchronized with the carrier signal used in the modulation at the transmission side can be acquired. In the modulation signal, it is important to decrease components in an injection synchronization enabled band. For this reason, the DC free encoding is preferably performed at the transmission side, so that a central (average) frequency of the modulation signal becomes almost equal to the carrier frequency and a central (average) phase becomes almost equal to zero (original point on a phase plane).

For example, the lock range is controlled by controlling the injection voltage Vi or the free running oscillation frequency fo, on the basis of the expression (A). In other words, it becomes important to adjust the injection voltage Vi or the free running oscillation frequency fo, such that the injection synchronization is performed. The injection synchronization control unit 3130 is provided at the rear stage of the frequency mixing unit 3112 (for example, a rear stage of a direct-current component suppressing unit not illustrated in the drawings), a state of the injection synchronization is determined on the basis of the synchronization detection signal (baseband signal) acquired by the frequency mixing unit 3112, and each unit of the adjustment object is controlled such that the injection synchronization is performed, on the basis of the determination result.

At that time, one of a handling method at the reception side and a handling method at the transmission side to which information useful for the control (not only the control information but also a detection signal becoming an origin of the control information) are supplied as illustrated by a dotted line in the drawing or both the handling methods can be adopted. In the handling method at the reception side, if the millimeter-wave signal (in particular, a reference carrier signal component) is not transmitted with some strength, the injection synchronization may not be performed at the reception side. For this reason, there is a disadvantage in consumption power or interference tolerance, but there is an advantage in that handling is enabled by only the reception side. Meanwhile, in the handling method at the transmission side, it becomes necessary to transmit information from the reception side to the transmission side. However, there is an advantage in that the millimeter-wave signal can be transmitted with minimum power by which the injection synchronization is performed at the reception side, consumption power can be decreased, and the interference tolerance can be improved.

As such, by synchronizing the local oscillators of the transmission and reception sides (the transmission-side local oscillating unit 1114 and the reception-side local oscillating unit 3114) by the injection synchronization method and performing the synchronization detection, data can be transmitted even in a weak radio signal as compared with the free running detection. For this reason, a material or a structure having large loss is allowed with respect to the coupler (the electromagnetic field coupling unit 12 and the electromagnetic field coupling unit 14).

In addition, the transmission side (wireless communication unit 404) of the wired transmission generates (reproduces) a data clock on the basis of the carrier signal reproduced at the radio transmission side (wireless communication unit 402) of a front stage thereof and can use the data clock in transmission signal processing for performing wired transmission by the cable unit 40, which will be described in detail below. That is, even when the wired transmission of the clock is not performed in a state in which the clock is overlapped to the data or is separated from the data, the data clock can be transmitted by the carrier signal. The reception side (wireless communication unit 604) of the wired transmission generates (reproduces) the data clock on the basis of the carrier signal used in the modulation at the radio transmission (wireless communication unit 602) of the rear stage thereof and can use the data clock in reception signal processing for performing the wired transmission by the cable unit 40.

[Baseband Signal->Radio Transmission]

Figure 10:
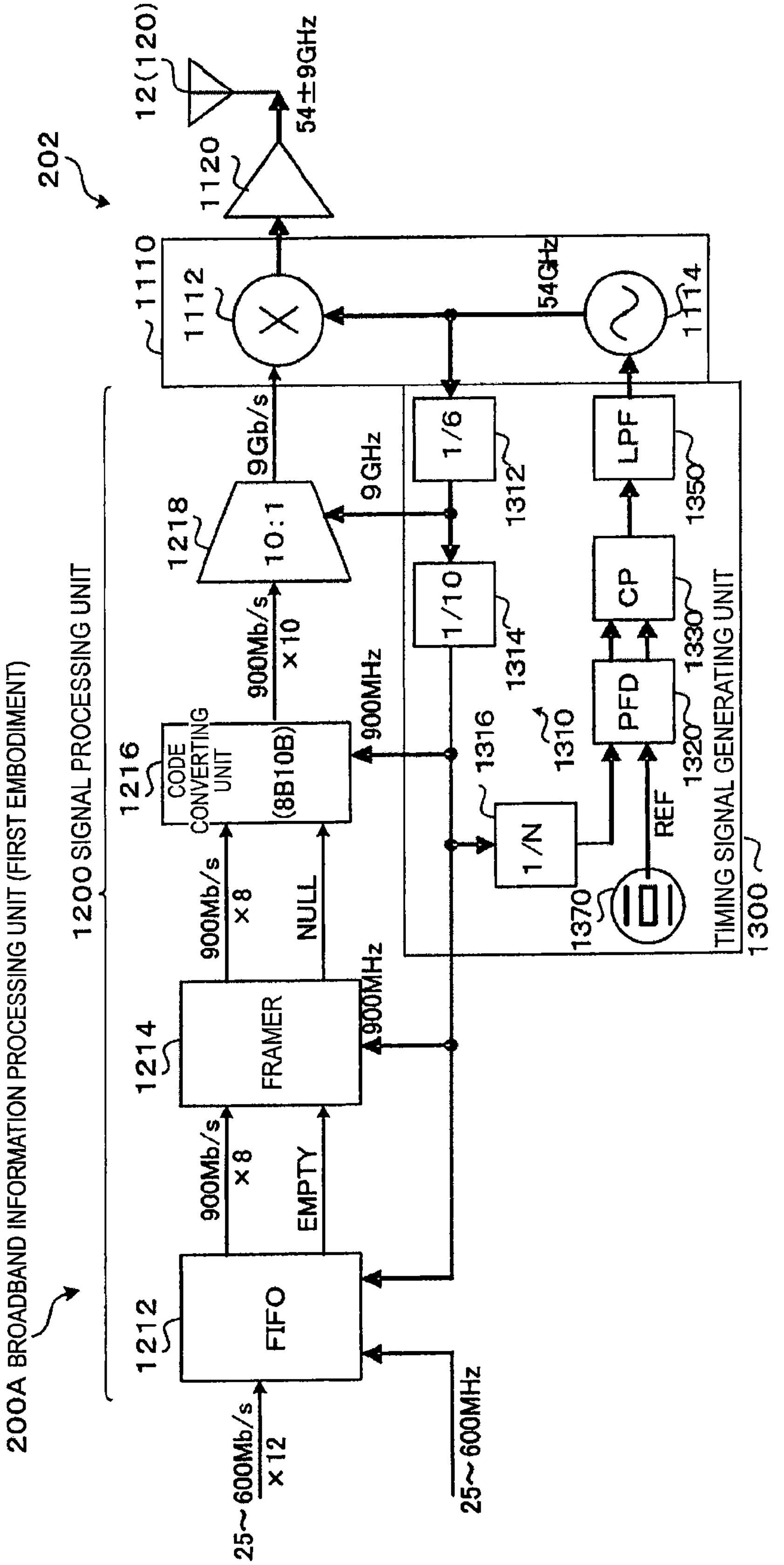
FIG. 10 is an illustration of a configuration of a radio transmission circuit including a radio front end circuit.

FIG. 10 is an illustration of an example of a detailed configuration of a radio transmission circuit including a radio front end circuit, that is, a functional unit that transmits a broadband signal (baseband signal) generated by the broadband information processing unit 200 by wireless by the wireless communication unit 202. FIG. 10A is an illustration of an example of a clock frequency of digital image data.

The wireless communication unit 202 has the same configuration as that of the radio transmission circuit 1100 (refer to FIG. 9). In this case, explanation of the configuration of the wireless communication unit 202 is omitted.

A broadband information processing unit 200A according to the first embodiment includes a signal processing unit 1200 and a timing signal generating unit 1300. The signal processing unit 1200 has a FIFO memory 1212 to which FIFO (First-In/First-Out) is applied, a framer 1214, a code converting unit 1216, and a multiplexer 1218. A broadband signal (for example, 12-bit data of 25 to 600 Mb/s), a write clock (for example, a clock of 25 to 600 MHz), and a read clock from a dividing unit 1310 are input to the FIFO memory 1212.

The FIFO memory 1212 retrieves 12-bit data at 25 to 600 MHz and reads the data in a unit of 8 bits. For example, the FIFO memory 1212 retrieves a broadband signal in synchronization with the write clock and outputs the broadband signal (for example, 8-bit data of 900 Mb/s) in synchronization with the read clock. If an amount of non-read data is less than a constant value, the FIFO memory 1212 outputs an EMPTY signal showing that the amount of non-read data is less than the constant value. The EMPTY signal is supplied to the framer 1214.

The framer 1214 inserts FIFO input data and information regarding a frequency ratio of a clock of 900 MHz into data. For example, the framer 1214 executes known frame processing in synchronization with an operation clock and outputs a broadband signal (for example, 8-bit data of 900 Mb/s). The framer 1214 outputs a NULL signal based on the EMPTY signal. The NULL signal is supplied to the code converting unit 1216. The code converting unit 1216 is configured using an 8B10B conversion circuit and generates a data code having the length of 10 bits or a NULL code and supplies the data code or the NULL code to the multiplexer 1218.

A selection control clock (for example, a clock of 9 GHz) is supplied from the dividing unit 1310 to the multiplexer 1218. The multiplexer 1218 sequentially switches codes supplied from the code converting unit 1216 according to a selection control program and selects the codes. The multiplexer 1218 generates an NRZ signal of 9 Gb/s and supplies the NRZ signal to the frequency mixing unit 1112 of the modulation functional unit 1110.

The timing signal generating unit 1300 generates a timing signal that is used by the broadband information processing unit 200A. The timing signal generating unit 1300 may be configured using any one of timing signal generating units generating various timing signals and can adopt various circuit configurations. However, the timing signal generating unit 1300 is preferably configured using a PLL (Phase-Locked Loop) or a DLL (Delay-Locked Loop). Hereinafter, the case in which the timing signal generating unit 1300 is configured using the PLL will be described.

The timing signal generating unit 1300 is configured to use the transmission-side local oscillating unit 1114 of the wireless communication unit 202 (radio transmission circuit 1100) as an oscillation circuit and includes a dividing unit 1310, a phase/frequency comparing unit 1320 (PFD), a charge pump unit 1330 (CP), a loop filter unit 1350, and a reference signal generating unit 1370 (REF).

The transmission-side local oscillating unit 1114 may adopt any one of a voltage controlled oscillator (VCO) and a current control oscillator (CCO). Hereinafter, explanation is given on the assumption that the voltage controlled oscillator is adopted, unless the circumstances are exceptional.

The dividing unit 1310 divides an oscillation frequency fvco of an output oscillation signal Vout output from an output terminal of the transmission-side local oscillating unit 1114 by $\alpha$, acquires a division oscillation signal Vdev, and supplies the division oscillation signal Vdev to the phase/frequency comparing unit 1320. In this case, a that is a PLL multiple number (also called a division ratio) is a positive integer of 1 or more and may be changed such that of a frequency of the output oscillation signal Vout (transmission carrier signal) to be a PLL output clock CK_PLL can be changed.

In this configuration example, the dividing unit 1310 has a first dividing unit 1312 that divides a frequency of the output oscillation signal Vout by 6, a second dividing unit 1314 that divides a frequency of an output clock of the first dividing unit 1312 by 10, and a third dividing unit 1316 that divides a frequency of an output clock of the second dividing unit 1314 by N. A total PLL multiple number a of the dividing unit 1310 is "6*10*N". An output clock of the second dividing unit

1314 is used as a read clock of the FIFO memory 1212 and operation clocks of the framer 1214 and the code converting unit 1216.

The phase/frequency comparing unit 1320 compares phases and frequencies of a reference clock REF supplied from the reference signal generating unit 1370 and the division oscillation signal Vdev obtained by dividing the output oscillation signal Vout from the transmission-side local oscillating unit 1114 by the dividing unit 1310 and outputs error signals showing a phase difference and a frequency difference to be comparison results as pulse width modulated UP/DOWN signals.

The charge pump unit 1330 inputs/outputs a driving current (called a charge pump current Icp) according to the UP/DOWN signals output from the phase/frequency comparing unit 1320. For example, the charge pump unit 1330 is configured to include a charge pump inputting/outputting the charge pump current Icp output from the phase/frequency comparing unit 1320 and a current variable current source supplying a bias current Icpbias to the charge pump.

The loop filter unit 1350 is an example of a smoothing unit that smoothes a comparison signal output from the phase/frequency comparing unit 1320 through the charge pump 1330. The loop filter unit 1350 that is a low-pass filter integrates the charge pump current Icp generated by the charge pump unit 1330 and generates a loop filter output current Ilp to control an oscillation frequency fcco of the transmission-side local oscillating unit 1114. The loop filter output current Ilp is used as an oscillation control signal CN_1 of the transmission-side local oscillating unit 1114.

Although not illustrated in the drawings, the loop filter unit 1350 has a capacitor (capacitor element) having a loop filter capacity Cp. By connecting the capacitor and a resistor element having loop filter resistance Rp in series, stability of a loop can be improved. When a configuration including one charge pump is adopted, a configuration including the resistor element is generally adopted.

In the loop filter unit 1350, a voltage signal (called a charge pump voltage Vcp) is generated in one terminal (that is, an input of a voltage/current converting unit) of the loop filter, on the basis of the charge pump current Icp output from the charge pump. Because a charging/discharging operation is performed with respect to the capacitor, the loop filter unit 1350 functions as a low-pass filter showing at least one cutoff frequency to attenuate a frequency component equal to or higher than a predetermined cutoff frequency (called a roll-off frequency or pole) of a comparison result signal from the phase/frequency comparing unit 1320 and smooth an oscillation control signal Vcnt supplied to the transmission-side local oscillating unit 1114.

An entire operation of the broadband information processing unit 200A is as follows. A transmission carrier signal of 54 GHz that is output from the transmission-side local oscillating unit 1114 of the modulation functional unit 1110 is divided by 6 by the first dividing unit 1312 and becomes a 9 GHz selection control clock of the multiplexer 1218. The 9 GHz selection control clock is further divided by 10 by the second dividing unit 1314 and becomes a 900 MHz operation clock of the framer 1214 and the code converting unit 1216. The timing signal generating unit 1300 forms a PLL circuit together with the phase/frequency comparing unit 1320, the charge pump unit 1330, and the loop filter unit 1350, such that frequencies and phases of the 900 MHz operation clock and the reference clock REF from the reference signal generating unit 1370 are synchronized with each other.

An RF signal that is obtained by modulating the transmission carrier signal of 54 GHz with a NRZ signal of 9 Gb/s by the frequency mixing unit 1112 drives the coupler unit 120 of the electromagnetic field coupling unit 12 via the transmission amplifying unit 1120. The reason why the transmission carrier signal and the NRZ signal are generated from a VCO (transmission-side local oscillating unit 1114) for an RF and are synchronized is to decrease the number of PLL components and prevent a characteristic of the modulation functional unit 1110 from being changed by low-frequency beats of the transmission carrier signal and the NRZ signal.

In this example, information that is transmitted from the electronic device 2 is 12-bit data of 25 to 600 Mb/s synchronized with the write clock of 25 to 600 MHz. As such, one of examples in which the frequency changes broadly is R data of RGB data of a digital baseband image. The digital image data has various clock frequencies, as illustrated in FIG. 10A.

In this example, the FIFO memory 1212 and the framer 1214 are used to convert data having a variable rate into NRZ data of 900 Mb/s. The FIFO memory 1212 retrieves input data in a unit of 12 bits by the write clock of 25 to 600 MHz and reads the input data in a unit of 8 bits by the read clock of 900 MHz. At this time, if an amount of non-read data collected in the FIFO memory 1212 is less than a constant value, the FIFO memory 1212 outputs an EMPTY signal. At that time, the framer 1214 outputs a NULL signal. The code converting unit 1216 that has received the FIFO read data and the NULL signal from the framer 1214 generates a data code having the length of 10 bits or a NULL code. The code is converted into a NRZ signal of 9 Gb/s by the multiplexer 1218 (10:1 multiplexer) and the NRZ signal of 9 Gb/s is supplied to the frequency mixing unit 1112.

[Radio Reception->Wired Transmission]

Figure 11:
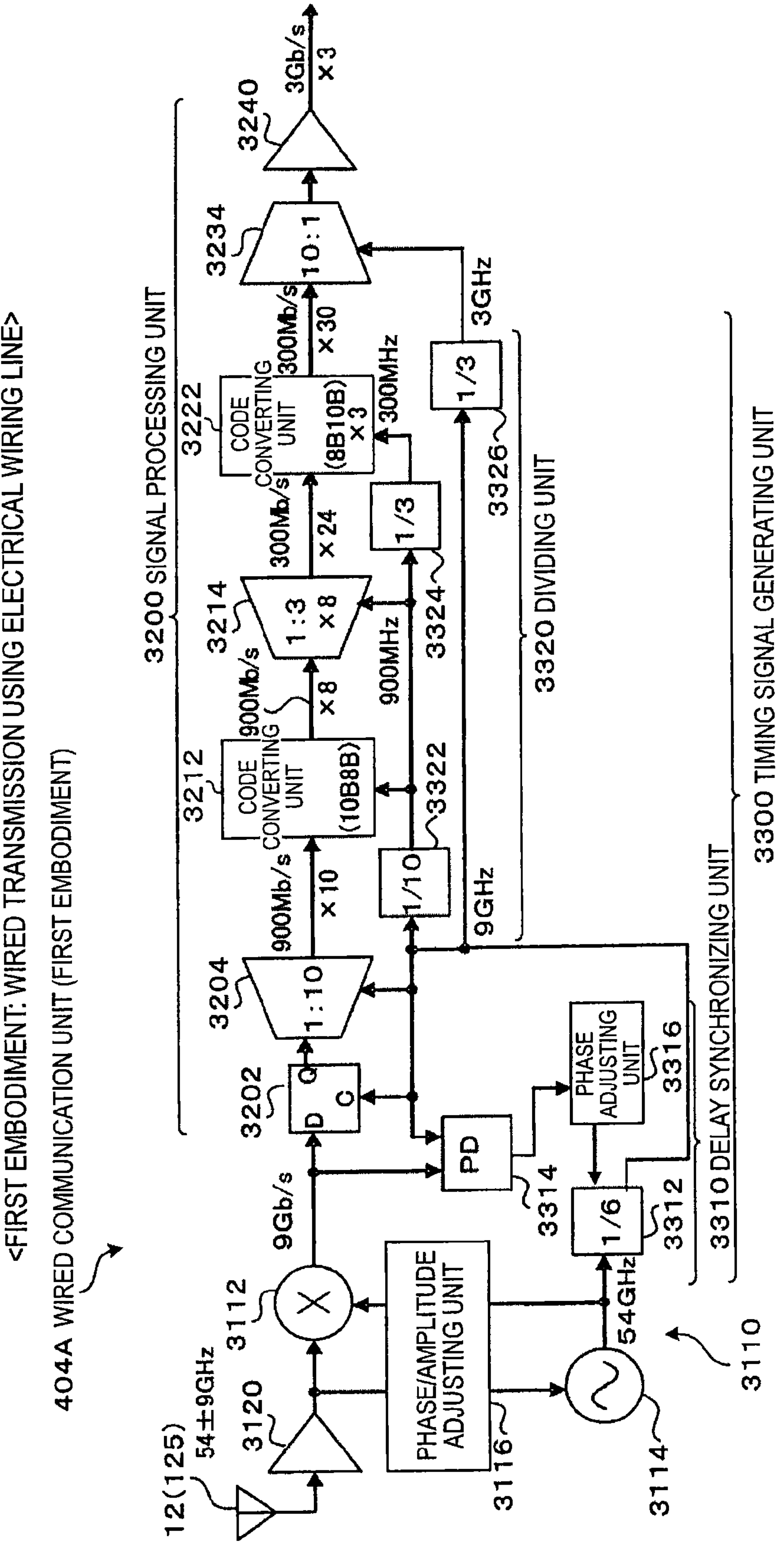
FIG. 11 is an illustration of a configuration of a radio reception circuit including a radio front end circuit.

FIG. 11 is an illustration of an example of a detailed configuration of a radio reception circuit including a radio front end circuit, that is, a functional unit (communication chip 401) that transmits broadband information demodulated by the wireless communication unit 402 by wire by the wired communication unit 404.

The wireless communication unit 402 has the same configuration as that of the radio reception circuit 3100 adopting an injection synchronization method (refer to FIG. 9(2)). In this case, explanation of the configuration of the wireless communication unit 402 is omitted.

A wired communication unit 404A according to the first embodiment transmits a broadband signal demodulated by the wireless communication unit 402 by the connection cable 4 (cable unit 40). At this time, the cable unit 40 may be driven without changing a frequency of the demodulated broadband signal. However, when the frequency of the demodulated broadband signal is higher than a correspondence frequency of the existing cable, it is preferable to divide the broadband signal into a plurality of signals and decrease the frequency. In order to correspond to high-speed transmission of the transmission data, a configuration to increase the number of wiring lines and decrease a transmission speed per signal line by parallelization of signals, that is, a configuration corresponding to a broadband data transmission through multichannel communication is used. Hereinafter, the configuration corresponding to the broadband data transmission through the multichannel communication will be described.

The wired communication unit 404A includes a signal processing unit 3200 and a timing signal generating unit 3300. The signal processing unit 3200 has an identification circuit 3202, a demultiplexer 3204, a code converting unit 3212, a demultiplexer 3214, a code converting unit 3222, a multiplexer 3234, and a wiring driving unit 3240.

A retiming clock (for example, a clock of 9 GHz) is supplied from the timing signal generating unit 3300 to the identification circuit 3202 and the demultiplexer 3204. A first operation clock (for example, a clock of 900 MHz) is supplied from the timing signal generating unit 3300 to the code converting unit 3212 and the demultiplexer 3214. A second operation clock (for example, a clock of 300 MHz) of which a speed is slower than that of the first operation clock is supplied from the timing signal generating unit 3300 to the code converting unit 3222. An output clock (for example, a clock of 3 GHz) is supplied from the timing signal generating unit 3300 to the demultiplexer 3214.

The identification circuit 3202 retrieves a broadband signal demodulated by the wireless communication unit 402 in synchronization with the retiming clock and supplies the broadband signal to the demultiplexer 3204. The identification circuit 3202 functions as the binarizing unit 3122.

The demultiplexer 3204 divides a broadband signal supplied from the identification circuit 3202 into a plurality of signals (for example, signals of 10 systems) in synchronization with the retiming clock, decreases frequencies, and supplies the signals to the code converting unit 3212.

The code converting unit 3212 is configured using a 10B8B conversion circuit and converts data demultiplexed by the demultiplexer 3204 into a data code having the length of 8 bits and supplies the data code to the demultiplexer 3214. The demultiplexer 3214 divides data of a plurality of systems (in this example, 8 systems) supplied from the code converting unit 3212 into a plurality of signals (for example, signals of three systems: a total of 24 systems), decreases frequencies, and supplies the signals to the code converting unit 3222.

The code converting unit 3222 is configured using an 8B10B conversion circuit and converts data demultiplexed by the demultiplexer 3214 into a data code having the length of 10 bits and supplies the data code to the multiplexer 3234. At this time, the code converting unit 3222 regularly inserts a special code for skew correction into three NRZ signals at the same time.

The multiplexer 3234 sequentially switches the codes supplied from the code converting unit 3222, on the basis of the output clock supplied from the timing signal generating unit 3300, selects the codes, generates signals of a plurality of systems (for example, 3 systems), and supplies the signals to the wiring driving unit 3240.

The timing signal generating unit 3300 generates a timing signal that is used by the wired communication unit 404A. The timing signal generating unit 3300 may be any one of timing signal generating units generating various timing signals and can adopt various circuit configurations. However, the timing signal generating unit 3300 is preferably configured using a PLL or a DLL. Hereinafter, the case in which the timing signal generating unit 3300 is configured using the DLL will be described.

The timing signal generating unit 3300 includes a delay synchronizing unit 3310 (DLL) and a dividing unit 3320. The dividing unit 3320 has a first dividing unit 3322 that divides the retiming clock output from the delay synchronizing unit 3310 by 10 and generates a first operation clock (for example, a clock of 900 MHz) and a second dividing unit 3324 that further divides the first operation clock output from the first dividing unit 3322 by 3 and generates a second operation clock (for example, a clock of 300 MHz).

The delay synchronizing unit 3310 is configured to use a reception-side local oscillating unit 3114 of the wireless communication unit 402 (radio reception circuit 3100) as an oscillation circuit and has a dividing unit 3312, a phase comparing unit 3314 (PD), and a phase adjusting unit 3316.

The delay synchronizing unit 3310 obtains a retiming clock (for example, a clock of 9 GHz) for the identification circuit 3202 and the demultiplexer 3204 (for 9 Gb/s data) by dividing the demodulation carrier signal (a frequency is 54 GHz) reproduced by the injection synchronization by the wireless communication unit 402 by 6 by the dividing unit 3312. At this time, in order to adjust a phase of the dividing unit 3312 to a phase most suitable for sampling the NRZ data, a phase difference of the NRZ signal demodulated by the wireless communication unit 402 (frequency mixing unit 3112) and the retiming clock output from the phase adjusting unit 3316 is detected by the phase comparing unit 3314 and detected phase difference information is supplied to the phase adjusting unit 3316.

The dividing unit 3312 can adjust the phase of the output signal, under control of the phase adjusting unit 3316. The phase adjusting unit 3316 adjusts the phase of the dividing unit 3312 such that the phase of the retiming clock (in this example, 9 GHz) becomes the most suitable phase, on the basis of the phase difference information detected by the phase comparing unit 3314.

The dividing unit 3312 may be configured as a simple divider and the phase adjusting unit 3316 may be configured as a device in which a plurality of steps of delay elements are arranged. In this case, the phase adjusting unit 3316 adjusts the phase by controlling whether an output of any delay element is used such that the phase of the retiming clock (in this example, 9 GHz) becomes the most suitable phase, on the basis of the phase difference information detected by the phase comparing unit 3314.

An entire operation of the wireless communication unit 402 is as follows. The wireless communication unit 402 uses the signal reproduced by the synchronization injection as the demodulation carrier signal (a frequency is 54 GHz), multiplies the signal with the received RF signal, demodulates the NRZ data of 9 Gb/s, and supplies the data to the identification circuit 3202 of the signal processing unit 3200.

The data that is sampled by the identification circuit 3202, that is, subjected to retiming is demultiplexed with 1:10 by the demultiplexer 3204, is converted into a signal (10 bits) of 900 Mb/s, and is subjected to 10B8B decoding by the code converting unit 3212. Then, the data is demultiplexed up to 300 MHz by the demultiplexer 3214, is subjected to 8B10B encoding by the code converting unit 3222, is multiplexed with 10:1 by the multiplexer 3234, is converted into three NRZ signals of 3 Gb/s, and is transmitted by the wiring driving unit 3240 through a conducting wire of the cable unit 40.

[Wired Reception->Radio Transmission]

Figure 12:
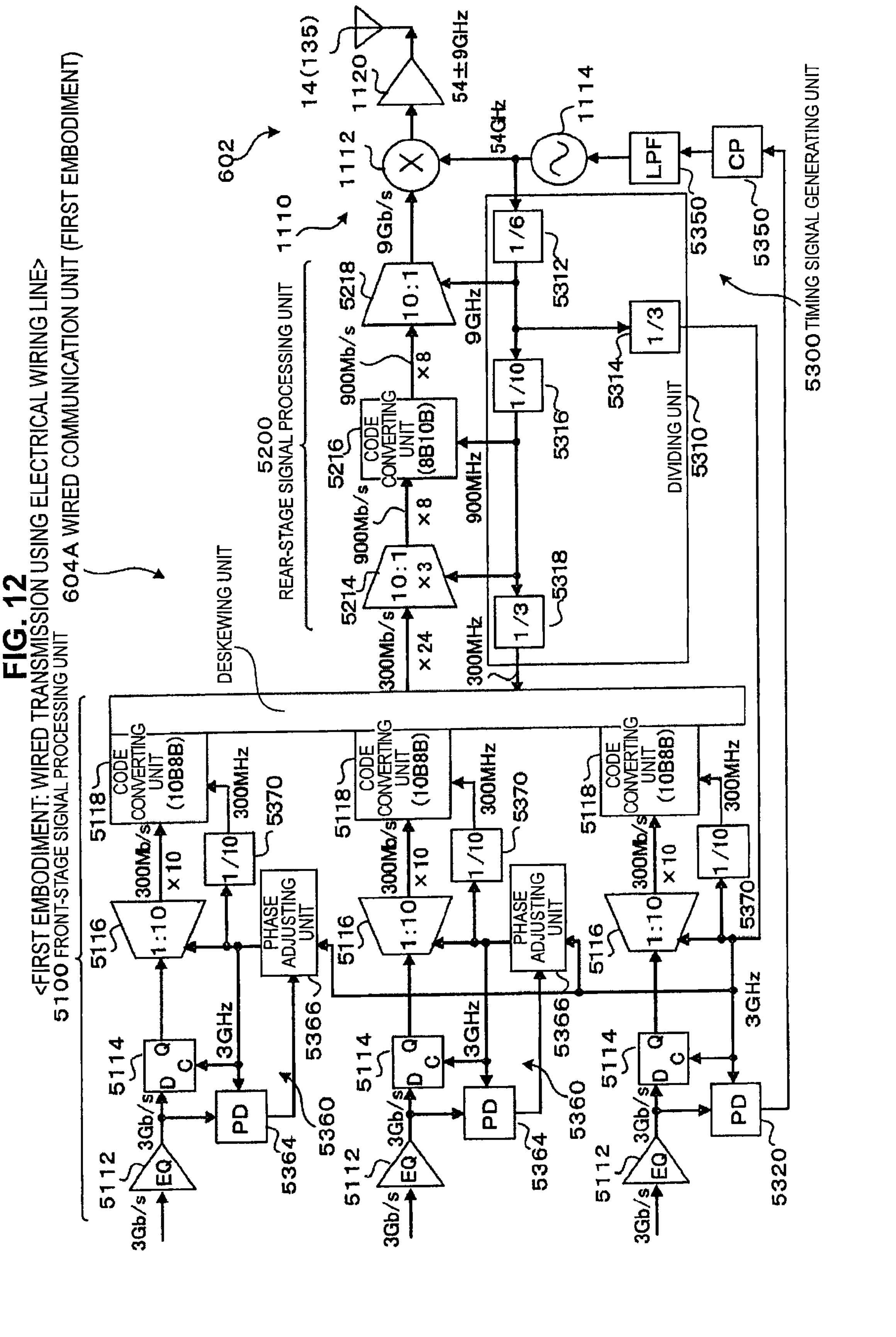
FIG. 12 is an illustration of an example of detailed configurations of a wired reception circuit and a radio transmission circuit each including a radio front end circuit.

FIG. 12 is an illustration of an example of a detailed configuration of a wired reception circuit and a radio transmission circuit including a radio front end circuit, that is, a functional unit (communication chip 601) that transmits broadband information received by the wired communication unit 604 by wireless by the wireless communication unit 602.

The wireless communication unit 602 has the same configuration as that of the radio transmission circuit 1100 (refer to FIG. 9). In this case, explanation of the configuration of the wireless communication unit 602 is omitted.

The wired communication unit 604A according to the first embodiment receives the three NRZ signals of 3 Gb/s transmitted by the wired communication unit 404A through the conducting wire of the cable unit 40, multiplexes the signals with 3:1, and generates a NRZ signal of 9 Gb/s. For this reason, the wired communication unit 604A includes a front-stage signal processing unit 5100, a rear-stage signal processing unit 5200, and a timing signal generating unit 5300.

The front-stage signal processing unit 5100 is a functional unit that processes the received three NRZ signals of 3 Gb/s and separately includes a sampling unit 5110 that samples the NRZ signal of 3 Gb/s. The front-stage signal processing unit 5100 further includes one deskewing unit 5150 at a rear stage of the sampling unit 5110.

A waveform equalizing unit 5112 shapes a waveform of the three NRZ signals of 3 Gb/s transmitted through the conducting wire 9010 of the cable unit 40. The identification circuit 5114 retrieves a signal output from the waveform equalizing unit 5112 at the retiming clock (a frequency is 3 GHz), quantizes the signal in a binary value, and supplies the signal to the demultiplexer 5116. The demultiplexer 5116 divides a broadband signal supplied from the identification circuit 5114 into a plurality of signals (for example, signals of 10 systems) in synchronization with the retiming clock, decreases frequencies, and supplies the signals to the code converting unit 5118.

The deskewing unit 5150 detects a skew between the signals generated by the transmission using the conducting wire of the cable unit 40, on the basis of the special code regularly inserted into the three NRZ signals at the same time by the code converting unit 3222, and corrects the signals to remove the skew.

The rear-stage signal processing unit 5200 is a functional unit that multiplexes the signals of the plurality of systems output from the deskewing unit 5150 of the front-stage signal processing unit 5100 and generates a NRZ signal of 9 Gb/s. The rear-stage signal processing unit 5200 includes a multiplexer 5214, a code converting unit 5216, and a multiplexer 5218.

An operation clock (for example, a clock of 900 MHz) is supplied from the dividing unit 5310 to the multiplexer 5214 and the code converting unit 5216. A high-speed operation clock (for example, a clock of 9 GHz) is supplied from the dividing unit 5310 to the multiplexer 5218.

The multiplexer 5214 sequentially switches the codes supplied from the deskewing unit 5150 according to a low-speed operation clock, selects the codes, generates NRZ signals of 900 Mb/s, and supplies the signals to the code converting unit 5216. The code converting unit 5216 is configured using an 8B10B conversion circuit and generates a data code having the length of 10 bits and supplies the data code to the multiplexer 5218. The multiplexer 5218 sequentially switches the codes supplied from the code converting unit 5216 according to a high-speed operation clock, selects the codes, generates NRZ signals of 9 Gb/s, and supplies the signals to the frequency mixing unit 1112 of the radio transmission circuit 1100.

The timing signal generating unit 5300 generates a timing signal that is used by the wired communication unit 604A. The timing signal generating unit 5300 may be configured using any one of timing signal generating units generating various timing signals and can adopt various circuit configurations. However, the timing signal generating unit 5300 is preferably configured using a PLL or a DLL. Hereinafter, the case in which the timing signal generating unit 5300 is configured using the PLL will be described.

The timing signal generating unit 5300 is configured to use the transmission-side local oscillating unit 1114 of the wireless communication unit 602 (radio transmission circuit 1100) as an oscillation circuit and includes a dividing unit 5310, a phase comparing unit 5320 (PD), a charge pump unit 5330 (CP), and a loop filter unit 5350.

The timing signal generating unit 5300 further includes a phase correcting unit 5360 with respect to two systems of three systems of the front-stage signal processing unit 5100 and includes a dividing unit 5370 separately with respect to all of the systems. The phase correcting unit 5360 is similar to the delay synchronizing unit 3310 and has a phase comparing unit 5364 (PD) and a phase adjusting unit 5366. The phase comparing unit 5320 is configured to function as a phase comparing unit 5364 (PD) of one system of the side of the front-stage signal processing unit 5100, in terms of a circuit placement.

The dividing unit 5310 has a first dividing unit 5312 that divides a frequency of the output oscillation signal Vout by 6, a second dividing unit 5314 that divides a frequency of an output clock of the first dividing unit 5312 by 3, a third dividing 5316 that divides a frequency of an output clock of the first dividing unit 5312 by 10, and a fourth dividing unit 5318 that divides a frequency of an output clock of the third dividing unit 5316 by 3.

A transmission carrier signal of 54 GHz that is output from the transmission-side local oscillating unit 1114 of the modulation functional unit 1110 is divided by 6 by the first dividing unit 5312 and becomes a high-speed operation clock (9 GHz selection control clock) of the multiplexer 5218. The 9 GHz selection control clock is further divided by 10 by the third dividing unit 5316 and becomes a low-speed operation clock (900 MHz operation clock) of the multiplexer 5214 and the code converting unit 5216. The low-speed operation clock is further divided by 3 by the fourth dividing unit 5318 and becomes a low-speed operation clock (300 MHz operation clock) of the deskewing unit 5150.

The high-speed operation clock that is output from the first dividing unit 5312 is further divided by 3 by the second dividing unit 5314, is supplied as a 3 GHz comparison clock to the phase comparing unit 5320 and the phase correcting unit 5360, and is used as a retiming clock for the identification circuit 5114 and the demultiplexer 5116 of a system not provided with the phase correcting unit 5360.

The timing signal generating unit 5300 forms a PLL circuit together with the phase comparing unit 5320, the charge pump unit 5330, and the loop filter unit 5350, such that frequencies and phases of the 3 GHz comparison clock and the reception signal received by the front-stage signal processing unit 5100 are synchronized with each other. An operation of the timing signal generating unit 5300 is basically similar to the operation of the timing signal generating unit 1300. The operation of the timing signal generating unit 5300 is different from the operation of the timing signal generating unit 1300 in that the timing signal generating unit 5300 does not include a functional unit corresponding to the reference signal generating unit 1370 and uses the output signal of the waveform equalizing unit 5112 of the system not provided with the phase correcting unit 5360 of the front-stage signal processing unit 5100 as a reference clock.

The sampling unit 5110 has a waveform equalizing unit 5112 (EQ: Cable Equalizer) having an amplification function, an identification circuit 5114, a demultiplexer 5116, and a code converting unit 5118. A retiming clock (a frequency is 3 GHz) is commonly supplied from the timing signal generating unit 5300 to the identification circuit 5114 and the demultiplexer 5116 of one system. An operation clock that is obtained by dividing the retiming clock (a frequency is 3 GHz) by 10 by the dividing unit 5370 is supplied to the code converting unit 5118 of the corresponding system. A retiming clock (a frequency is 3 GHz) is commonly supplied from the phase correcting unit 5360 to the identification circuit 5114 and the demultiplexer 5116 of the remaining systems (in this example, two systems). An operation clock that is obtained by dividing the retiming clock (a frequency is 3 GHz) from the phase correcting unit 5360 of the same system by 10 by the dividing unit 5370 is supplied to the code converting unit 5118.

A 3 GHz comparison clock is supplied from the second dividing unit 5314 to the phase adjusting unit 5366. The phase adjusting unit 5366 may be a device in which a plurality of steps of delay elements are arranged. The phase adjusting unit 5366 adjusts the phase by controlling whether an output of any delay element is used such that the phase of the retiming clock (in this example, 3 GHz) becomes the most suitable phase, on the basis of the phase difference information detected by the phase comparing unit 5364.

The phase correcting unit 5360 synchronizes a phase of a retiming clock (for example, a clock of 3 GHz) for the identification circuit 5114 and the demultiplexer 5116 (for 3 Gb/s data) with a phase of the reception signal. In addition, the frequency synchronization is realized by the timing signal generating unit 5300. In order to adjust a phase of the retiming clock supplied from the timing signal generating unit 5300 to a phase most suitable for sampling the NRZ data, the phase difference of the NRZ signal output from the waveform equalizing unit 5112 and the retiming clock output from the phase adjusting unit 5366 is detected by the phase comparing unit 5364 and detected phase difference information is supplied to the phase adjusting unit 5366. The phase adjusting unit 5366 adjusts the phase of the retiming clock, on the basis of the phase difference information detected by the phase comparing unit 5364.

An entire operation of the wired communication unit 604A is as follows. The three NRZ signals of 3 Gb/s transmitted through the conducting wire of the cable unit 40 are first subjected to waveform shaping by the waveform equalizing unit 5112 and are quantized in a binary value at the 3 GHz sampling clocks (retiming clocks). One of the re-3 GHz sampling clocks is acquired by the PLL configuration by comparing the shifts and the phases of the received NRZ signals by the phase comparing unit 5320 of the timing signal generating unit 5300 and feeding results back to the transmission-side local oscillating unit 1114. The 3 GHz sampling clocks of the remaining systems are acquired by supplying the 3 GHz sampling clock of one system to (the phase adjusting unit 5366 of) the phase correcting unit 5360 and shifting a phase on the basis of phase difference information (detected by the phase comparing unit 5364) with the NRZ signal of the self system. That is, the shift amount of the phase is adjusted by the phase comparison of each 3 GHz sampling clock and the NRZ signal shift.

The 3 Gb/s signals that are quantized at the 3 GHz sampling clock and are subjected to retiming are decomposed into signals (10 bits) of 300 Mb/s by the demultiplexer 5116, are converted into 8-bit data by the code converting unit 5118, and are supplied to the deskewing unit 5150. The deskewing unit 5150 corrects the signals to remove the skew between the signals generated by the transmission through the conducting wire of the cable unit 40, on the basis of the special code for skew correction inserted into the data.

The rear-stage signal processing unit 5200 multiplexes the signals of 300 Mb/s and 24 bits output from the deskewing unit 5150 by the multiplexer 5214, acquires 900 Mb/s signals (10 bits), and supplies the signals to the code converting unit 5216. The following processing is the same as the processing of the code converting unit 1216 of the broadband information processing unit 200A and the subsequent processing.

[Radio Reception->Baseband Signal]

Figure 13:
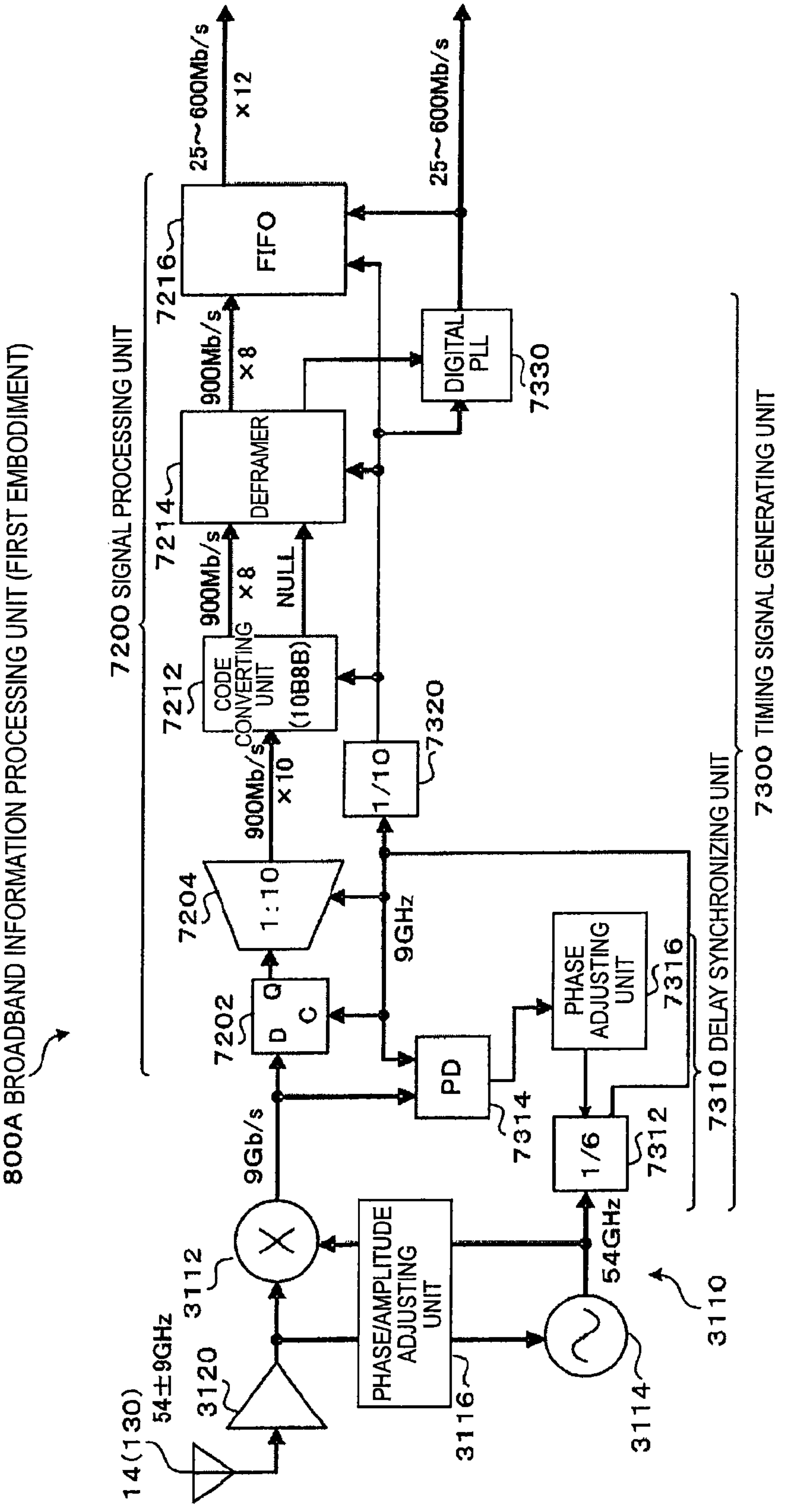
FIG. 13 is an illustration of an example of detailed configurations of a wired reception circuit and a radio transmission circuit each including a radio front end circuit.

FIG. 13 is an illustration of an example of a detailed configuration of a wired reception circuit and a radio transmission circuit including a radio front end circuit, that is, a functional unit that processes broadband information demodulated by the wireless communication unit 802 by the broadband information processing unit 800.

The wireless communication unit 802 has the same configuration as that of the radio reception circuit 3100 adopting an injection synchronization method (refer to FIG. 9(2)). In this case, explanation of the configuration of the wireless communication unit 802 is omitted.

The broadband information processing unit 800A according to the first embodiment processes the received broadband signal and includes a signal processing unit 7200 and a timing signal generating unit 7300. The signal processing unit 7200 has an identification circuit 7202, a demultiplexer 7204, a code converting unit 7212, a deframer 7214, and a FIFO memory 7216.

A retiming clock (for example, a clock of 9 GHz) is supplied from the timing signal generating unit 7300 to the identification circuit 7202 and the demultiplexer 7204. A first operation clock (for example, a clock of 900 MHz) is supplied from the timing signal generating unit 7300 to the code converting unit 7212 and the deframer 7214. A write clock (for example, a clock of 900 MHz) and a read clock (for example, a clock of 25 to 600 MHz) are input from the timing signal generating unit 7300 to the FIFO memory 7216.

The timing signal generating unit 7300 generates a timing signal that is used by the broadband information processing unit 800A. The timing signal generating unit 7300 may be any one of timing signal generating units generating various timing signals and can adopt various circuit configurations. However, the timing signal generating unit 7300 is preferably configured using a PLL or a DLL. Hereinafter, the case in which the timing signal generating unit 7300 is configured using the DLL, similar to the timing signal generating unit 3300 of the wired communication unit 404A, will be described.

The timing signal generating unit 7300 includes a delay synchronizing unit 7310 (DLL), a dividing unit 7320, and a digital PLL unit 7330. The dividing unit 7320 divides the retiming clock output from the delay synchronizing unit 7310 by 10 and uses the clocks as the operation clocks of the code converting unit 7212 and the deframer 7214 and the write clock (for example, a clock of 900 MHz) of the FIFO memory 7216. The digital PLL unit 7330 generates a read clock (for example, a clock of 25 to 600 MHz) for the FIFO memory 7216.

The delay synchronizing unit 7310 has the same configuration as that of the delay synchronizing unit 3310. The delay synchronizing unit 7310 is configured to use a reception-side local oscillating unit 3114 of the wireless communication unit 802 (radio reception circuit 3100) as an oscillation circuit and has a dividing unit 7312, a phase comparing unit 7314 (PD), and a phase adjusting unit 7316.

The delay synchronizing unit 7310 obtains the retiming clock (for example, a clock of 9 GHz) for the identification circuit 7202 and the demultiplexer 7204 (for 9 Gb/s data) by dividing the demodulation carrier signal (a frequency is 54 GHz) reproduced by the injection synchronization by the wireless communication unit 802 by 6 by the dividing unit 7312. At this time, in order to adjust a phase of the dividing unit 7312 to a phase most suitable for sampling the NRZ data, a phase difference of the NRZ signal demodulated by the wireless communication unit 802 (frequency mixing unit 3112) and the retiming clock output from the phase adjusting unit 7316 is detected by the phase comparing unit 7314 and detected phase difference information is supplied to the phase adjusting unit 7316.

The dividing unit 7312 can adjust the phase of the output signal, under control of the phase adjusting unit 7316. The phase adjusting unit 7316 adjusts the phase of the dividing unit 7312 such that the phase of the retiming clock (in this example, 9 GHz) becomes the most suitable phase, on the basis of the phase difference information detected by the phase comparing unit 7314.

The dividing unit 7312 may be configured as a simple divider and the phase adjusting unit 7316 may be configured as a device in which a plurality of steps of delay elements are arranged. In this case, the phase adjusting unit 7316 adjusts the phase by controlling whether an output of any delay element is used such that the phase of the retiming clock (in this example, 9 GHz) becomes the most suitable phase, on the basis of the phase difference information detected by the phase comparing unit 7314.

The digital PLL unit 7330 generates a clock using the FIFO input data inserted into the data and the information regarding the frequency ratio of the 900 MHz clock by the function of the framer 1214 of the signal processing unit 1200 of the broadband information processing unit 200A. The clock that is generated by the digital PLL unit 7330 is used as the read clock of the FIFO memory 7216 or an operation clock of a rear-stage circuit not illustrated in the drawings. The digital PLL is used even in the "VESA DisplayPort standard".

The processing from the identification circuit 7202 of the signal processing unit 7200 to the code converting unit 7212 is the same as the processing from the identification circuit 3202 of the signal processing unit 3200 of the wired communication unit 404A to the code converting unit 3212. For example, the identification circuit 7202 retrieves the broadband signal demodulated by the wireless communication unit 802 in synchronization with the retiming clock and supplies the broadband signal to the demultiplexer 7204. The identification circuit 7202 also functions as the binarizing unit 3122.

The demultiplexer 7204 divides the broadband signal supplied from the identification circuit 7202 into a plurality of signals (for example, signals of 10 systems) in synchronization with the retiming clock, decreases frequencies, and supplies the signals to the code converting unit 3212. The code converting unit 3212 is configured using a 10B8B conversion circuit. The code converting unit 3212 converts the data demultiplexed by the demultiplexer 3204 into data codes having the length of 8 bits, extracts a NULL signal, and supplies the NULL signal to the deframer 7214.

The deframer 7214 executes processing in reverse order of the processing of the framer 1214. For example, the deframer 7214 executes known deframe processing in synchronization with an operation clock and outputs a broadband signal (for example, 8-bit data of 900 Mb/s). The deframer 7214 outputs the EMPTY signal based on the NULL signal. The broadband signal (for example, 8-bit data of 900 Mb/s) that is the 10B8B output is supplied to the FIFO memory 7216 and the EMPTY signal is used as a reference signal at the time of generating a read clock in the digital PLL unit 7330.

The FIFO memory 7216 retrieves the 8-bit data at 900 MHz and reads the data in a unit of 12 bits. For example, the FIFO memory 7216 retrieves the 10B8B output (8 bits) from the deframer 7214 in synchronization with the write clock (a frequency is 900 MHz) and outputs the broadband signal (for example, 12-bit data of 25 to 600 Mb/s) as a baseband signal in synchronization with the read clock (a frequency is 25 to 600 MHz) generated by the digital PLL unit 7330.

Second Embodiment

Configuration of Surrounding Portion of Electromagnetic Field Coupling Unit

Figure 14:
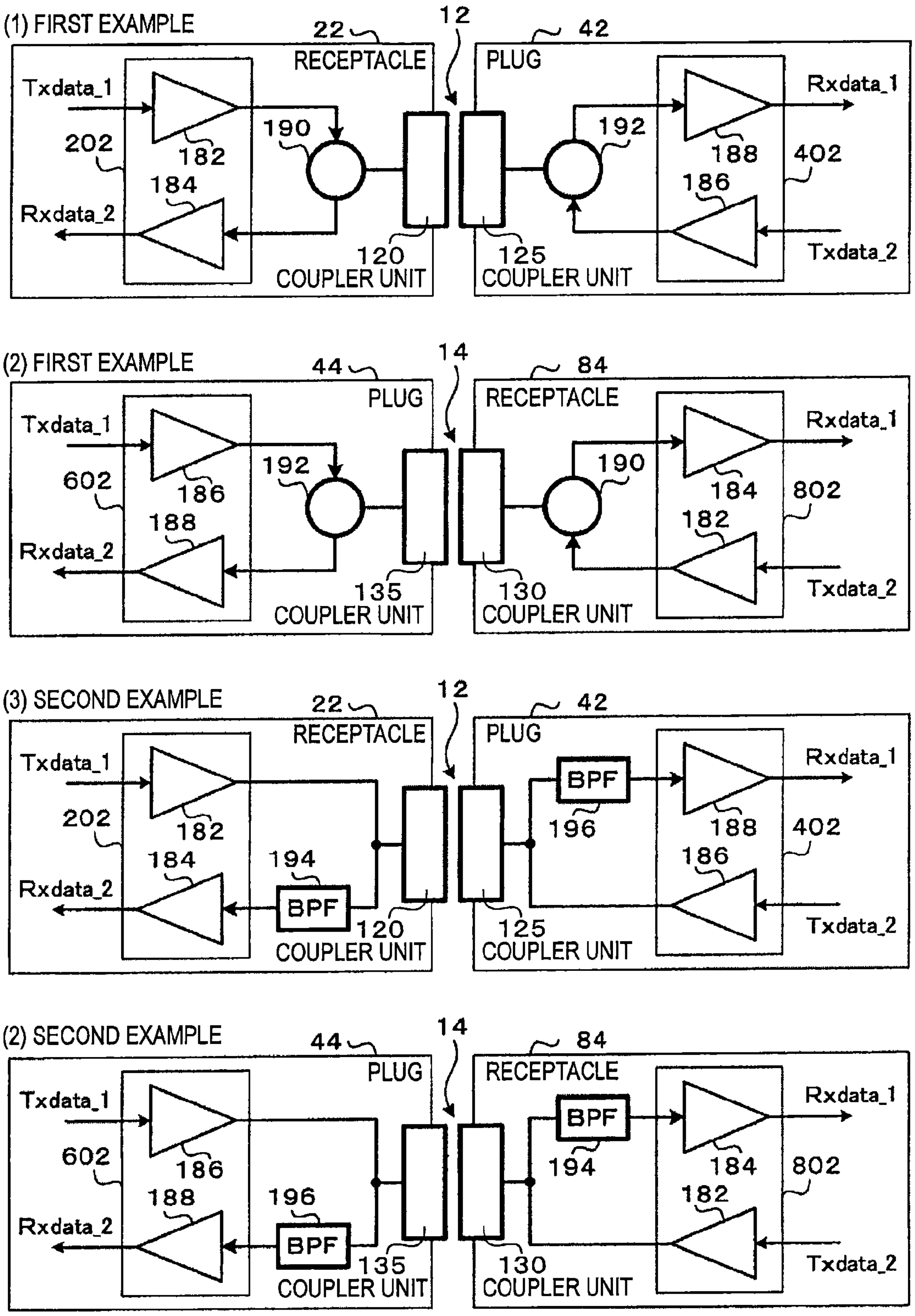
FIG. 14 is a conceptual illustration of a circuit that performs bidirectional wireless communication.

FIG. 14 is an illustration of a configuration of a surrounding portion of a coupler (an electromagnetic field coupling unit 12 and an electromagnetic field coupling unit 14) of a signal transmission system 1B according to a second embodiment.

In the second embodiment, a structure according to this embodiment for transmitting a broadband signal by wireless by a connector unit is applied to bidirectional communication in which a signal transmission from the side of an electronic device 2 to the side of an electronic device 8 and a signal transmission from the side of the electronic device 8 to the side of the electronic device 2 are performed. Hereinafter, structural elements of the side of the electromagnetic field coupling unit 14 are shown by parentheses, when systems of the electromagnetic field coupling unit 12 and the electromagnetic field coupling unit 14 are described at the same time.

When the signal transmission system corresponds to the bidirectional communication, a configuration of a first example is first provided separately in each direction. However, in this case, because a coupler (the electromagnetic field coupling unit 12 and the electromagnetic field coupling unit 14) needs to be provided in each direction, the number of components that construct a bidirectional interface increases. Therefore, in the second embodiment, one set of couplers (a pair of a coupler unit 120 and a coupler unit 125 and a pair of a coupler unit 130 and a coupler unit 135) is shared in each direction of the bidirectional communication to decrease the number of components constructing the bidirectional interface.

FIG. 14 is a conceptual illustration of a circuit that performs the bidirectional wireless communication. In FIG. 14, a wireless communication unit 202 (wireless communication unit 802) is stored inside a receptacle 22 (receptacle 84). Although not illustrated in the drawings, the wireless communication unit 202 (wireless communication unit 802) may be stored outside the receptacle 22 (inside the electronic device 2 or inside the electronic device 8) (refer to FIGS. 15 and 15A to be described below).

The wireless communication unit 202 (wireless communication unit 802) has a transmission circuit 182 (which has the same configuration as that of the radio transmission circuit 1100) and a reception circuit 184 (which has the same configuration as that of the radio reception circuit 3100) to correspond to the bidirectional communication. The wireless communication unit 402 (wireless communication unit 602) has a transmission circuit 186 (which has the same configuration as that of the radio transmission circuit 1100) and a reception circuit 188 (which has the same configuration as that of the radio reception circuit 3100) to correspond to the bidirectional communication.

As illustrated in FIGS. 14(1) and 14(3), the wireless communication unit 202 is connected to a broadband information processing unit 200 not illustrated in the drawings, a broadband transmission signal Txdata_1 is input from the broadband information processing unit 200 to the transmission circuit 182, and a broadband reception signal Rxdata_2 demodulated by the reception circuit 184 is input to the broadband information processing unit 200. The wireless communication unit 402 is connected to a wired communication unit 404 not illustrated in the drawings, a broadband transmission signal Txdata_2 is input from the wired communication unit 404 to the transmission circuit 186, and a broadband reception signal Rxdata_1 demodulated by the reception circuit 188 is input to the wired communication unit 404.

As illustrated in FIGS. 14(2) and 14(4), the wireless communication unit 602 is connected to a wired communication unit 604 not illustrated in the drawings, the broadband transmission signal Txdata_1 is input from the wired communication unit 604 to the transmission circuit 186, and the broadband reception signal Rxdata_2 demodulated by the reception circuit 188 is input to the wired communication unit 604. The wireless communication unit 802 is connected to a broadband information processing unit 800 not illustrated in the drawings, the broadband transmission signal Txdata_2 is input from the broadband information processing unit 800 to the transmission circuit 182, and the broadband reception signal Rxdata_1 demodulated by the reception circuit 184 is input to the broadband information processing unit 800.

In this case, in the first example illustrated in FIGS. 14(1) and 14(2), a direction managing unit 190 is used at the side of the receptacle 22 (receptacle 84) and a direction managing unit 192 is used at the side of the plug 42 (plug 44), so that bidirectional simultaneous transmission and reception are performed by one set of couplers. A directional coupler or a circulator can be used as the direction managing unit 190 and the direction managing unit 192.

The direction managing unit 190 and the direction managing unit 192 transmit signals transmitted from the transmission circuit 182 and the transmission circuit 186 to only the coupler (the electromagnetic field coupling unit 12 and the electromagnetic field coupling unit 14) and do not transmit the signals to the reception circuit 184 and the reception circuit 188. The signals that are received by the coupler are transmitted to only the reception circuit 184 and the reception circuit 188 and are not transmitted to the transmission circuit 182 and the transmission circuit 186. Thereby, outputs of the transmission circuit 182 and the transmission circuit 186 are transmitted from the coupler without loss and the reception circuit 184 and the reception circuit 188 can correctly determine the signals received by the coupler, without being disturbed by the signals transmitted from the transmission circuit 182 and the transmission circuit 186.

As in Ethernet (registered trademark), when all connection apparatuses introduce coupler communication (wireless communication through the electromagnetic field coupling units) in a coordinative bidirectional interface, the number of components of a connector can be decreased by using a bidirectional front end circuit. In the HDMI, there is the distinction of a source apparatus outputting data to a device and a sink apparatus receiving data. However, because both ends of the cable have the same shape, it is preferable to realize bidirectional wireless communication through the coupler, such that any plug may be inserted into a receptacle of the source apparatus.

In a second example illustrated in FIGS. 14(3) and 14(4), two kinds of different carrier frequencies are used without using the directional coupler or the circulator and bidirectional simultaneous transmission and reception are performed by one set of couplers. In order to correspond to using the two kinds of different carrier frequencies, frequency selection functional units corresponding to the different carrier frequencies are provided in a reception system. In the example illustrated in the drawings, a band-pass filter 194 (BPF) is provided at a front stage of the reception circuit 184 and a band-pass filter 196 (BPF) is provided at a front stage of the reception circuit 188. The band-pass filter 194 and the band-pass filter 196 are an example of the frequency selection functional units. The frequency selection functional unit is not limited to the band-pass filter. For example, transmission and reception signals by two sets of carriers may be separated by performing synchronization detection based on an injection synchronization method in the reception circuit and restricting a band of the baseband signal after the detection.

Configuration

First Example

Figure 15:
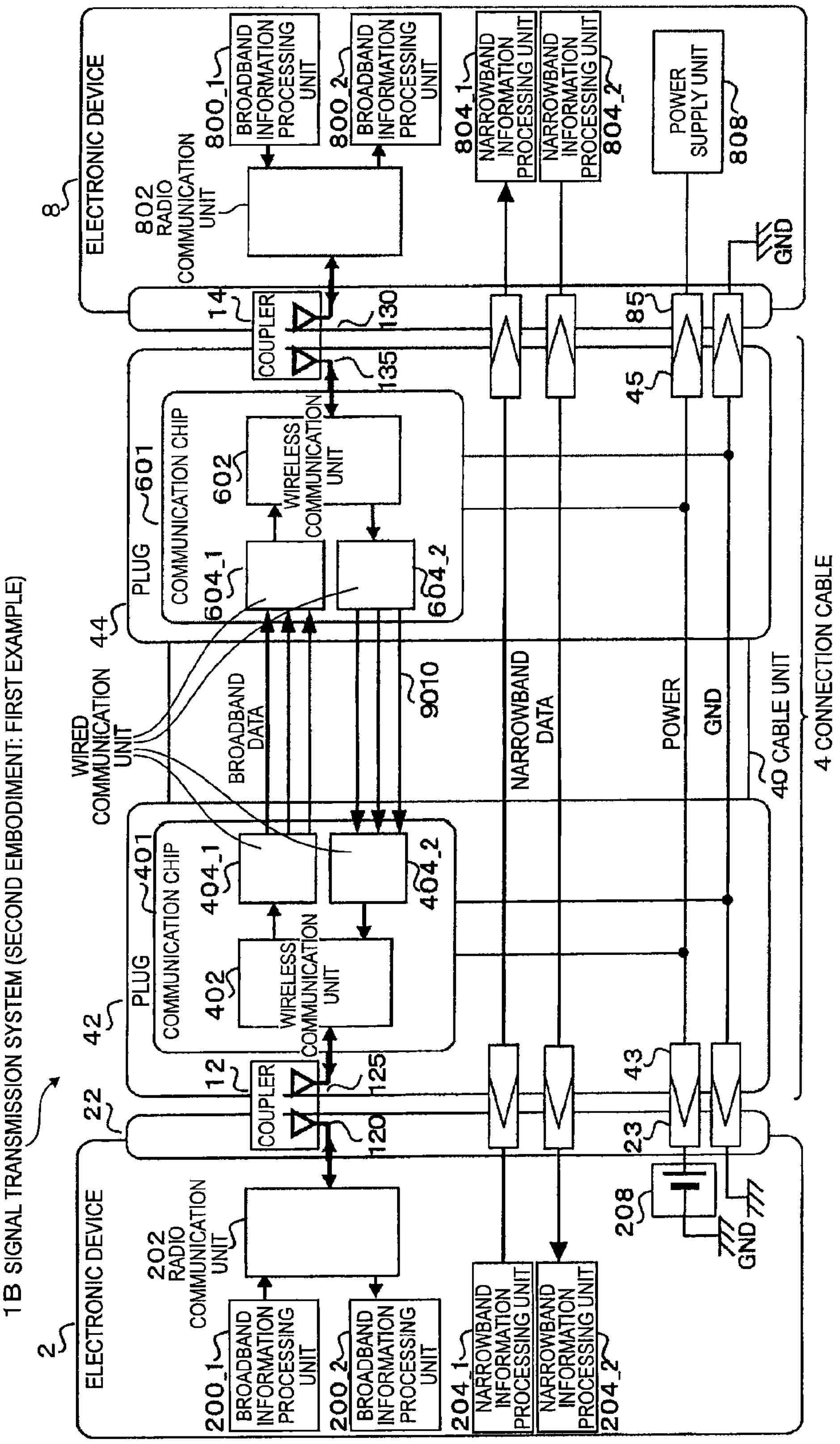
FIG. 15 is an illustration of an entire configuration of a signal transmission system according to a first example of a second embodiment.

FIG. 15 is an illustration of an entire configuration of a signal transmission system 1B according to a first example of the second embodiment. FIG. 15 illustrates a state in which a first electronic device 2 and a second electronic device 8 are connected by a connection cable 4. FIG. 15 illustrates a modification of the configuration of the first example of the first embodiment illustrated in FIG. 2. However, the same modification may be applied to the configuration of the second example of the first embodiment illustrated in FIG. 2A. Hereinafter, focusing on a difference with the configuration of the first example of the first embodiment, explanation is given. In this case, transmission of a clock signal is omitted.

The electronic device 2 includes a wireless communication unit 202 that corresponds to the bidirectional simultaneous communication illustrated in FIG. 14 and broadband information processing units 200_1 and 200_2 of two systems are connected to the wireless communication unit 202. The broadband information processing unit 200_1 supplies a broadband signal to the wireless communication unit 202 and the broadband information processing unit 200_2 receives the broadband signal demodulated by the wireless communication unit 202. The electronic device 2 further includes narrowband information processing units 204_1 and 204_2 of two systems, with respect to systems of narrowband signals.

A plug 42 of the connection cable 4 includes a wireless communication unit 402 that corresponds to the bidirectional simultaneous communication illustrated in FIG. 14 and wired communication units 404_1 and 404_2 of two systems are connected to the wireless communication unit 402. These elements are stored in the communication chip 401. The wired communication unit 404_1 that functions as a wired transmitter receives the broadband signal demodulated by the wireless communication unit 402 and transmits the broadband signal to the cable unit 40. The wired communication unit 404_2 that functions as a wired receiver supplies the broadband signal received through the cable unit 40 to the wireless communication unit 402.

A plug 44 of the connection cable 4 includes a wireless communication unit 602 that corresponds to the bidirectional simultaneous communication illustrated in FIG. 14 and wired communication units 604_1 and 604_2 of two systems are connected to the wireless communication unit 602. These elements are stored in the communication chip 601. The wired communication unit 604_1 that functions as a wired receiver supplies the broadband signal received through the cable unit 40 to the wireless communication unit 602. The wired communication unit 604_2 that functions as a wired transmitter receives the broadband signal demodulated by the wireless communication unit 602 and transmits the broadband signal to the cable unit 40.

The electronic device 8 includes a wireless communication unit 802 that corresponds to the bidirectional simultaneous communication illustrated in FIG. 14 and broadband information processing units 800_1 and 800_2 of two systems are connected to the wireless communication unit 802. The broadband information processing unit 800_1 receives the broadband signal demodulated by the wireless communication unit 802 and the broadband information processing unit 800_2 supplies the broadband signal to the wireless communication unit 802. The electronic device 8 further includes narrowband information processing units 804_1 and 804_2 of two systems, with respect to systems of narrowband signals.

As the wired communication unit 404_1 and the wired communication unit 604_2 that function as the wired transmitters, wired communication units that have the same configuration as that of the wired communication unit 404 illustrated in FIG. 11 are used. As the wired communication unit 404_2 and the wired communication unit 604_1 that function as the wired receivers, wired communication units that have the same configuration as that of the wired communication unit 604 illustrated in FIG. 12 are used.

The first example is different from a second example (refer to FIG. 15A) to be described below in that wired transmission in the cable unit 40 between the wired communication unit 404_1 and the wired communication unit 604_1 and wired transmission in the cable unit 40 between the wired communication unit 404_2 and the wired communication unit 604_2 are performed using different conducting wires, respectively. The number of conducting wires of the cable unit 40 becomes larger than the number of conducting wires in the second example. However, because an echo canceller technique does not need to be applied, the plugs 42 and 44 can be simplified as compared with the second example and the possibility of crosstalk of a transmission signal and a reception signal occurring becomes lower than that of the second example.

Configuration

Second Example

Figure 15A:
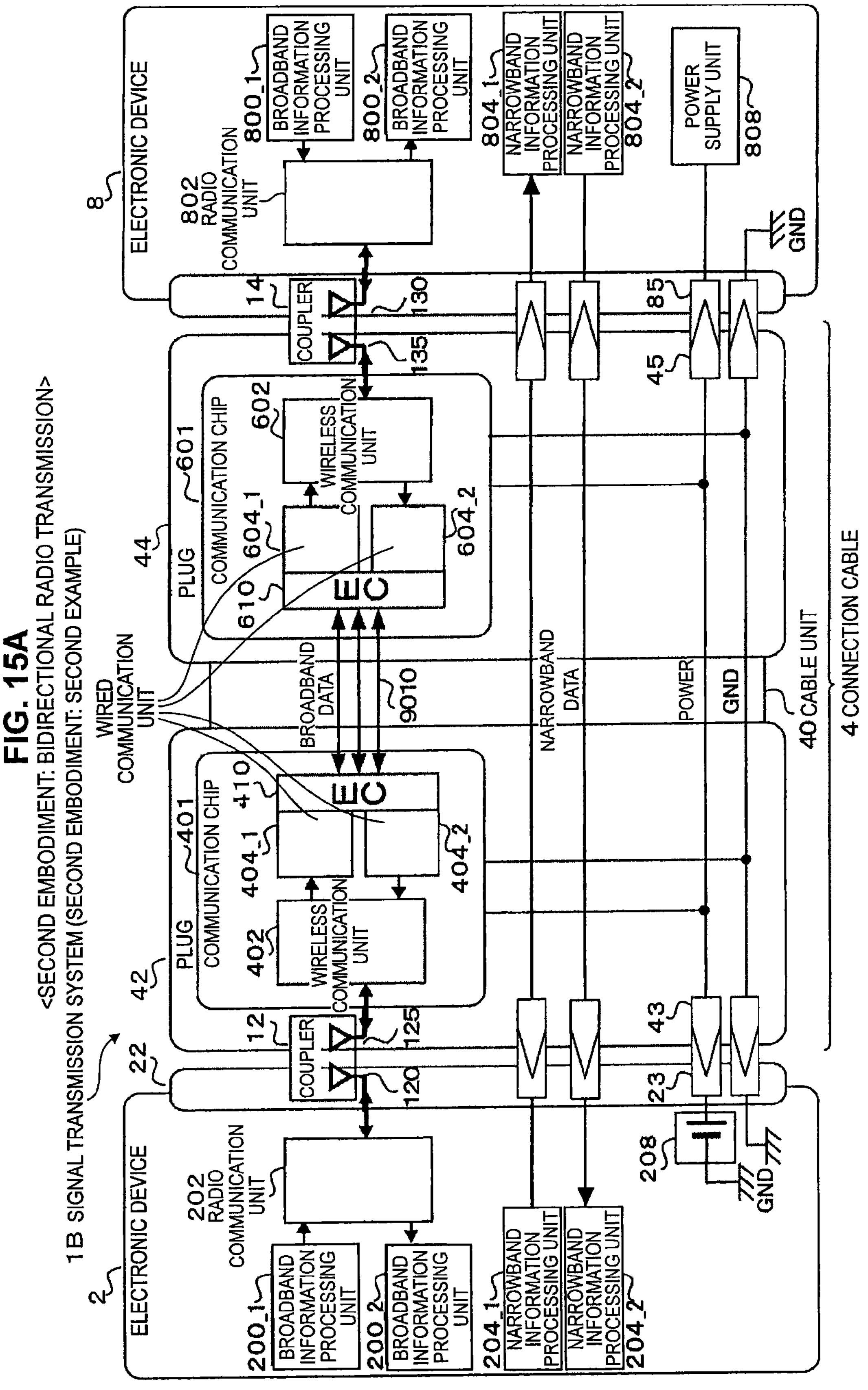
FIG. 15A is an illustration of an entire configuration of a signal transmission system according to a second example of the second embodiment.

FIG. 15A is an illustration of an entire configuration of a signal transmission system 1B according to a second example of the second embodiment. FIG. 15A illustrates a state in which the first electronic device 2 and the second electronic device 8 are connected by the connection cable 4. FIG. 14A illustrates a modification of the configuration of the first example of the first embodiment illustrated in FIG. 2. However, the same modification may be applied to the configuration of the second example of the first embodiment illustrated in FIG. 2A. Hereinafter, focusing on a difference with the configuration of the first example of the second embodiment, explanation is given.

The second example is characterized in that an echo canceller technique is applied such that wired transmission can be performed using a common conducting wire, between the wire communication unit 404_1 and the wired communication unit 604_1 and between the wired communication unit 404_2 and the wired communication unit 604_2, in addition to the configuration of the first example. A common differential pair is used in bidirectional communication, using the known echo canceller technique. For this reason, the communication chip 401 includes an echo cancelling unit 410 (EC) at the side of the cable unit 40 of the wired communication units 404_1 and 404_2. The communication chip 601 includes an echo cancelling unit 610 (EC) at the side of the cable unit 40 of the wired communication units 604_1 and 604_2.

Third Embodiment

The third embodiment is an aspect in which it is detected whether compatibility of standards is taken in connector connection and it is controlled whether wireless communication is performed. The third embodiment is characterized in that a mechanism (called a connection compatibility determining mechanism, a radio correspondence identification control mechanism, or a wireless communication function detection mechanism) for detecting whether a structure according to this embodiment for performing radio transmission by a connector unit is applied and performing control is provided and backward compatibility with an existing connector apparatus to which this embodiment is not applied is taken. Even though a coupling structure is the same as that of the existing connector (even though mechanical connection compatibility is maintained), a shape is changed because a coupler (an electromagnetic field coupling unit 12 and an electromagnetic field coupling unit 14) is provided in a connector unit. In this case, when each connected apparatus and all of cables can perform radio transmission, the radio transmission is performed. When each connected devices and all of cables cannot perform the radio transmission, transmission is performed according to an existing connector specification.

In addition, the radio correspondence identification control mechanism is provided in the electronic device 2, the connection cable 4, and the electronic device 8. The radio correspondence or the radio non-correspondence is determined as follows. For example, a broadband information processing unit 200, a wireless communication unit 202, and a coupler unit 120 are provided in the electronic device 2. When the electronic device 2 does not correspond to the wireless communication, the broadband information processing unit 200, the wireless communication unit 202, and the coupler unit 120 are not provided in the electronic device 2.

When the electronic device 8 corresponds to the wireless communication, a broadband information processing unit 800, a wireless communication unit 802, and a coupler unit 130 are provided in the electronic device 8. When the electronic device 8 does not correspond to the wireless communication, the broadband information processing unit 800, the wireless communication unit 802, and the coupler unit 130 are not provided in the electronic device 8.

When the connection cable 4 corresponds to the wireless communication, a coupler unit 125 and a communication chip 401 are provided in the plug 42 and a coupler unit 135 and a communication chip 601 are provided in the plug 44. When the connection cable 4 does not correspond to the wireless communication, the coupler unit 125 and the communication chip 401 are not provided in the plug 42 and the coupler unit 135 and the communication chip 601 are not provided in the plug 44. That is, neither the plug 42 nor the plug 44 corresponds to the wireless communication (the coupler unit and the communication chip are provided).

The case in which a new generation interface according to this embodiment to which the coupler (the electromagnetic field coupling unit 12 and the electromagnetic field coupling unit 14) is applied is used together with an old generation interface not provided with the coupler is considered. In this case, only when there is a wireless communication function in which the couplers are applied to all of the electronic device 2, the connection cable 4, and the electronic device 8, data transmission (in particular, broadband data transmission) through the coupler is executed. When there is no wireless communication function, the interface functions as the old generation interface using the conducting wire, similar to the related art.

First Example

Figure 16:
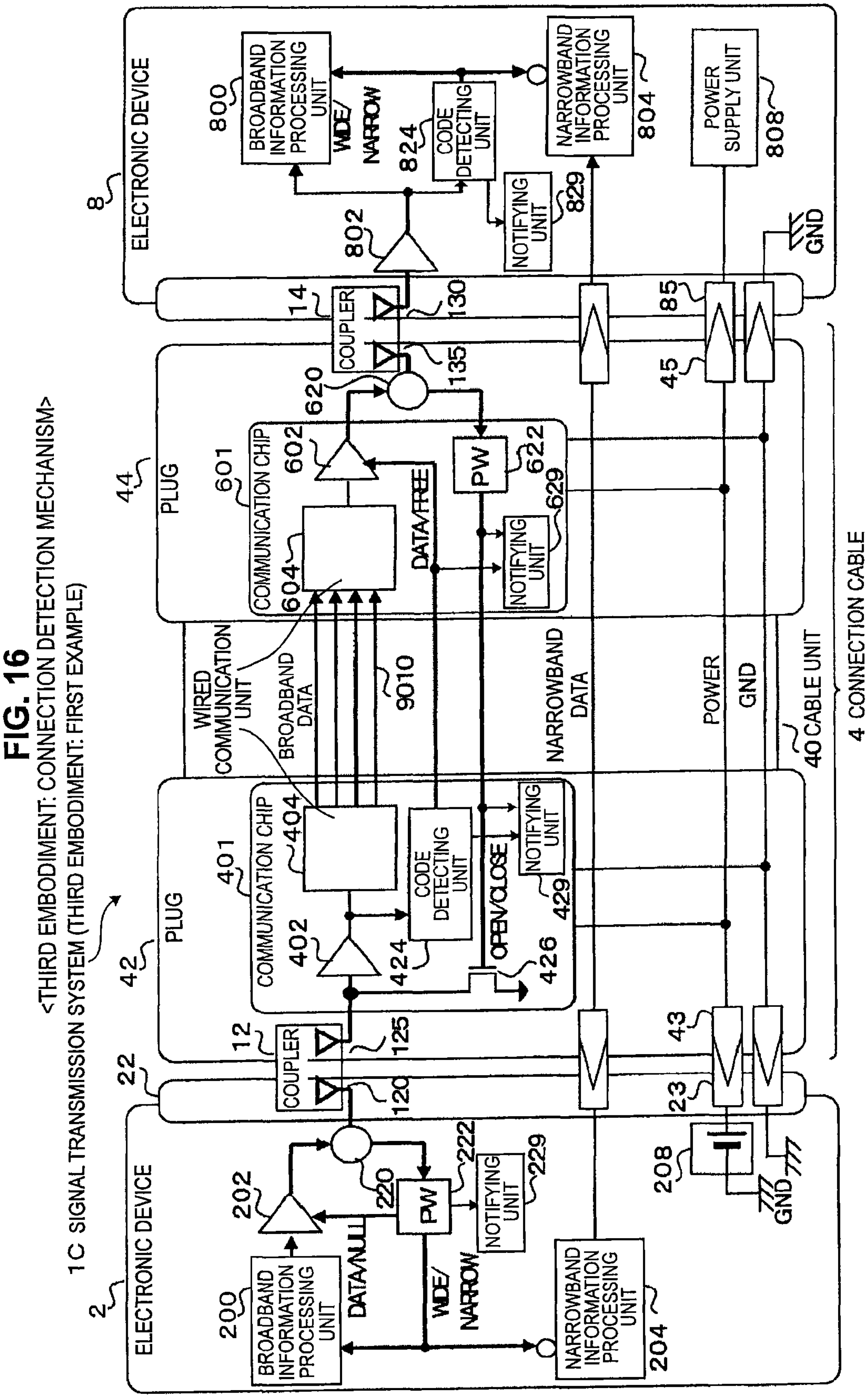
FIG. 16 is an illustration of an entire configuration of a signal transmission system according to a first example of a third embodiment.

FIG. 16 is an illustration of an entire configuration of a signal transmission system 1C according to a first example of the third embodiment. FIG. 16 illustrates a state in which a first electronic device 2 and a second electronic device 8 are connected by a connection cable 4. FIG. 16 illustrates a modification of the configuration of the first example of the first embodiment illustrated in FIG. 2. However, the same modification may be applied to the configuration of the second example of the first embodiment illustrated in FIG. 2A.

In the first example of the third embodiment, when unidirectional communication is performed, identification of correspondence/non-correspondence of wireless communication and control based on an identification result are performed. Hereinafter, focusing on a difference with the configuration of the first example of the first embodiment, explanation is given.

The case in which a new generation interface according to this embodiment to which the coupler (the electromagnetic field coupling unit 12 and the electromagnetic field coupling unit 14) is applied is used together with an old generation interface not provided with the coupler is considered. In this case, only when there is a wireless communication function in which the couplers are applied to all of the electronic device 2, the connection cable 4, and the electronic device 8, broadband data transmission through the coupler is executed. When there is no wireless communication function, the interface functions as the old generation interface using the conducting wire, similar to the related art. Hereinafter, focusing on a difference with the configuration of the first example of the first embodiment, explanation is given.

The electronic device further includes a direction managing unit 220, a power detecting unit 222 (PW), and a notifying unit 229. The notifying unit 229 notifies a determination result of the power detecting unit 222 to be an example of a determining unit, using display or sound (for example, a display or a speaker of the electronic device 2).

As the direction managing unit 220, a directional coupler or a circulator can be used. The direction managing unit 220 supplies a signal from the wireless communication unit 202 to (the coupler unit 120 of) the electromagnetic field coupling unit 12 and supplies a signal component (in the first example, reflected signal component) from (the coupler unit 120 of) the electromagnetic field coupling unit 12 to the power detecting unit 222.

The power detecting unit 222 detects a level of a reflection component in the electromagnetic field coupling unit 12 to be supplied through the direction managing unit 220, compares the detected level with a predetermined threshold value Th1, and determines whether the plug 42 of the connection cable 4 corresponds to the wireless communication. The power detecting unit 222 may have all configurations that can detect the level of the reflection component in the electromagnetic field coupling unit 12. For example, envelope detection or square detection can be applied.

The power detecting unit 222 controls operations of the broadband information processing unit 200, the wireless communication unit 202, and the narrowband information processing unit 204, on the basis of the determination result. For example, when it is determined that the plug 42 of the connection cable 4 corresponds to the wireless communication, the power detecting unit 222 stops the operation of the narrowband information processing unit 204 and operates the broadband information processing unit 200 and the wireless communication unit 202 (DATA and WIDE). When it is determined that the plug 42 of the connection cable 4 does not correspond to the wireless communication, the power detecting unit 222 operates the narrowband information processing unit 204, stops the operations of the broadband information processing unit 200 and the wireless communication unit 202, and suppresses wasteful power consumption (NULL and NARROW).

The direction managing unit 220 transmits a signal from the wireless communication unit 202 to only the electromagnetic field coupling unit 12 and does not transmit the signal to the power detecting unit 222. A component that is reflected by the electromagnetic field coupling unit 12 is transmitted to only the power detecting unit 222 and is not transmitted to the wireless communication unit 202. Thereby, an output of the wireless communication unit 202 is transmitted to the electromagnetic field coupling unit 12 without loss. A component that is reflected by the electromagnetic field coupling unit 12 is not disturbed with the signal from the wireless communication unit 202 and the power detecting unit 222 can correctly determine the reflection component.

After the power detecting unit 222 recognizes that the connection cable 4 does not correspond to the wireless communication, the communication cannot be switched into broadband communication, even though power more than a threshold value Th1 is not detected. This means that a function for preventing erroneous detection is insufficient. As an erroneous detection measure, the power detecting unit 222 may recognize that the connection cable 4 does not correspond to the wireless communication, when the power more than the threshold value Th1 is detected continuously for a predetermined time. Alternatively, the power detecting unit 222 may recognize that the connection cable 4 does not correspond to the wireless communication, when the detection is performed repetitively for every predetermined time and the number of times of detecting the radio non-correspondence reaches a predetermined number of times.

As an inserting/removing measure of the connection cable 4 (plug 42) with respect to the receptacle 22, a mechanism for resetting the power detecting unit 222 automatically or by an operator when coupling (fitting) is performed and operating the power detecting unit in a broadband communication mode may be provided.

When the narrowband communication is performed, the broadband information processing unit 200 and the wireless communication unit 202 may be operated continuously and the broadband information processing unit 200 may supply a specific code not to be meaningful data to the wireless communication unit 202 and the wireless communication unit 202 may transmit an electric wave modulated by the specific code not to be the meaningful data, which is not an essential configuration. In this way, when the connection cable 4 does not correspond to the wireless communication, the reflection component continuously returns to the power detecting unit 222. For this reason, the power detecting unit 222 can recognize continuously or repetitively that the connection cable 4 does not correspond to the wireless communication and the error detection measure becomes further secured. In addition, it is possible to cope with inserting or removing of the connection cable 4 (plug 42) with respect to the receptacle 22.

The communication chip 401 of the plug 42 further includes a code detecting unit 424, a matching control unit 426, and a notifying unit 429. The code detecting unit 424 can be replaced by a power detecting unit equal to the power detecting unit 222.

The code detecting unit 424 determines whether information demodulated by the wireless communication unit 402 is a regular code and notifies the wireless communication unit 602 of the communication chip 601 of the plug 44 of a determination result. The wireless communication unit 602 controls an operation mode of the wireless communication unit 602, on the basis of the determination result from the code detecting unit 424. For example, when the determination result shows that the information is not the regular code (FREE), a free running oscillation mode is set and when the determination result shows that the information is the regular code (DATA), an electric wave modulated with the broadband data is transmitted.

The matching control unit 426 controls an input terminating end of the wireless communication unit 402, in detail, controls impedance matching between the coupler unit 120 and the coupler unit 125, on the basis of a control signal (OPEN/CLOSE) supplied from the communication chip 601 of the plug 44. It is considered that the matching control unit 426 is configured as a short-circuit unit to turn on/off connection between an input terminal of the wireless communication unit 402 and a reference potential (for example, a ground or a power supply potential). When the short-circuit unit is opened, impedance matching is taken between the coupler unit 120 and the coupler unit 125. However, if the short-circuit unit is closed, an impedance change (mismatching) is caused and an electric wave from the side of the electronic device 2 is reflected by the coupler unit 120.

As the short-circuit unit, an NMOS (Nch-type MOS transistor) is used. In the NMOS, a drain is connected to an input terminal of the wireless communication unit 402, a source is connected to a ground, and a control signal from the communication chip 601 is input to a gate. When the control signal is "CLOSE", the matching control unit 426 is closed by turning on the NMOS and when the control signal is "OPEN", the matching control unit 426 is opened by turning off the NMOS.

When the code detecting unit 424 cannot detect the regular code, the operation of the wireless communication unit 602 may be stopped to decrease power consumption. In addition, the operations of the wireless communication unit 402, the wired communication unit 404, and the wired communication unit 604 may be stopped to further decrease the power consumption. In this case, the control of the matching control unit 426 may be performed on the basis of the detection result of the code detecting unit 424, not the control signal from the power detecting unit 622.

The communication chip 601 of the plug 44 further includes a direction managing unit 620, a power detecting unit 622, and a notifying unit 629. The notifying unit 429 or the notifying unit 629 notifies the determination result of the code detecting unit 424 or the power detecting unit 622 to be an example of the determining unit, using display or sound (for example, an LED or a buzzer is provided in the plug 42 or the plug 44).

As the direction managing unit 620, a directional coupler or a circular can be used. The direction managing unit 620 supplies a signal from the wireless communication unit 602 to (the coupler unit 135 of) the electromagnetic field coupling unit 14 and supplies a signal component reflected by (the coupler unit 135 of) the electromagnetic field coupling unit 14 to the power detecting unit 622.

The power detecting unit 622 detects a level of a reflection component in the electromagnetic field coupling unit 14 to be supplied through the direction managing unit 620, compares the level with a predetermined threshold value Th2, and determines whether the receptacle 84 of the electronic device 8 corresponds to the wireless communication. The power detecting unit 622 may have all configurations that can detect the level of the reflection component in the electromagnetic field coupling unit 14. For example, envelope detection or square detection can be applied.

The power detecting unit 622 switches a control signal (OPEN/CLOSE) to control an operation of the matching control unit 426 of the communication chip 401 of the side of the plug 42, on the basis of the determination result. For example, when it is determined that the receptacle 84 of the electronic device 8 corresponds to the wireless communication, the power detecting unit 622 sets the control signal to "OPEN" to open the matching control unit 426. When it is determined that the receptacle 84 of the electronic device 8 does not correspond to the wireless communication, the power detecting unit 622 sets the control signal to "CLOSE" to close the matching control unit 426.

The direction managing unit 620 transmits a signal from the wireless communication unit 602 to only the electromagnetic field coupling unit 14 and does not transmit the signal to the power detecting unit 622. A component that is reflected by the electromagnetic field coupling unit 14 is transmitted to only the power detecting unit 622 and is not transmitted to the wireless communication unit 602. Thereby, an output of the wireless communication unit 602 is transmitted from the electromagnetic field coupling unit 14 without loss. A component that is reflected by the electromagnetic field coupling unit 14 is not disturbed with the signal from the wireless communication unit 602 and the power detecting unit 622 can correctly determine the reflection component.

The electronic device 8 further includes a code detecting unit 824 and a notifying unit 829. The notifying unit 829 notifies a determination result of the code detecting unit 824 to be an example of a determining unit, using display or sound (for example, a display or a speaker of the electronic device 8).

The code detecting unit 824 can be replaced by a power detecting unit equal to the power detecting unit 222. The code detecting unit 824 determines whether information demodulated by the wireless communication unit 802 is a regular code and controls operations of the broadband information processing unit 800 and the narrowband information processing unit 804, on the basis of the determination result. For example, when it is determined that the information is the regular code, the power detecting unit 822 stops the operation of the narrowband information processing unit 204 and operates the broadband information processing unit 800 (WIDE). When it is determined that the information is not the regular code, the power detecting unit 822 stops the operation of the broadband information processing unit 800 and operates the narrowband information processing unit 204 (NARROW).

After the code detecting unit 824 recognizes that the connection cable 4 does not correspond to the wireless communication, when it can be determined that the information is the regular code, the code detecting unit 824 can switch the communication into the broadband communication. This means that a function for preventing erroneous detection is sufficient. Different from the side of the electronic device 2, a particular error detection measure is not necessary. Even though the particular measure is not taken, it is possible to cope with inserting or removing of the connection cable 4 (plug 44) with respect to the receptacle 84.

Next, identification of correspondence/non-correspondence of the wireless communication and control will be described.

Case 1: Electronic Device 2=Radio Correspondence and Connection Cable 4=Radio Non-Correspondence First, the power detecting unit 222 is reset, the broadband information processing unit 200 and the wireless communication unit 202 are operated, and a high-frequency signal (electric wave) from the wireless communication unit 202 is transmitted to the electromagnetic field coupling unit 12. The coupler unit 120 is not provided in the plug 42 of the connection cable 4 of the radio non-correspondence and the high-frequency signal that is output from the wireless communication unit 202 is reflected by the coupler unit 120 of the receptacle 22 and returns to the power detecting unit 222. When power more than a threshold value Th1 is detected, the power detecting unit 222 recognizes that the connection cable 4 does not correspond to the wireless communication, stops the broadband information processing unit 200 and the wireless communication unit 202, operates the narrowband information processing unit 204, and performs a control operation such that the narrowband communication is performed. In this case, even when the electronic device 8 corresponds to the wireless communication, the code detecting unit 824 performs a control operation such that the narrowband information is performed, similar to # Case 2. Thereby, transmission between the electronic device 2 and the electronic device 8 becomes narrowband transmission and is performed through the contact electrode and the conducting wire.

Case 2: Electronic Device 8=Radio Correspondence and Connection Cable 4=Radio Non-Correspondence The wireless communication unit 802 of the electronic device 8 becomes a non-input and the code detecting unit 824 does not detect the regular code. At this time, the code detecting unit 824 recognizes that the connection cable 4 does not correspond to the wireless communication, stops the broadband information processing unit 800, operates the narrowband information processing unit 804, and performs a control operation such that the narrowband communication is performed. In this case, even when the electronic device 2 corresponds to the wireless communication, the power detecting unit 222 performs a control operation such that the narrowband communication is performed, similar to # Case 1. Thereby, transmission between the electronic device 2 and the electronic device 8 becomes narrowband transmission and is performed through the contact electrode and the conducting wire.

Case 3: Connection Cable 4=Radio Correspondence and Electronic Device 2 and Electronic Device 8=Radio Non-Correspondence The wireless communication unit 402 of the side of the plug 42 of the connection cable 4 becomes a non-input and the code detecting unit 424 does not detect the regular code. A detection output of the code detecting unit 424 is transmitted to the communication chip 601 of the side of the plug 44 and the wireless communication unit 602 is operated in a free running oscillation mode. An electric wave thereof is transmitted to the coupler unit 135. However, because the electronic device 8 does not correspond to the wireless communication and does not have the coupler unit 130, the signal is reflected by the coupler unit 135. For this reason, a reflection component more than a threshold value Th2 is detected by the power detecting unit 622. The power detecting unit 622 that has detected the reflection component more than the threshold value Th2 closes the matching control unit 426 of the side of the plug 42. The narrowband transmission between the electronic device 2 and the electronic device 8 is performed through the contact electrode and the conducting wire.

Case 4: Electronic Device 2 and Connection Cable 4=Radio Correspondence and Electronic Device 8=Radio Non-Correspondence Similar to # Case 3, the power detecting unit 622 of the plug 44 of the connection cable 4 can detect a reflection component more than a threshold value Th2 and closes the matching control unit 426 of the side of the plug 42. If the matching control unit 426 is closed, mismatching is generated in the electromagnetic field coupling unit 12, an input terminating end of the wireless communication unit 402 disappears, and an electric wave that is transmitted by the wireless communication unit 202 is reflected by the coupler unit 120. Similar to # Case 1, the power detecting unit 222 can detect a reflection component more than the threshold value Th1, stops the broadband information processing unit 200 and the wireless communication unit 202, operates the narrowband information processing unit 204, and performs a control operation such that the narrowband communication is performed. The narrowband transmission between the electronic device 2 and the electronic device 8 is performed through the contact electrode and the conducting wire.

Case 5: Electronic Device 8 and Connection Cable 4=Radio Correspondence and Electronic Device 2=Radio Non-Correspondence The wireless communication unit 402 of the plug 42 of the connection cable 4 becomes a non-input and the code detecting unit 424 does not detect a regular code. Similar to # Case 3, a detection result of the code detecting unit 424 is transmitted to the side of the plug 44 and the wireless communication unit 602 is operated in a free running oscillation mode. Because an electric wave transmitted from the wireless communication unit 602 is not modulated with the regular code, similar to # Case 2, the code detecting unit 824 of the side of the electronic device 8 stops the broadband information processing unit 800, operates the narrowband information processing unit 804, and performs a control operation such that the narrowband communication is performed. The narrowband transmission between the electronic device 2 and the electronic device 8 is performed through the contact electrode and the conducting wire.

Case 6: Electronic Device 2, Electronic Device 8, and Connection Cable 4=Radio Correspondence The power detecting unit 222 controls each unit such that an electric wave modulated with the data from the broadband information processing unit 200 is output in a broadband data mode and an electric wave modulated with a specific code not to be meaningful data is transmitted in a narrowband mode.

An electric wave of any mode that is output from the wireless communication unit 202 is input to the wireless communication unit 402 of the plug 42 through the electromagnetic field coupling unit 12. Because impedance matching is taken in the electromagnetic field coupling unit 12 and an input of the wireless communication unit 402 is appropriately terminated, the power detecting unit 222 does not detect a reflection component more than a threshold value Th1. As a result, even if the mode is originally the narrowband data mode, the power detecting unit 222 controls each unit in the broadband mode. For this reason, an electric wave that is modulated with the broadband data is output from the wireless communication unit 202. The connection cable 4 transmits the broadband data retrieved by the wireless communication unit 402 by a conducting wire, using the wired communication unit 404 and the wired communication unit 604.

At this time, in the case of the broadband mode, because the code detecting unit 424 detects a regular code corresponding to the broadband mode, the wireless communication unit 602 transmits an electric wave modulated with the broadband data. The electric wave is input to the wireless communication unit 802 of the electronic device 8 through the electromagnetic field coupling unit 14. Because impedance matching is taken in the electromagnetic field coupling unit 14 and an input of the wireless communication unit 802 is appropriately terminated, the power detecting unit 622 does not detect a reflection component more than a threshold value Th2. As a result, the matching control unit 426 is maintained in an opened state, an input terminating end of the wireless communication unit 402 functions, and the coupler unit 120 does not reflect an electric wave from the wireless communication unit 202. Because the code detecting unit 824 of the electronic device 8 receives the electric wave from the connection cable 4 and detects the regular code corresponding to the broadband mode, each unit is controlled in the broadband mode. The broadband information processing unit 800 receives an electric wave from the connection cable 4 and reproduces broadband data.

Meanwhile, in the case of the narrowband mode, an electric wave that is modulated with a specific code not to be meaningful data is transmitted from the wireless communication unit 202 to the wireless communication unit 402. Because the code detecting unit 424 detects the specific code corresponding to the narrowband mode, the wireless communication unit 602 is operated in a free running oscillation mode. Because an electric wave transmitted from the wireless communication unit 602 is not modulated with a regular code, similar to # Case 2 or # Case 5, the code detecting unit 824 of the side of the electronic device 8 stops the broadband information processing unit 800, operates the narrowband information processing unit 804, and performs a control operation such that the narrowband communication is performed. Thereby, even when there is a wireless communication function in which the couplers are applied to all of the electronic device 2, the connection cable 4, and the electronic device 8, the interface can function as the old generation interface using the conducting wire, similar to the related art.

To operate the functional unit relating to the wireless communication when the narrowband communication is performed (including the case of the narrowband mode when all of the elements correspond to the wireless communication) wastes power. As a measure to resolve the problem described above, a method of applying a modification to control the matching control unit 426, the wired communication unit 404, and the wired communication unit 406 according to the detection result of the code detecting unit 424 is considered. If the code detecting unit 424 detects a specific code corresponding to the narrowband mode, operations of the wired communication unit 404 and the wired communication unit 406 are stopped and the matching control unit 426 is closed. Also, an operation of the wireless communication unit 602 may be stopped.

Thereby, similar to # Case 4, the power detecting unit 222 of the side of the electronic device 2 can detect a reflection component more than the threshold value Th1, stops the broadband information processing unit 200 and the wireless communication unit 202, operates the narrowband information processing unit 204, and performs a control operation such that the narrowband communication is performed. When the mode of the wireless communication unit 602 is the free running oscillation mode or the operation of the wireless communication unit is stopped, the regular code cannot be detected. For this reason, the electronic device 8 stops the broadband information processing unit 800, operates the narrowband information processing unit 804, and performs a control operation such that the narrowband communication is performed. Thereby, the interface can be made to function as the old generation interface using the conducting wire, while the operation of the functional unit relating to the radio transmission is minimized. A plurality of interface standards can be easily applied to an apparatus.

Advantages that are obtained in the case in which the electronic device 2, the cable 4, and the electronic device 8 corresponding to the wireless communication perform the broadband communication as described above, as compared with the case in which the electronic device 2 stops the electric wave output from the transmission circuit 202 and takes a configuration similar to the configuration of the case 5, are as follows. If the code detector 424 is configured to detect three states of 1) detection of a data code, 2) detection of a NULL code, and 3) code non-detection, the narrowband communication state is distinguished as the case 5 in which the broadband communication is disabled in a hardware manner, when the state is 3), and the narrowband communication state is distinguished as the case 6 in which the narrowband communication state is selected by hardware enabling the broadband communication, when the state is 2). It is preferable that a circuit operation frequency when the reception circuit 402 or the code detecting unit 424 is intermittently operated to decrease consumption power be set low in the case of the former in which the broadband communication does not start as long as hardware is not exchanged and be set high in the case of the latter in which the broadband communication can start at all times.

Second Example

Figure 16A:
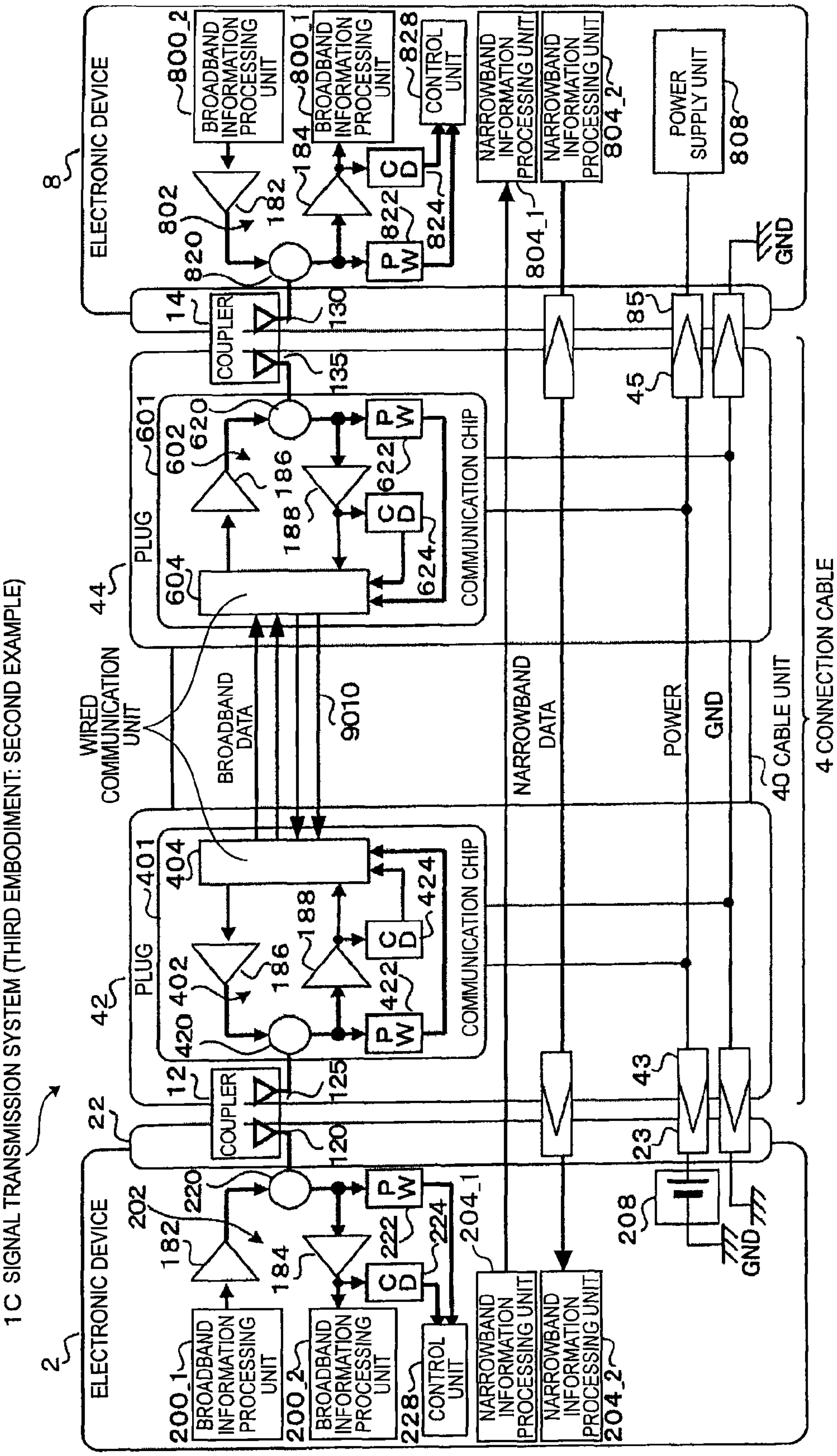
FIG. 16A is an illustration of an entire configuration of a signal transmission system according to a second example of the third embodiment.

FIG. 16A is an illustration of an entire configuration of a signal transmission system 1C according to a second example of the third embodiment. FIG. 16A illustrates a state in which a first electronic device 2 and a second electronic device 8 are connected by a connection cable 4. FIG. 16A illustrates a modification of the configuration of the first example of the second embodiment illustrated in FIG. 15. However, the same modification may be applied to the configuration of the second example of the second embodiment illustrated in FIG. 15A.

In the second example of the third embodiment, when bidirectional communication is performed, identification of correspondence/non-correspondence of wireless communication and control based on an identification result are performed. In order to provide a radio correspondence identification control mechanism in the case of the bidirectional communication, it is first considered that the configuration of the first example is provided separately in each direction. In this case, however, circuit scales increase. In addition, the distinction of a transmission object RF signal and a reflection component by the power detecting unit causes a problem. Because this configuration is the configuration corresponding to the bidirectional communication, the power detecting unit detects a level of an RF signal of a normal direction as well as a level of a reflection component when a connection counterpart does not correspond to the wireless communication. In this case, processing may be executed on the assumption that the level of the reflection component when the connection counterpart does not correspond to the wireless communication is lower than the level of the RF signal of the normal direction. However, in this determination method, a determination may become unreliable according to a reflection situation.

Therefore, in the second example, in addition to the configuration in which the unidirectional communication of the first example is changed to the bidirectional communication, a mechanism for determining whether RF (high frequency) signals received by the reception circuits 184 and 188 are reflection components of RF signals output by the transmission circuits 182 and 186 of each wireless communication unit or RF signals transmitted from the counterpart is provided in each wireless communication unit corresponding to the bidirectional communication to suppress the circuit scales from increasing. In order to distinguish the RF signals, codes (for example, NULL codes) that have different patterns and can be identified are used in a radio signal output by the electronic device 2 or the electronic device 8 and a radio signal output by the connection cable 4.

Hereinafter, focusing on a difference with the first example of the third embodiment, explanation is given on the assumption that the electronic device 2, the connection cable 4, and the electronic device 8 have the configuration corresponding to the bidirectional communication, like the first example of the second embodiment.

The electronic device 2 further includes a code detecting unit 224 (CD) and a control unit 228. The code detecting unit 224 detects a predetermined code from information demodulated by the reception circuit 184. In this case, the predetermined code is a "NULL code". The power detecting unit 222 detects a level of a reflection wave component of the transmission circuit 182 or an RF signal from the side of the wireless communication unit 402. The control unit 228 performs a control operation such that the broadband transmission or the narrowband transmission is performed, on the basis of a detection result of the power detecting unit 222 or a detection result of the code detecting unit 224.

The communication chip 401 of the plug 42 of the connection cable 4 further includes a direction managing unit 420 and a power detecting unit 422. In addition, the communication chip 401 does not include a matching control unit 426, different from the first example. The power detecting unit 422 detects a level of a reflection wave component of the transmission circuit 186 or an RF signal from the side of the wireless communication unit 202. The code detecting unit 424 detects a predetermined code from information demodulated by the reception circuit 188. In this case, the predetermined code is a "NULL code". When the code detecting unit 424 detects the "NULL code" of the connection cable 4, the code detecting unit 424 identifies that a connection counterpart (in this case, the electronic device 2) does not correspond to the wireless communication and outputs information showing that the connection counterpart does not correspond to the wireless communication.

In this case, the power detecting unit 422 is used because it is determined that the electronic device 2 does not correspond to the wireless communication, on the basis of the weak power measured by the power detecting unit 422, even when signal power with respect to the reception circuit 188 is weak, an SN ratio is bad, and a code is erroneously detected. This situation is generated in the case in which the electronic device 2 is originally a device corresponding to the wireless communication and the coupler 120 and the reception circuit 184 passively form a terminating end, but the transmission circuit 182 is stopped and the radio correspondence is stopped for some reason. In this situation, a part of an output of the transmission circuit 186 in the plug 42 may leak into the reception circuit 188 due to incompleteness of the coupler 12 or the directional coupler 420. If parts of codes of the electronic device 2 and the plug 42 are similar to each other, erroneous code recognition due to noise may be generated in the code detector 424.

A detection result of the power detecting unit 422 and a detection/identification result of the code detecting unit 424 are supplied to the wired communication unit 404 corresponding to the bidirectional communication. When the code detecting unit 424 detects a NULL code of the connection cable 4 (that is, when the code detecting unit identifies that a connection counterpart does not correspond to the wireless communication), the wired communication unit 404 transmits information showing that the NULL code is detected by wire and stops a transmission operation of the transmission circuit 182 of the side of the plug 44. In addition, in order to prevent an operation failure due to erroneous detection of the code detecting unit 424, the wired communication unit 404 may stop the transmission operation of the transmission circuit 182, only when the power detecting unit 422 transmits information showing that the reflection component is detected and the code detecting unit 424 detects a NULL code of the connection cable 4.

The communication chip 601 of the plug 44 of the connection cable 4 further includes a code detecting unit 624. The power detecting unit 622 performs the same function as that of the power detecting unit 422 and the code detecting unit 624 performs the same function as that of the code detecting unit 424.

The electronic device 8 further includes a direction managing unit 820, a power detecting unit 822, and a control unit 828. The power detecting unit 822 performs the same function as that of the power detecting unit 222, the code detecting unit 824 performs the same function as that of the code detecting unit 224, and the control unit 828 performs the same function as that of the control unit 228.

The notifying unit is not illustrated in the drawings. However, in each of the electronic device 2, the plug 42, the plug 44, and the electronic device 8, a determination result of the power detecting unit or the code detecting unit may be notified by the notifying unit.

Next, identification of correspondence/non-correspondence of wireless communication and control will be described.

Case 1: One Electronic Device and Connection Cable=Radio Correspondence and Other Electronic Device=Radio Non-Correspondence For example, it is assumed that the electronic device 2 corresponds to the wireless communication and the electronic device 8 does not correspond to the wireless communication. In this case, because the electromagnetic field coupling unit 14 to terminate an RF signal or the wireless communication unit 802 are not provided at the side of the electronic device 8, when the transmission circuit 182 of the communication chip 601 transmits the RF signal, a reflection wave thereof is input to the reception circuit 184 of the communication chip 601. Because the code detecting unit 624 investigates a code from the reception signal and the NULL code of the connection cable 4 is detected, the code detecting unit 624 identifies that the connection counterpart (in this case, the electronic device 8) does not correspond to the wireless communication. The wired communication unit 604 notifies the wired communication unit 404 of the identification result. The wired communication unit 404 that has received the notification stops a transmission operation of the transmission circuit 186 of the wireless communication unit 402.

Because the plug 42 has the electromagnetic field coupling unit 12 (the coupler unit 125) and the wireless communication unit 402 and terminates the RF signal, the reception circuit 184 of the electronic device 2 does not acquire the reflection wave of the RF signal, when the transmission circuit 182 of the wireless communication unit 202 transmits the RF signal. However, because the transmission operation of the transmission circuit 186 of the wireless communication unit 402 is stopped, the wireless communication unit 202 cannot receive the RF signal from the wireless communication unit 402. Therefore, the power detecting unit 222 does not detect the RF signal. The control unit 228 determines that the broadband transmission using the wireless communication cannot be performed, on the basis of the detection result of the power detecting unit 222, and performs a control operation such that the narrowband transmission is performed. The narrowband transmission between the electronic device 2 and the electronic device 8 is performed through a contact electrode and a conducting wire.

Case 2: At Least One Electronic Device=Radio Correspondence and Connection Cable 4=Radio Non-Correspondence The electronic device corresponding to the wireless communication in the electronic device 2 and the electronic device 8 receives a reflection wave, because a connection counterpart (the plug 42 or the plug 44) does not have the coupler (the coupler unit 125 and the coupler unit 135), the wireless communication unit 402, and the wireless communication unit 602. By investigating the code by the code detecting unit 224 or the code detecting unit 824, its NULL code is detected. The control unit 228 determines that the broadband transmission using the wireless communication cannot be performed, on the basis of the detection results of the code detecting unit 224 and the code detecting unit 824, and performs a control operation such that the narrowband transmission is performed. The narrowband transmission between the electronic device 2 and the electronic device 8 is performed through a contact electrode and a conducting wire.

Case 3: Connection Cable 4=Radio Correspondence and Electronic Device 2 and Electronic Device 8=Radio Non-Correspondence Because the electronic device 2 and the electronic device 8 can perform only the narrowband transmission, the narrowband transmission between the electronic device 2 and the electronic device 8 is performed through a contact electrode and a conducting wire. At this time, as estimated from # Case 1, the code detecting unit 424 investigates a code from the reception signal with respect to the reflection component, detects a NULL code of the connection cable 4, and stops a transmission operation of the transmission circuit 182 of the wireless communication unit 602, on the basis of the detection result. Likewise, the code detecting unit 624 investigates a code from the reception signal with respect to the reflection component, detects a NULL code of the connection cable 4, and stops a transmission operation of the transmission circuit 186 of the wireless communication unit 402, on the basis of the detection result.

Case 4: Electronic device 2, Electronic Device 8, and Connection Cable 4=Radio Correspondence Because all of RF signals are terminated by the couplers (the electromagnetic field coupling unit 12 and the electromagnetic field coupling unit 14) and the reception circuit 184 and the reception circuit 188 facing each other, the RF signals are not reflected. All signals that are input to the reception circuit 184 and the reception circuit 188 are RF signals from the transmission circuit 182 and the transmission circuit 186 facing each other. This is confirmed by detecting a NULL code of the connection cable 4 by the code detecting unit 224 and the code detecting unit 824, detecting a NULL code of the electronic device 2 by the code detecting unit 424, and detecting a NULL code of the electronic device 8 by the code detecting unit 624. If the signals are confirmed, (the control unit 228 of) the electronic device 2 and (the control unit 828 of) the electronic device 8 operate the broadband transmission circuit and the connection cable 4 performs the broadband data transmission between the plug 42 and the plug 44.

The determination processing that has been described in the first example and the second example of the third embodiment only determines whether the other connector unit has the radio coupling units and forms the electromagnetic field coupling unit. However, the determination processing may further determine whether the specifications of the radio signals are common between the corresponding connector unit and the other connector unit. In this case, when the other connector unit has the radio coupling units and the specifications of the radio signals are common between the corresponding connector unit and the other connector unit, the determination processing determines that the radio signal can be transmitted. When the other connector unit does not have the radio coupling units and the specifications of the radio signals are not common between the corresponding connector unit and the other connector unit, the determination processing determines that the radio signal cannot be transmitted through the radio coupling units. For example, a method of inserting a predetermined code into a transmission object signal and performing the determination using the code by each code detecting unit is considered to determine the specifications of the radio signals. When modulation methods become different, a method of determining whether the predetermined code can be appropriately acquired is also considered.

Fourth Embodiment

Figure 17:
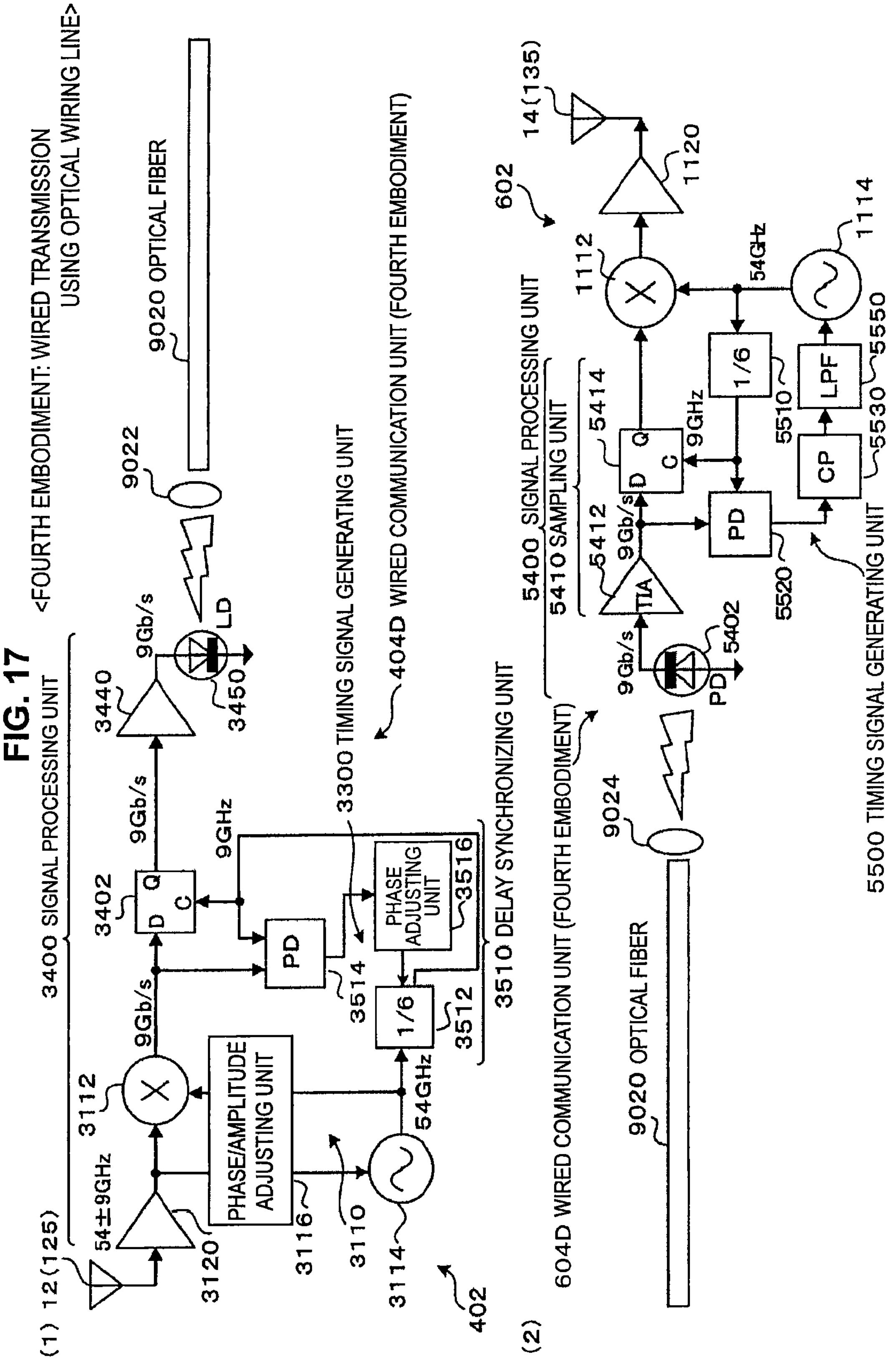
FIG. 17 is an illustration of a signal transmission system according to a fourth embodiment.

FIG. 17 is an illustration of a signal transmission system 1D according to a fourth embodiment. In this case, FIG. 17(1) corresponds to FIG. 11 illustrating the first embodiment and FIG. 17(2) corresponds to FIG. 12 illustrating the first embodiment.

In the fourth embodiment, a structure according to this embodiment for transmitting the broadband signal by wireless by the connector unit is applied. In particular, the fourth embodiment is different from the first embodiment in that wired transmission for a broadband signal in the connection cable 4 is performed by an optical wiring line (an optical cable and an optical fiber). That is, optical transmission is used in the broadband data transmission in the connection cable 4. Because the broadband signal is transmitted by the optical transmission, instead of the conducting wire transmission, the corresponding apparatus can be electrically isolated from the connected counterpart apparatus (an isolation can be taken). In addition, because the signal transmission system may not correspond to broadband data transmission through a multi-channel, a signal processing circuit for the wired transmission can be simplified in some cases.

In this case, a modification of the first embodiment in which the unidirectional communication is performed will be described. Although an entire configuration is not illustrated in the drawings, the wired communication unit 404 and the wired communication unit 604 in FIGS. 2 and 2A may be connected by an optical wiring line. Although not illustrated in the drawings, in the second embodiment in which the bidirectional communication is performed, the fourth embodiment may be applied and the wired transmission for the broadband signal in the connection cable 4 may performed using the optical wiring line (optical cable).

FIG. 17(1) illustrates an example of a detailed configuration of a functional unit that transmits broadband information demodulated by the wireless communication unit 402 by wire by the wired communication unit 404, in a form of an optical signal. The wireless communication unit 402 has the same configuration as that of the radio reception circuit 3100 to which the injection synchronization method is applied (refer to FIG. 9(2)). In this case, explanation of the configuration of the wireless communication unit 402 is omitted.

A wired communication unit 404D according to the fourth embodiment includes a signal processing unit 3400 and a timing signal generating unit 3500. The signal processing unit 3400 is an example of an electrical/optical converting unit that converts an electrical signal obtained by demodulating a received radio signal into an optical signal. The signal processing unit 3400 has an identification circuit 3402, a current driving unit 3440 (LD driver), and a laser diode 3450 (LD).

The timing signal generating unit 3500 generates a timing signal that is used by the wired communication unit 404D. The timing signal generating unit 3500 may be any one of timing signal generating units generating various timing signals and can adopt various circuit configurations. However, the timing signal generating unit 3500 is preferably configured using a PLL or a DLL. Hereinafter, the case in which the timing signal generating unit 3500 is configured using the DLL will be described.

The timing signal generating unit 3500 includes a delay synchronizing unit 3510 (DLL). The delay synchronizing unit 3510 is configured to use a reception-side local oscillating unit 3114 of a wireless communication unit 402 (radio reception circuit 3100) as an oscillation circuit and has a dividing unit 3512, a phase comparing unit 3514 (PD), and a phase adjusting unit 3516. A configuration and an operation of the delay synchronizing unit 3510 are the same as those of the delay synchronizing unit 3310 according to the first embodiment.

Similar to the identification circuit 3202 of the signal processing unit 3200 according to the first embodiment, the identification circuit 3402 retrieves a broadband signal demodulated by the wireless communication unit 402 in synchronization with a retiming clock. The identification circuit 3402 also functions as a binarizing unit 3122.

A 9 Gb/s output that is sampled by the identification circuit 3402 is supplied to the current driving unit 3440. The current driving unit 3440 drives the laser diode 3450 on the basis of the 9b/s output and converts an electrical signal (broadband data) into an optical signal.

As the cable unit 40, instead of the conducting wire 9010 according to the first embodiment, an optical fiber 9020 (example of an optical cable) is used. An optical coupling unit 9022 (optical coupler) is provided at the side of the plug 42 of the optical fiber 9020. An optical signal that is emitted from the laser diode 3450 is retrieved by the optical fiber 9020 through the optical coupling unit 90222 and is transmitted through the optical fiber 9020.

FIG. 17(2) illustrates an example of a detailed configuration of a functional unit that transmits broadband information received by the wired communication unit 604 by wireless by the wireless communication unit 602. The wireless communication unit 602 has the same configuration as that of the radio transmission circuit 1100 (refer to FIG. 9). In this case, explanation of the configuration of the wireless communication unit 602 is omitted.

A wired communication unit 604D according to the fourth embodiment has a configuration similar to that of a light reading circuit such as a CDR (Compact Disc Recordable) and includes a signal processing unit 5400 and a timing signal generating unit 5500. The signal processing unit 5400 is an example of an optical/electrical converting unit that converts an optical signal transmitted through the optical cable into an electrical signal. The signal processing unit 5400 includes a light detecting unit 5402 and a sampling unit 5410 that samples an NRZ signal of 9 Gb/s. In the light detecting unit 5402, a photo diode (PD) is used. At the side of the plug 44 of the optical fiber 9020, an optical coupling unit 9024 (Optical Coupler) is provided.

The sampling unit 5410 has a current/voltage conversion circuit 5412 (TIA) having an amplifying function and an identification circuit 5414. The current/voltage conversion circuit 5412 shapes a frequency of the NRZ signal of 9 Gb/s that has been transmitted through the optical fiber 9020 in the cable unit 40. The identification circuit 5414 has a function of the binarizing unit 3122. The identification circuit 5414 retrieves a signal output from the current/voltage conversion circuit 5412 at a retiming clock (a frequency is 9 GHz), quantizes the signal in a binary value, and supplies the signal to the frequency mixing unit 1112 of the wireless communication unit 602.

The timing signal generating unit 5500 generates a timing signal that is used by the wired communication unit 604D. The timing signal generating unit 5500 may be any one of timing signal generating units generating various timing signals and can adopt various circuit configurations. However, the timing signal generating unit 5500 is preferably configured using a PLL or a DLL. Hereinafter, the case in which the timing signal generating unit 5500 is configured using the PLL, similar to the timing signal generating unit 5300 according to the first embodiment, will be described. For example, a configuration of a CDR-PLL circuit can be applied.

The timing signal generating unit 5500 is configured to use a transmission-side local oscillating unit 1114 of the wireless communication unit 602 (radio transmission circuit 1100) as an oscillation circuit and includes a dividing unit 5510, a phase comparing unit 5520 (PD), a charge pump unit 5530 (CP), and a loop filter unit 5550. The dividing unit 5510 divides a frequency of an output oscillation signal Vout by 6 and supplies the signal to the identification circuit 5414 and the phase comparing unit 5520.

A transmission carrier signal of 54 GHz that is output from the transmission-side local oscillating unit 1114 of the modulation functional unit 1110 is divided by 6 by the dividing unit 5510 and becomes a 9 GHz retiming clock with respect to the identification circuit 5414. Further, the 9 GHz retiming clock is supplied as a 9 GHz comparison clock to the phase comparing unit 5520.

The timing signal generating unit 5500 forms a PLL circuit together with the phase comparing unit 5520, the charge pump unit 5530, and the loop filter unit 5550, such that frequencies and phases of the 9 GHz comparison clock and the reception signal received by the signal processing unit 5400 are synchronized with each other. An operation of the timing signal generating unit 5500 is basically equal to the operation of the timing signal generating unit 5300.

An entire operation of the wired communication unit 604D is as follows. The optical signal (NRZ signal of 9 Gb/s) that has been transmitted through the optical fiber 9020 is incident on the light detecting unit 5402 through the optical coupling unit 9024. The light detecting unit 5402 converts an optical signal into an electrical signal and supplies the electrical signal to the current/voltage conversion circuit 5412. The current/voltage conversion circuit 5412 amplifies the electrical signal, shapes a frequency of the electrical signal, and supplies the electrical signal to the identification circuit 5414. The identification circuit 5414 samples an output of the current/voltage conversion circuit 5412 at the 9 GHz retiming clock extracted by the timing signal generating unit 5500, acquires the NRZ signal of 9 Gb/s, and supplies the NRZ signal of 9 Gb/s to the wireless communication unit 602. The NRZ signal of 9 Gb/s is input as a modulation signal to the frequency mixing unit 1112. The wireless communication unit 602 modulates a 54 GHz transmission carrier signal from the transmission-side local oscillating unit 1114 with the NRZ signal of 9 Gb/s and generates an RF signal. The modulated RF signal is transmitted through a transmission amplifying unit 1120 and an electromagnetic field coupling unit 14 (coupler unit 130).

In the fourth embodiment, because the wired transmission in the cable unit 40 is realized by the optical transmission, the broadband transmission is implemented, and the multichannel processing is not executed, the apparatuses can be isolated from each other and the signal processing circuit for the wired transmission can be simplified, as compared with the conducting wire transmission.

Fifth Embodiment

Figure 18:
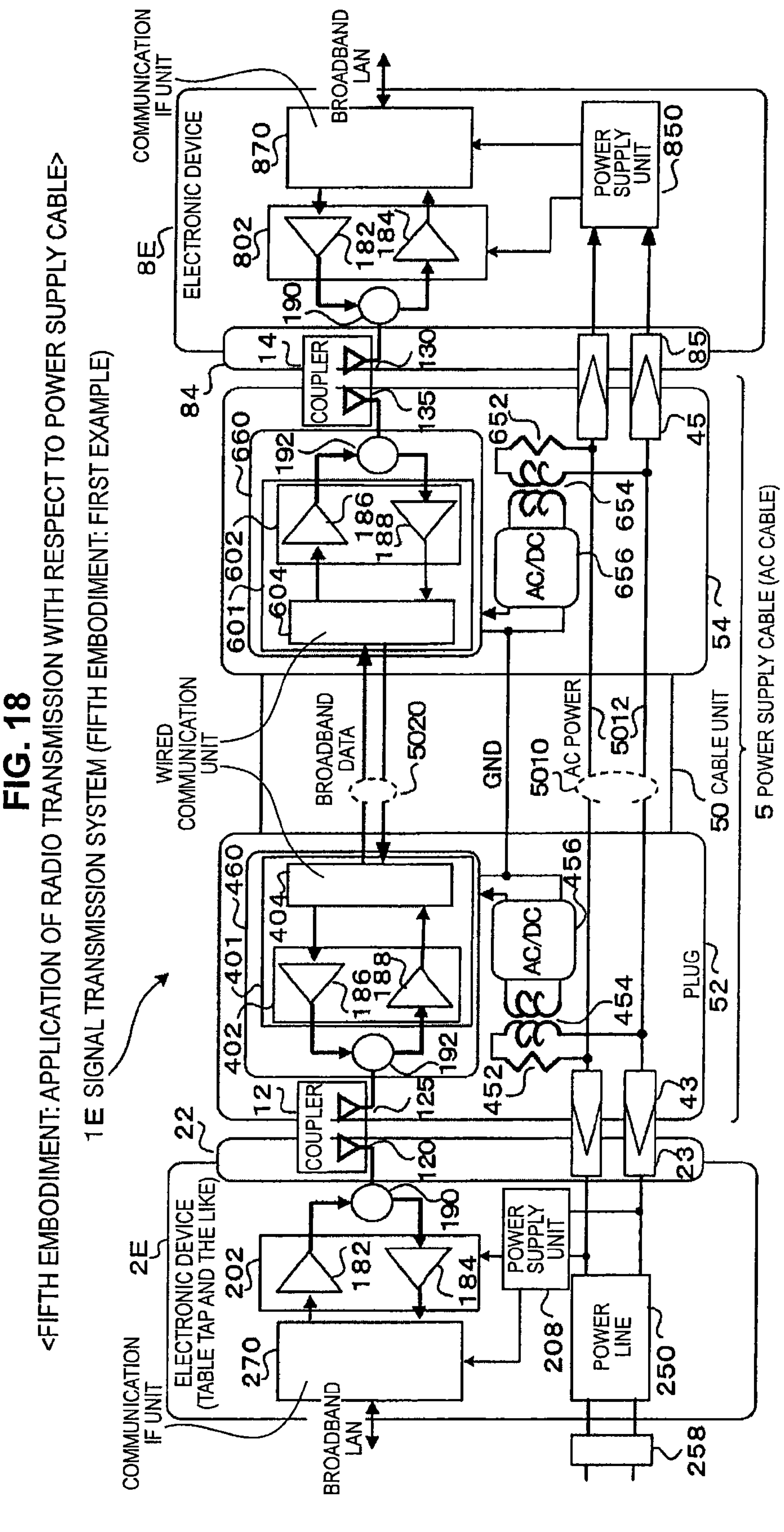
FIG. 18 is an illustration of a signal transmission system according to a first example of a fifth embodiment.
Figure 19:
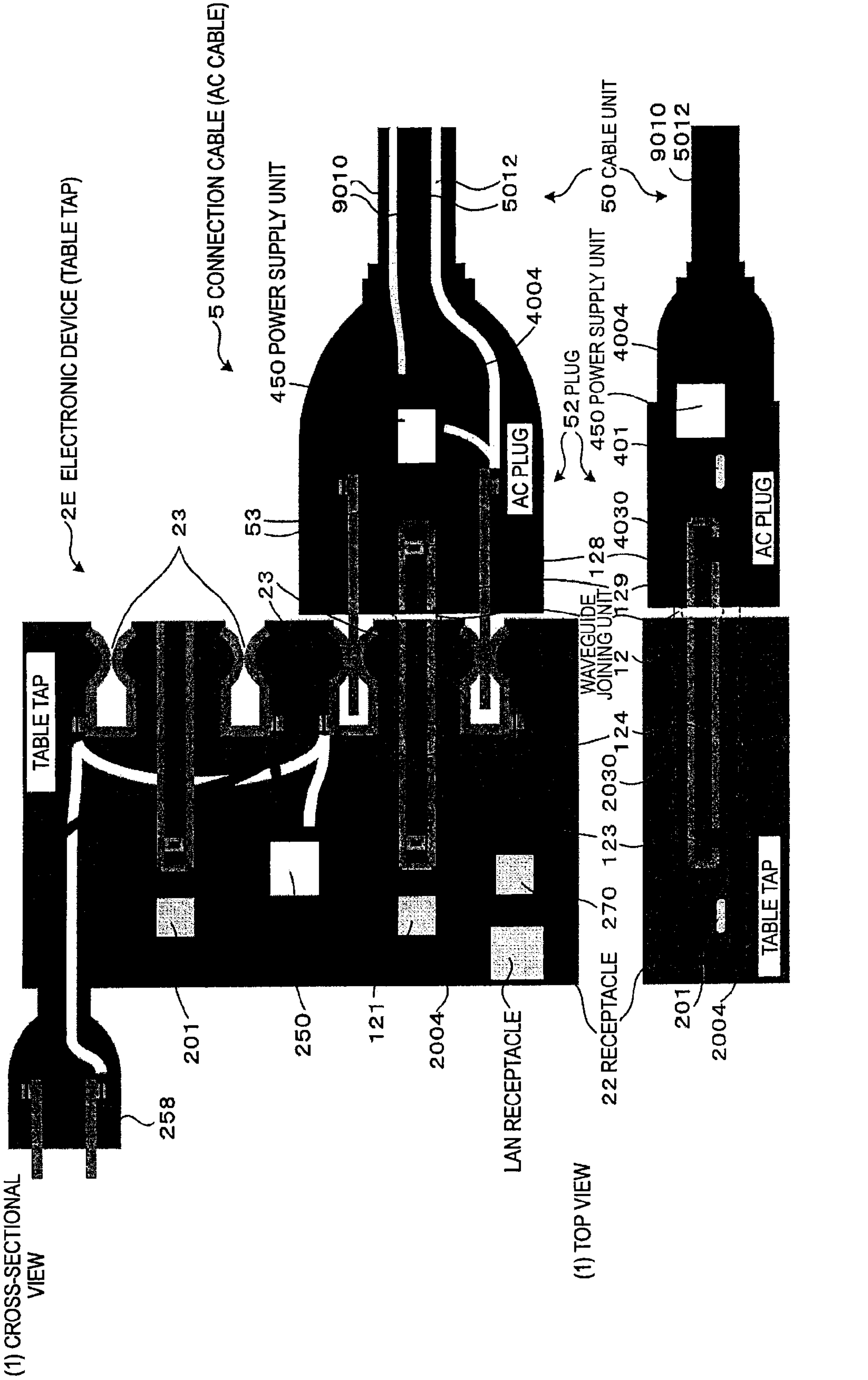
FIG. 19 is an illustration of a specific configuration of an electromagnetic field coupling unit according to the fifth embodiment (first example).
Figure 20:
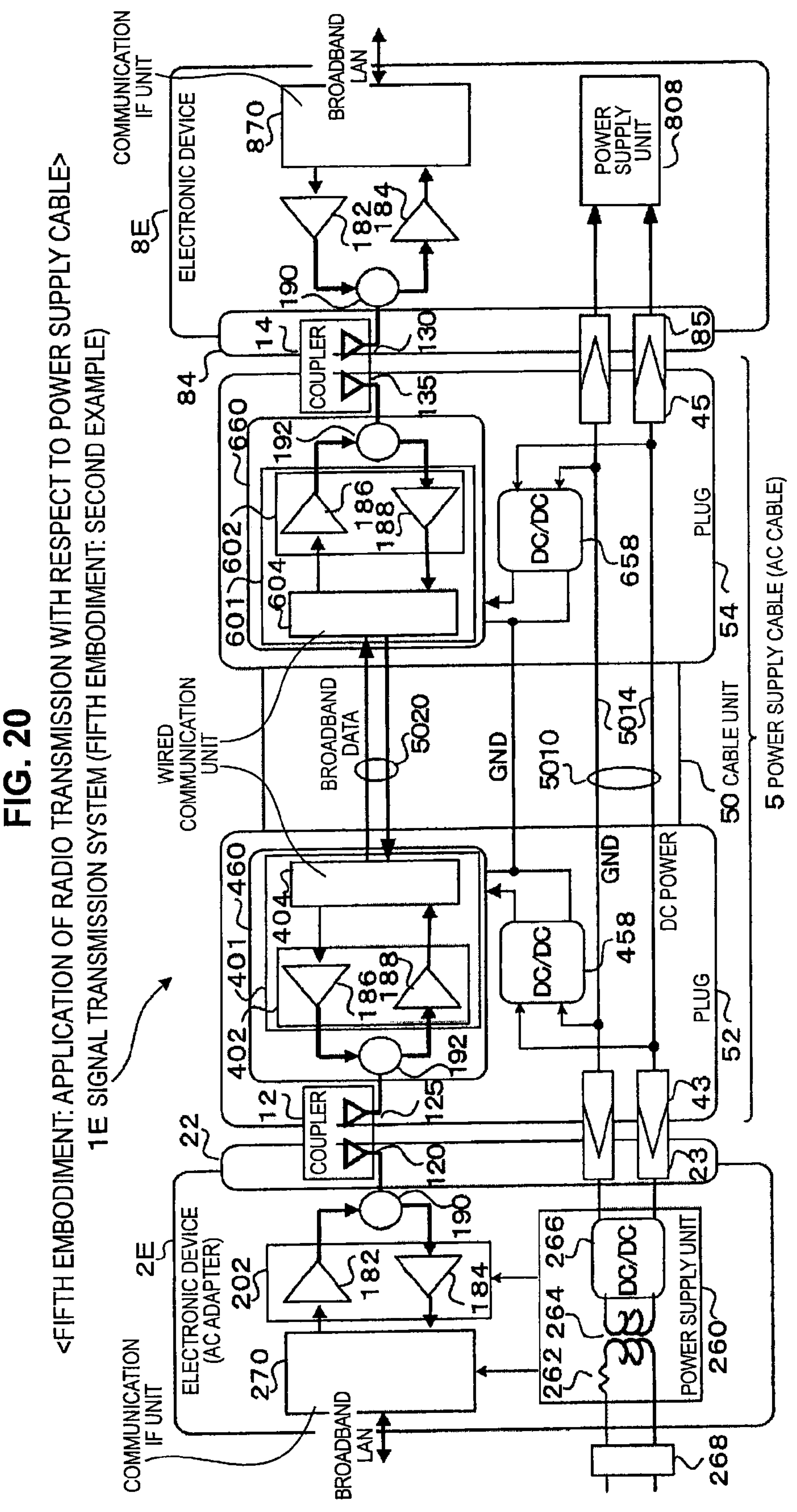
FIG. 20 is an illustration of a signal transmission system according to a second example of the fifth embodiment.

FIGS. 18 to 20 are illustrations of a signal transmission system 1E according to the fifth embodiment. FIGS. 18 to 20 illustrate a modification of the second embodiment in which the bidirectional communication is performed. However, the same structure can be applied to the first embodiment in which the unidirectional communication is performed or the fourth embodiment in which the wired transmission of the broadband signal is realized by the optical transmission.

In the fifth embodiment, a structure according to this embodiment for transmitting the broadband signal by wireless by the connector unit (including an outlet or a table tap) is applied to a power supply cable 5 (including a cable of an AC adapter). In addition, different from the first to fourth embodiments, the power supply cable is not provided with contacts for a narrowband signal and power.

The power supply cable 5 is configured to include a cable unit 50, a connector unit (a connector plug: hereinafter, called a plug 52) provided in an end of the cable unit 50 at the side of an electronic device 2E, and a connector unit (a connector plug: hereinafter, called a plug 54) provided in an end of the cable unit 50 at the side of an electronic device 8E.

The electronic device 2E and the electronic device 8E are connected by the power supply cable 5 and power is supplied from the side of the electronic device 2E to the side of the electronic device 8E. In the fifth embodiment, a system performing radio signal connection is provided, in addition to a normal power supply connection system using a contact electrode. Hereinafter, focusing on the radio connection system, explanation is given.

The cable unit 50 of the power supply cable 5 includes a data transmission line 5020 exclusively used for broadband data, in addition to a power supply line 5010, and performs broadband data transmission using the data transmission line 5020. As the data transmission line 5020, the conducting wire 9010 may be used as in the first to third embodiments or the optical fiber 9020 may be used as in the fourth embodiment.

In the electronic device 2E, a receptacle 22 into which the plug 52 of the power supply cable 5 can be fitted is provided. In the electronic device 8E, a receptacle 84 into which the plug 54 of the power supply cable 5 can be fitted is provided.

First Example

A first example illustrated in FIG. 18 is a form to supply power with an AC voltage. One (for example, the electronic device 2E) of the electronic device 2E and the electronic device 8E is an outlet (for example, it is provided on a wall) or a table tap and the other (for example, the electronic device 8E) is a device such as a personal computer or a digital television (DTV) that processes data such as sound or an image. In the first example of the form to supply power with the AC voltage, an AC wiring line 5012 is used as the power supply line 5010 of the cable unit 50.

The electronic device 2E includes a wireless communication unit 202 and a communication interface unit 270 (communication IF unit), in addition to a power line 250 (AC power source) to be an original functional element. In the power line 250, for example, a noise filter may be provided. AC power is supplied to the power line 250 through the AC plug 258. Similar to the wireless communication unit described in the second embodiment, the wireless communication unit 202 includes a transmission circuit 182 and a reception circuit 184 and corresponds to the bidirectional communication. In order to correspond to the bidirectional communication, a direction managing unit 190 is provided between the coupler unit 120 and the wireless communication unit 202. The communication interface unit 270 is a functional unit that relays connection with a communication mechanism such as a broadband LAN. For example, a bridge, a HUB, or a router corresponds to the communication interface unit 270.

The plug 52 of the power supply cable 5 includes a power supply unit 450 and a wireless communication unit 460. The power supply unit 450 supplies power (DC voltage) to the wireless communication unit 460 and has a current restriction resistor 452, a transformer 454, and an AC/DC converting unit 456. The current restriction resistor 452 is provided between one of two power lines and one input terminal of a primary winding line of the transformer 454. The other input terminal of the primary winding line of the transformer 454 is connected to the other power line of the two power lines. A secondary winding line of the transformer 454 is connected to the AC/DC converting unit 456. The AC/DC converting unit 456 converts an AC voltage into a DC voltage by a known structure and supplies the DC voltage to the wireless communication unit 460.

The wireless communication unit 460 has a communication chip 401 that includes a wireless communication unit 402 and a wired communication unit 404. Similar to the communication chip described in the second embodiment, the communication chip 401 includes a transmission circuit 186 and a reception circuit 188 and corresponds to the bidirectional communication. In order to correspond to the bidirectional communication, a direction managing unit 192 is provided between the coupler unit 125 and the communication chip 401.

The plug 54 of the power supply cable 5 includes a power supply unit 650 and a wireless communication unit 660. The power supply unit 650 supplies power (DC voltage) to the wireless communication unit 660 and has a current restriction resistor 652, a transformer 654, and an AC/DC converting unit 656. The current restriction resistor 652 is provided between one of two power lines and one input terminal of a primary winding line of the transformer 654. The other input terminal of the primary winding line of the transformer 654 is connected to the other power line of the two power lines. A secondary winding line of the transformer 654 is connected to the AC/DC converting unit 656. The AC/DC converting unit 656 converts an AC voltage into a DC voltage by a known structure and supplies the DC voltage to the wireless communication unit 660.

The wireless communication unit 660 has a communication chip 601 that includes a wireless communication unit 602 and a wired communication unit 604. Similar to the communication chip described in the second embodiment, the communication chip 601 includes a transmission circuit 186 and a reception circuit 188 and corresponds to the bidirectional communication. In order to correspond to the bidirectional communication, a direction managing unit 192 is provided between the coupler unit 135 and the communication chip 601.

The electronic device 8E includes a wireless communication unit 802 and a communication interface unit 870 (communication IF unit), in addition to a power supply unit 850 (AC power sink) to be an original functional element. The power supply unit 850 generates DC power from AC power. Similar to the wireless communication unit described in the second embodiment, the wireless communication unit 802 includes a transmission circuit 182 and a reception circuit 184 and corresponds to the bidirectional communication. In order to correspond to the bidirectional communication, a direction managing unit 190 is provided between the coupler unit 120 and the wireless communication unit 802. The communication interface unit 870 is a functional unit that relays connection with a communication mechanism such as a broadband LAN, similar to the communication interface unit 270.

[Example of Structure of Electromagnetic Field Coupling Unit]

FIG. 19 is an illustration of an example of a specific configuration of a radio coupler (an electromagnetic field coupling unit 12 and an electromagnetic field coupling unit 14) according to the fifth embodiment (first example). In the example illustrated in the drawing, the third example (aspect in which the radio transmission is performed through a cross-section of the waveguide) described in FIGS. 7 to 8A is adopted. As a data transmission line 5020, a conducting wire 9010 is used. Because the configuration of each unit can be known from the drawings, explanation of each unit is omitted herein. This example is not limited to the application of the third example and the first example or the second example may be applied.

Second Example

A second example illustrated in FIG. 20 is a form to supply power with a DC voltage. One (for example, the electronic device 2E) of the electronic device 2E and the electronic device 8E is an AC adapter and the other (for example, the electronic device 8E) is a device such as a personal computer or a digital television (DTV) that processes data such as sound or an image. In the second example of the form to supply power with the DC voltage, a DC wiring line 5014 is used as the power supply line 5010 of the cable unit 50.

The electronic device 2E becomes an AC adapter. The electronic device 2E includes a power supply unit 260, instead of the power line 250. In order to make the electronic device 2E become the AC adapter, the power supply unit 260 converts alternating-current power input from an outlet through an AC plug 268 into direct-current power (DC voltage) and supplies the direct-current power to the electronic device 8E through the power supply cable 5. The power supply unit 260 has a current restriction resistor 262, a transformer 264, and an AC/DC converting unit 266. The current restriction resistor 262 is provided between one of two power lines through the AC plug 268 and one input terminal of a primary winding line of the transformer 264. The other input terminal of the primary winding line of the transformer 264 is connected to the other power line of the two power lines. A secondary winding line of the transformer 264 is connected to the AC/DC converting unit 266. The AC/DC converting unit 266 converts an AC voltage into a DC voltage by a known structure. The DC voltage is supplied to the side of the electronic device 8E through a DC wiring line 5014 of the cable unit 50 of the power supply cable 5. The electronic device 8E includes a power supply unit 808 generating DC power from the DC power, instead of the power supply unit 850 generating the DC power from the AC power.

Because a power supply line 5010 becomes a DC wiring line 5014, a power supply unit 450 of the plug 52 and a power supply unit 650 of the plug 54 are changed as follows. The power supply unit 450 includes a current restriction resistor 452, a transformer 454, and a DC/DC converting unit 458, instead of the AC/DC converting unit 456. The power supply unit 650 includes a current restriction resistor 652, a transformer 654, and a DC/DC converting unit 658, instead of the AC/DC converting unit 656. As the DC/DC converting unit 458 or the DC/DC converting unit 658, a power stabilization circuit using a reference power supply such as a three-terminal regulator or a Zener diode can be used. The DC/DC converting unit 458 may not be provided and the DC voltage generated by the power supply unit 260 may be supplied to the wireless communication unit 460. In addition, the DC/DC converting unit 658 may not be provided and the DC voltage generated by the power supply unit 260 may be supplied to the wireless communication unit 660.

In both the first example and the second example, broadband data transmission is performed using a data transmission line 5020 installed additionally in the coupler (the electromagnetic field coupling unit 12 and the electromagnetic field coupling unit 14) and the cable unit 50. In the case of the first example, the power supply line 5010 is an AC wiring line 5012. In addition, power that is supplied to the AC wiring line 5012 is AC power and is supplied to wireless communication functional units (the wireless communication unit 460 and the wireless communication unit 660) through the AC/DC conversion circuit (the power supply unit 450 and the power supply unit 650) of the power supply cable 5. Meanwhile, in the case of the second example, the power supply line 5010 is a DC wiring line 5014. In addition, because power supplied to the DC wiring line 5014 is DC power, an AC/DC conversion circuit does not need to be provided in the power supply cable 5, the power can be supplied from the DC wiring line 5014 to the wireless communication functional units (the wireless communication unit 460 and the wireless communication unit 660), and a DC/DC conversion circuit (DC/DC conversion units 458 and 658) may be provided, if necessary.

[Application System]

Figure 21:
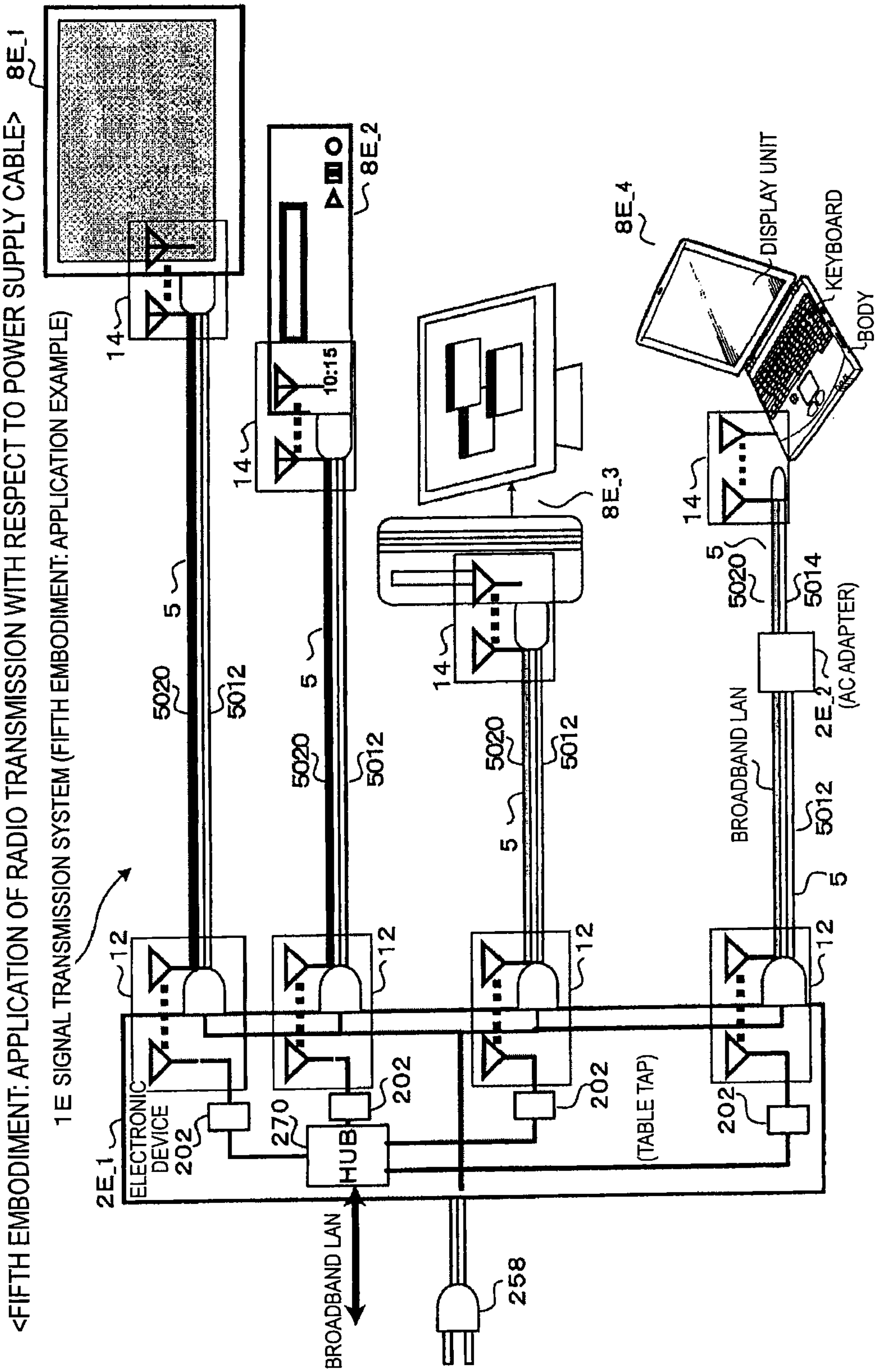
FIG. 21 is an illustration of an application example of the fifth embodiment.

FIG. 21 is an illustration of an application example of the fifth embodiment. In a power supply cable 5 that includes an RF coupler communication function (wireless communication function with respect to broadband data), utilization illustrated in FIG. 21 is considered. For example, a table tap 2E_1 and an AC adapter 2E_2 exist as the electronic devices 2E. The power supply cables 5 from the various electronic devices 8E are connected to each outlet of the table tap. The AC adapter 2E_2 is supplied with AC power, from one outlet of the table tap 2E_1. As the electronic devices 8E, a digital television 8E_1 (DTV), a record reproducing device 8E_2 using a DVD (including Blu-ray), a desktop type personal computer 8E_3, and a notebook type personal computer 8E_4 exist.

The first example is applied to connection of the table tap 2E_1 and the digital television 8E_1, the record reproducing device 8E_2, and the personal computer 8E_3 and the second example is applied to connection of the AC adapter 2E_2 and the personal computer 8E_4. In both the connections, high-speed data communication between the devices is enabled by only connecting the power supply cable 5. As in existing PLC (Power Line Communication), because a signal does not pass through a power line or an electrode thereof, undesired radiation of power that is caused by a domestic AC wiring line is small.

<Comparison with Example]

The information processing ability of industrial devices and domestic devices has been reinforced year by year and a band of data to be transmitted by an interface connecting the industrial devices and the domestic devices by a cable has expanded continuously. The change of generation to expand the transmission band while maintaining compatibility with a conventional (existing) interface is carried out by various interfaces. As a representative example, in Ethernet (registered trademark), expansion is made from 10Base-T to 100Base-TX and 1000Base-T. In a USB (Universal Serial Bus), expansion is made from USB 1.0 from USB 2.0 and from USB 2.0 to USB 3.0. Generally, in the change of the generation, shapes and placements of connector electrodes designed for the old generation are not suitable for broadband and this causes a problem. Various technologies are applied to overcome the limitations caused by the problem.

For example, in Ethernet (registered trademark), as described in Reference Literature 1, with the improvement of transmission signal codes, signal shaping techniques such as a cable equalizer, an echo canceller, and a crosstalk canceller have been introduced.

Reference Literature 1: Osamu Ishida, "Standardization Trend of High-Speed Ethernet Standard", NGN Era Optical Technology Industrial Round-Table Conference, Fifth Open Forum, Mar. 5, 2008, [online], [Mar. 26, 2010 search], Internet <URL:http://www.oitda.or.jp/main/study/ngn/NGN5-Siryou/07NGN5-1.pdf>

In the USB, when expansion is made from USB 2.0 to USB 3.0, as described in Reference Literature 2, pins for broadband signals are added and a cable that has had 4 cores in the related art becomes have 9 cores. In order to add the pins (contact electrodes) while maintaining a size of an external shape at a size according to the related art, a shape of a connector is changed. The USB is operated as the USB 3.0 when signal lines of the added USB 3.0 are connected to each other and is operated as the USB 2.0 (or 1.0) when the signal lines are not connected to each other, so that connection compatibility (backward compatibility) with an existing USB apparatus or USB cable is maintained.

Reference Literature 2: Homepage of Renesas Electronics Corporation (Link Destination): Production Information->Exclusive IC->"USB" of USB Device->"Specification Summary of USB 3.0" of USB->"Backward Compatibility", [online], [Mar. 26, 2010 search], Internet <URL: http://www.necel.com/usb/ja/about_usb/USB3_3.html>

However, there is a limitation in an extension line according to the related art to satisfy the requirement for further high-speed and large-capacity data transmission. For example, an HDMI (High-Definition Multimedia Interface) attracts attention as a next generation digital multimedia interface. However, there is difficulty for signal processing or pin addition, when an interface with small and multipolar connectors such as the HDMI receiving three differential signal pairs each having 3.4 Gb/s in a current state is made to become broadband more. For example, it is difficult to manufacture an echo canceller and a crosstalk canceller of a high frequency more than 5 Gb/s and the connector has a shape in which it is difficult (substantially impossible) to add pins under constraints where the pins are inserted into a connector of a current generation. Such difficulty in the requirement for the high-speed and large-capacity data transmission is not limited to the HDMI and also occurs in the Ethernet (registered trademark) or the USB.

As a most extreme example in which a broadband data communication function is added to the interface according to the related art, as described in Reference Literature 3, there is a PLC (Power Line Communications: High-Speed Power Line Communications). The PLC according to the related art realizes communication by overlapping a high-frequency signal to an AC line where only transmission of AC power is originally a purpose (refer to a summary of an OFDM (Orthogonal Frequency Division Multiplexing) transmission method in the same literature). However, in the PLC technology, because the AC line functions as an antenna and radiates a high-frequency signal, a modulation method and transmission power of the PLC according to the related art are limited to suppress the unnecessary radiation. An existing AC line or contact that is designed without considering a high-frequency characteristic also becomes a strong limitation condition, when the modulation method is selected. As a result, a communication band that can be achieved by the PLC becomes narrow and becomes insufficient when high-speed and large-capacity data such as an image is transmitted.

Reference Literature 3: Home Page of High Speed PLC Promoter's Alliance of Japan (PLC-J) (link Destination): Summary of PLC-J System->What is PLC?->Technical Problem of PLC->PLC Technology to Realize High Speed Communication, [online], [Mar. 26, 2010 search], Internet <URL:http://www.plc-j.org/about_plcsys3.htm>

Meanwhile, in the structure according to this embodiment, the coupler (the electromagnetic field coupling unit 12 and the electromagnetic field coupling unit 14) to perform the radio transmission is added to the connector connecting unit and the radio transmission is performed through the coupler. Therefore, the problem described above can be relieved as follows.

1) Because pins are unnecessary in the coupler, the broadband communication can be performed without being affected by high-frequency-related constraints of the shapes and placements of the connector electrodes designed for the old generation interfaces.

2) When the couplers are added to the connector unit, an external shape is configured to have a size equal to the size in the related art and a new generation interface that has compatibility with an old generation interface can be realized. At this time, if the connection compatibility detection mechanism is provided as in the third embodiment, narrowband transmission and broadband transmission can be selected at an appropriate time by mutually recognizing presence or absence of a radio function, even though the new generation interface and the old generation interface are used together.

3) Even in an interface that does not a structural room in which pins cannot be additionally provided under a condition where compatibility is maintained, because the pins are unnecessary in the couplers, a new generation interface that has ability for broadband transmission can be realized.

4) An exposure surface of the coupler is insulated from a circuit element transmitting and receiving a broadband signal in terms of a direct current and can be protected with a thin film having a high dielectric withstand voltage. Therefore, an interface that has high electrostatic resistance, regardless of electrostatic resistance of a transmission/reception circuit element, can be realized.

5) As in the first example of the first embodiment, when the system configuration performing the broadband transmission and the old generation narrowband transmission using the separate transmission lines is adopted, the broadband communication is electrically connected to the narrowband communication function of the old generation. For this reason, even though the narrowband communication requires a high direct-current bias, the broadband communication function can be manufactured using a low withstand voltage element having a superior high-frequency characteristic.

6) As in the second example of the first embodiment, when the system configuration performing the broadband transmission and the old generation narrowband transmission using the common transmission line is adopted, the number of connecting wires used in the wired transmission (cable unit 40) can be suppressed from increasing.

7) When the signal transmission system corresponds to the bidirectional communication, a system configuration (configuration according to the first embodiment) of the unidirectional communication in a different direction is not arranged only and the configuration according to the second embodiment is adopted. Therefore, the bidirectional communication can share one set of couplers and can be executed simultaneously and the number of components that construct the bidirectional broadband interface can be decreased.

8) In the signal processing to transmit the broadband data by wire in the cable unit 40, if a synchronization clock of broadband data (for example, NRZ signal) to modulate a carrier signal for radio transmission is generated on the basis of the carrier signal, the carrier signal and the synchronization clock can be synchronized with each other. Thereby, the number of components of a circuit can be decreased and the components can be easily integrated in the plug of the cable. In addition, a modulation characteristic can be suppressed from being changed by low frequency beats of the modulation and the carrier signal.

9) If wired transmission of broadband data in the cable unit 40 is realized by the optical transmission described in the fourth embodiment, instead of the conducting wire transmission described in the first to third embodiments, the connection apparatuses can be isolated from each other and the signal processing circuit for the wired transmission can be simplified.

10) As in the fifth embodiment, if the structure is applied to the power supply cable, a cable for a versatile broadband LAN can be used. For this reason, high-speed data communication between the apparatuses can be realized with the same image as the PLC, without additionally providing cables other than the cable. Because the PLC according to the related art directly overlaps a signal to an AC line, a communication band is limited to suppress unnecessary radiation. However, in the method according to the fifth embodiment, because data is transmitted using a data dedicated conductor additionally provided in the couplers and the AC cable, further broadband data communication can be realized as compared with the related art.

11) When the coupler is coupled with the connector unit, an exposure surface of the coupler is insulated from a circuit element transmitting and receiving a broadband signal in terms of a direct current and can be protected with a thin film having a high dielectric withstand voltage. Therefore, an interface that has high electrostatic resistance, regardless of electrostatic resistance of a transmission/reception circuit, can be realized.

The preferred embodiments of the present invention have been described above with reference to the accompanying drawings, whilst the present invention is not limited to the above examples, of course. The embodiment may have various alternations and modifications within the scope of the appended claims, and it should be understood that they will naturally come under the technical scope of the present invention.

The embodiments described above do not limit the technologies described in claims and all of the combinations of the features described in the embodiments are not essential to the solving means of the present invention. The technologies of the various steps are included in the embodiments described above and the various technologies can be extracted by appropriately combining the plurality of disclosed structural elements. A configuration in which some structural elements are removed can be extracted as the technology, as long as the same effect is obtained even when some structural elements are removed from all of the structural elements described in the embodiments.

According to the embodiments described above, in addition to the technologies described in claims, the following technologies are extracted. Hereinafter, the technologies are exemplified.

<<First Note Technology>>

<Note 1>

A signal transmission system including:

a first connector apparatus; and a second connector apparatus that is coupled with the first connector apparatus, wherein the first connector apparatus and the second connector apparatus are coupled together to form an electromagnetic field coupling unit using a waveguide structure, a transmission object signal is converted into a radio signal, which is then transmitted through the electromagnetic field coupling unit, between the first connector apparatus and the second connector apparatus, and the waveguide structure of the electromagnetic field coupling unit is provided to satisfy a shape of a coupling structure according to a standard.

<Note 2>

The signal transmission system according to note 1, further including:

a first signal converting unit that executes modulation processing on the basis of the transmission object signal and converts the signal into a high-frequency signal; and a second signal converting unit that executes demodulation processing on the basis of a received radio signal and converts the signal into a baseband signal, wherein the first connector apparatus has a first radio coupling unit that is electrically connected to the first signal converting unit, and the second connector apparatus has a second radio coupling unit that is electrically connected to the second signal converting unit.

<Note 3>

The signal transmission system according to note 2, wherein the first radio coupling unit has a first transmission path coupling unit connected to the first signal converting unit through a first high-frequency transmission path, the second radio coupling unit has a second transmission path coupling unit connected to the second signal converting unit through a second high-frequency transmission path, and the radio signal is transmitted in a space between the first transmission path coupling unit and the second transmission path coupling unit that is formed when the first connector apparatus and the second connector apparatus are coupled together.

<Note 4>

The signal transmission system according to note 3, wherein the first transmission path coupling unit has a first probe-shaped radio coupling unit, the second transmission path coupling unit has a second probe-shaped radio coupling unit, and a positional relation of the probe-shaped radio coupling units is set such that the probe-shaped radio coupling units overlap by an amount corresponding to a $\lambda/4$ wavelength, resonate, and transmit the radio signal, when a wavelength of a radio signal is set to $\lambda$ and the first connector apparatus and the second connector apparatus are coupled together.

<Note 5>

The signal transmission system according to note 3, wherein the first transmission path coupling unit has a first antenna coupling unit, the second transmission path coupling unit has a second antenna coupling unit, and when the first connector apparatus and the second connector apparatus are coupled together, the radio signal is transmitted between the first antenna coupling unit and the second antenna coupling unit.

<Note 6>

The signal transmission system according to note 5, wherein a first waveguide is provided at the electric wave radiation side of the first antenna coupling unit, a second waveguide is provided at the electric wave radiation side of the second antenna coupling unit, and radio transmission between the first antenna coupling unit and the second antenna coupling unit is performed through the first waveguide and the second waveguide.

<Note 7>

The signal transmission system according to note 2, wherein the first radio coupling unit has a first waveguide coupling unit connected to the first signal converting unit through a first high-frequency transmission path, the second radio coupling unit has a waveguide and a second waveguide coupling unit connected to the second signal converting unit through a second high-frequency transmission path, and when the first connector apparatus and the second connector apparatus are coupled together, the first waveguide coupling unit and the second waveguide coupling unit are electromagnetically coupled through the waveguide and the radio signal is transmitted.

<Note 8>

The signal transmission system according to note 7, wherein the waveguide of the second radio coupling unit is a dielectric waveguide that is formed in a circuit board on which the second signal converting unit is mounted.

<Note 9>

The signal transmission system according to note 7 or 8, wherein the first waveguide coupling unit has a first probe-shaped radio coupling unit, the second waveguide coupling unit forms a slot antenna structure including a second probe-shaped radio coupling unit and a first opening, a second opening is provided at a position of the waveguide of the second radio coupling unit facing the first radio coupling unit opposite to the second waveguide coupling unit, and the slot antenna structure is formed by the first probe-shaped radio coupling unit of the first waveguide coupling unit and the second opening of the second radio coupling unit, when the first connector apparatus and the second connector apparatus are coupled together.

<Note 10>

The signal transmission system according to note 9, wherein a coupling portion of the second connector apparatus with the first connector apparatus is covered with a metal material, a hole to lock the first connector apparatus coupled with the second connector apparatus is provided in a part of the metal material, a conducting wall of the waveguide of the second radio coupling unit is configured using the metal material to cover the coupling portion with the first connector apparatus, and the second opening of the second radio coupling unit is configured using the hole to lock the first connector apparatus.

<Note 11>

The signal transmission system according to note 2, wherein the first radio coupling unit has a first waveguide and a first waveguide coupling unit connected to the first signal converting unit through a first high-frequency transmission path, the second radio coupling unit has a second waveguide and a second waveguide coupling unit connected to the second signal converting unit through a second high-frequency transmission path, and when the first connector apparatus and the second connector apparatus are coupled together, a cross-section of the first waveguide in a longitudinal direction and a cross-section of the second waveguide in a longitudinal direction face to form a waveguide joining unit and the radio signal is transmitted through the waveguide joining unit.

<Note 12>

A connector apparatus, wherein the connector apparatus has a coupling structure that is coupled with the other connector apparatus, the connector apparatus has a radio coupling unit that is connected to a signal converting unit to execute modulation processing on the basis of a transmission object signal and convert the signal into a high-frequency signal and execute demodulation processing on the basis of a received radio signal and convert the signal into a baseband signal and transmits the radio signal, and the first connector apparatus and the second connector apparatus are coupled together to form an electromagnetic field coupling unit using a waveguide structure, a transmission object signal is converted into a radio signal, which is then transmitted through the electromagnetic field coupling unit, between the first connector apparatus and the second connector apparatus, and the waveguide structure of the electromagnetic field coupling unit is provided to satisfy a shape of a coupling structure according to a standard.

<Note 13>

The connector apparatus according to note 12, wherein the radio coupling unit has a transmission path coupling unit connected to the signal converting unit through a high-frequency transmission path, the radio signal is transmitted in a space between the transmission path coupling unit of the self apparatus and the transmission path coupling unit of the other connector apparatus that is formed when the other connector apparatus is coupled with the self apparatus, the first transmission path coupling unit has a first probe-shaped radio coupling unit, the second transmission path coupling unit has a second probe-shaped radio coupling unit, and a positional relation of the probe-shaped radio coupling units is set such that the probe-shaped radio coupling units overlap by an amount corresponding to a $\lambda/4$ wavelength, resonate, and transmit the radio signal, when a wavelength of a radio signal is set to $\lambda$ and the first connector apparatus and the second connector apparatus are coupled together.

<Note 14>

The connector apparatus according to note 13, wherein the transmission path coupling unit has an antenna coupling unit, and when the self apparatus is coupled with the other connector apparatus, the radio signal is transmitted between the antenna coupling unit of the self apparatus and the antenna coupling unit of the other connector apparatus.

<Note 15>

The connector apparatus according to note 14, wherein a waveguide is provided at the electric wave radiation side of the antenna coupling unit, and radio transmission between the antenna coupling unit of the self apparatus and the antenna coupling unit of the other connector apparatus is performed through the waveguide.

<Note 16>

The connector apparatus according to note 12, wherein the radio coupling unit has a waveguide coupling unit connected to the signal converting unit through a high-frequency transmission path and when the self apparatus is coupled with the other connector apparatus having a waveguide and a waveguide coupling unit connected to the signal converting unit through a high-frequency transmission path, the waveguide coupling unit of the self apparatus is electromagnetically coupled through the waveguide of the other connector apparatus and the radio signal is transmitted, and the radio coupling unit has a waveguide and a waveguide coupling unit connected to the signal converting unit through a high-frequency transmission path and when the self apparatus is coupled with the other connector apparatus, the waveguide coupling unit of the self apparatus and the waveguide coupling unit of the other connector apparatus are electromagnetically coupled through the waveguide and the radio signal is transmitted.

<Note 17>

The connector apparatus according to note 16, wherein a slot antenna structure is formed by a probe-shaped radio coupling unit and an opening, when the self apparatus is coupled with the other connector apparatus.

<Note 18>

The connector apparatus according to note 17, wherein a coupling portion with the other connector apparatus is covered with a metal material, a hole to lock the coupled other connector apparatus is provided in a part of the metal material, a conducting wall of the waveguide of the radio coupling unit is configured using the metal material to cover the coupling portion with the other connector apparatus, and the opening is configured using the hole to lock the other connector apparatus.

<Note 19>

The connector apparatus according to note 12, wherein the radio coupling unit has a waveguide and a waveguide coupling unit connected to the signal converting unit through a high-frequency transmission path, and when the self apparatus and the other connector apparatus are coupled together, a cross-section of the waveguide of the self apparatus in a longitudinal direction and a cross-section of the waveguide of the other apparatus in a longitudinal direction face to form a waveguide joining unit and the radio signal is transmitted through the waveguide joining unit.

<Note 20>

An electronic device including:

a connector unit that has a coupling structure coupling the other connector apparatus; and a signal converting unit that executes modulation processing on the basis of a transmission object signal and converts the signal into a high-frequency signal and executes demodulation processing on the basis of a received radio signal and converts the signal into a baseband signal, wherein the connector unit has a radio coupling unit that is connected to the signal converting unit and transmits the radio signal, the connector unit is coupled with the other connector apparatus to form an electromagnetic field coupling unit using a waveguide structure between the radio coupling unit and the radio coupling unit of the other connector apparatus, and the waveguide structure of the electromagnetic field coupling unit is provided to satisfy a shape of a coupling structure according to a standard.

<Name, Technical Field, and Effect of First Note Technology>

The first note technology relates to a signal transmission system, a connector apparatus, and an electronic device.

According to one aspect of the first note technology, connection interfaces of signals for which high speed and large capacity are required can be realized, different from connection interfaces using contacts.

The first note technology can be applied to a connector not having a structural room in which contact pins cannot be additionally provided. A coupling structure between connector apparatuses and an electromagnetic field coupling unit using a waveguide structure are formed according to standards. Therefore, connection interfaces of signals for which high speed and large capacity are required can be realized while backward compatibility with an existing connector is maintained.

<<Second Note Technology>>

<Note 1>

A signal transmission system including:

a connector unit that has a coupling structure coupled with the other connector unit, has a radio coupling unit connected to a signal converting unit to execute modulation processing on the basis of a transmission object signal and convert the signal into a high-frequency signal and execute demodulation processing on the basis of a received radio signal and convert the signal into a baseband signal and transmitting the radio signal, and is coupled with the other connector unit to form an electromagnetic field coupling unit between the radio coupling unit and the radio coupling unit of the other connector unit; and a determining unit that determines whether the radio signal can be transmitted through the electromagnetic field coupling unit between the connector unit and the other connector unit <Note 2>

The signal transmission system according to note 1, wherein, when the determining unit determines that the radio signal can be transmitted, the determining unit allows the transmission object signal to be transmitted by the radio signal through each connector unit.

<Note 3>

The signal transmission system according to note 1, wherein, when the determining unit determines that the radio signal cannot be transmitted, the determining unit forbids the transmission object signal to be transmitted by the radio signal through each connector unit.

<Note 4>

The signal transmission system according to note 1, wherein, when the determining unit determines that the radio signal cannot be transmitted, the determining unit stops an operation of the signal converting unit.

<Note 5>

The signal transmission system according to note 1, wherein the determining unit determines whether transmission of the radio signal is in a valid state and stops an operation of the signal converting unit, when the transmission of the radio signal is not in the valid state.

<Note 6>

The signal transmission system according to any one of notes 1 to 5, further including:

a connection cable that performs signal transmission; and a wired communication unit that performs communication using a wired signal through the connection cable and performs a conversion of the wired signal transmitted through the connection cable and a high-frequency signal corresponding to the radio signal, wherein the radio coupling unit, the wired communication unit, and the determining unit are provided in both ends of the connection cable, and the individual determining units of both sides of the connection cable share information on whether the other connector unit coupled in the other side of the connection cable can transmit the radio signal through the electromagnetic field coupling unit and cooperatively control whether transmission of the radio signal is allowed or forbidden.

<Note 7>

The signal transmission system according to note 6, wherein, when the determining unit determines that the radio signal cannot be transmitted, the determining unit stops an operation of the wired communication unit.

<Note 8>

The signal transmission system according to any one of notes 1 to 7, wherein the determining unit has a direction managing unit that supplies a signal transmitted from the signal converting unit to the radio coupling unit and transmits a signal component from the radio coupling unit to a system different from the signal converting unit and a power detecting unit that detects power of the signal component obtained from the radio coupling unit through the direction managing unit, and the determining unit controls whether transmission of the radio signal is allowed or forbidden, on the basis of a detection result of the power detecting unit.

<Note 9>

The signal transmission system according to any one of notes 1 to 8, wherein the determining unit has a code detecting unit that detects a predetermined code, on the basis of a reception signal received by the signal converting unit, and controls whether the transmission of the radio signal is allowed or forbidden, on the basis of a detection result of the code detecting unit.

<Note 10>

The signal transmission system according to any one of notes 1 to 9, wherein the determining unit has a direction managing unit that supplies a signal transmitted from the signal converting unit to the radio coupling unit and transmits a signal component from the radio coupling unit to a system different from the signal converting unit, a power detecting unit that detects power of the signal component obtained from the radio coupling unit through the direction managing unit, a code detecting unit that detects a predetermined code, on the basis of a reception signal received by the signal converting unit, and a control unit that controls whether transmission of the radio signal is allowed or forbidden, on the basis of detection results of the power detecting unit and the code detecting unit.

<Note 11>

The signal transmission system according to any one of notes 1 to 10, wherein a signal system that performs signal transmission by an electrical contact between the connector unit and the other connector apparatus, when the connector unit is coupled with the other connector unit, is provided, and the determining unit performs a control operation such that the signal transmission is performed by the electrical contact, when the radio transmission is forbidden.

<Note 12>

The signal transmission system according to any one of notes 1 to 11, wherein, when the other connector unit has the radio coupling unit and a specification of the radio signal is common between the connector unit and the other connector unit, the determining unit determines that the radio signal can be transmitted through the electromagnetic field coupling unit.

<Note 13>

The signal transmission system according to any one of notes 1 to 12, further including:

a notifying unit that notifies a determination result of the determining unit.

<Note 14>

A connector apparatus including:

a radio coupling unit that is connected to a signal converting unit to execute modulation processing on the basis of a transmission object signal and convert the signal into a high-frequency signal and execute demodulation processing on the basis of a received radio signal and convert the signal into a baseband signal and transmits the radio signal; and a coupling structure that is coupled with the other connector apparatus, wherein the connector apparatus is coupled with the other connector apparatus to form an electromagnetic field coupling unit between the radio coupling unit and the radio coupling unit of the other connector apparatus, and the connector apparatus further includes a determining unit that determines whether the radio signal can be transmitted through the electromagnetic field coupling unit between the connector apparatus and the other connector apparatus coupled with the connector apparatus.

<Note 15>

The connector apparatus according to note 14, wherein the determining unit has a direction managing unit that supplies a signal transmitted from the signal converting unit to the radio coupling unit and transmits a signal component from the radio coupling unit to a system different from the signal converting unit and a power detecting unit that detects power of the signal component obtained from the radio coupling unit through the direction managing unit, and the determining unit controls whether transmission of the radio signal is allowed or forbidden, on the basis of a detection result of the power detecting unit.

<Note 16>

The connector apparatus according to note 14 or 15, wherein the determining unit has a code detecting unit that detects a predetermined code, on the basis of a reception signal received by the signal converting unit, and the determining unit controls whether the transmission of the radio signal is allowed or forbidden, on the basis of a detection result of the code detecting unit.

<Note 17>

The connector apparatus according to note 14, wherein the determining unit has a direction managing unit that supplies a signal transmitted from the signal converting unit to the radio coupling unit and transmits a signal component from the radio coupling unit to a system different from the signal converting unit, a power detecting unit that detects power of the signal component obtained from the radio coupling unit through the direction managing unit, a code detecting unit that detects a predetermined code, on the basis of a reception signal received by the signal converting unit, and a control unit that controls whether transmission of the radio signal is allowed or forbidden, on the basis of detection results of the power detecting unit and the code detecting unit.

<Note 18>

The connector apparatus according to any one of notes 14 to 17, wherein a signal system that performs signal transmission by an electrical contact between the connector apparatus and the other connector apparatus, when the connector apparatus is coupled with the other connector apparatus, is provided, and the determining unit performs a control operation such that the signal transmission is performed by the electrical contact, when the radio transmission is forbidden.

<Note 19>

An electronic device including:

a connector unit that has a coupling structure coupled with the other connector unit; and a signal converting unit that executes modulation processing on the basis of a transmission object signal and converts the signal into a high-frequency signal and executes demodulation processing on the basis of a received radio signal and converts the signal into a baseband signal, wherein the connector unit has a radio coupling unit that is connected to the signal converting unit and transmits the radio signal, the connector unit is coupled with the other connector apparatus to form an electromagnetic field coupling unit between the radio coupling unit and the radio coupling unit of the other connector apparatus, and the electronic device further includes a determining unit that determines whether the radio signal can be transmitted through the electromagnetic field coupling unit between the connector unit and the other connector unit.

<Note 20>

A signal transmission method including:

using a first connector apparatus and a second connector apparatus, the first connector apparatus having a first radio coupling unit electrically connected to a first signal converting unit executing modulation processing on the basis of a transmission object signal and converting the signal into a high-frequency signal and transmitting a radio signal, the second connector apparatus having a second radio coupling unit electrically connected to a second signal converting unit executing demodulation processing on the basis of the received radio signal and converting the signal into a baseband signal and transmitting the radio signal;

coupling the first connector apparatus with the second connector apparatus to form an electromagnetic field coupling unit between the first radio coupling unit and the second radio coupling unit, determining whether the radio signal can be transmitted, and controlling whether transmission of the radio signal is allowed or forbidden, on the basis of a determination result.

<Name, Technical Field, and Effect of Second Note Technology>

The second note technology relates to a signal transmission system, a connector apparatus, an electronic device, and a signal transmission method.

According to one aspect of the second note technology, connection interfaces of signals for which high speed and large capacity are required can be realized, different from connection interfaces using contacts.

The second note technology can be applied to a connector not having a structural room in which contact pins cannot be additionally provided. The connection interfaces using the contacts can be continuously maintained. By performing a compatibility determination of a signal transmission standard and controlling whether radio transmission is allowed or forbidden, connection interfaces of signals for which high speed and large capacity are required can be realized while backward compatibility with an existing connector is maintained.

<<Third Note Technology>>

<Note 1>

A signal transmission system including:

a connector unit that has a coupling structure coupled with the other connector unit, has a radio coupling unit connected to a signal converting unit to execute modulation processing on the basis of a transmission object signal and convert the signal into a high-frequency signal and execute demodulation processing on the basis of a received radio signal and convert the signal into a baseband signal and transmitting the radio signal, and is coupled with the other connector unit to form an electromagnetic field coupling unit between the radio coupling unit and the radio coupling unit of the other connector unit, and a timing signal generating unit that generates a timing signal used as a signal processing reference, on the basis of a carrier signal used by the modulation processing and the demodulation processing of the signal converting unit.

<Note 2>

The signal transmission system according to note 1, further including:

a connection cable that performs signal transmission; and a wired communication unit that performs communication using a wired signal through the connection cable and performs a conversion of the wired signal transmitted through the connection cable and a high-frequency signal corresponding to the radio signal, wherein the timing signal generating unit generate the timing signal that is used as a reference when the wired communication unit performs a conversion of the wired signal.

<Note 3>

The signal transmission system according to note 1 or 2, wherein the signal converting unit generates the carrier signal used by the demodulation processing by an injection synchronization method.

<Note 4>

The signal transmission system according to note 1 or 2, wherein the signal converting unit has a carrier signal generating unit that generates the carrier signal used by the modulation processing, and the timing signal generating unit has a phase synchronization loop circuit that uses the carrier signal generating unit as an oscillating unit.

<Note 5>

The signal transmission system according to note 4, wherein the timing signal generating unit has a phase/frequency comparing unit that is supplied with the timing signal, with respect to one system of a plurality of parallelized signal systems, and a phase correcting unit that adjusts a phase of the timing signal input to the phase/frequency comparing unit and generates the timing signal of the corresponding systems, with respect to the remaining systems of the plurality of parallelized signal systems.

<Note 6>

The signal transmission system according to any one of notes 1 to 3, wherein the timing signal generating unit has a dividing unit that divides the carrier signal used by the demodulation processing, a phase comparing unit that compares phases of the timing signal and a signal processed by the demodulation processing of the signal converting unit, and a phase adjusting unit that adjusts a phase of the timing signal, on the basis of phase difference information output from the phase comparing unit.

<Note 7>

The signal transmission system according to note 6, wherein the dividing unit is configured to adjust a phase of an output signal under control of the phase adjusting unit and outputs the output signal as the timing signal.

<Note 8>

The signal transmission system according to note 6, wherein a plurality of steps of delay elements that sequentially delay output signals of the dividing unit are arranged in the phase adjusting unit and the phase adjusting unit adjusts whether an output signal of any delay element is used as the timing signal, on the basis of the phase difference information output from the phase comparing unit, and adjusts a phase of the timing signal.

<Note 9>

A connector apparatus including:

a radio coupling unit that is connected to a signal converting unit to execute modulation processing on the basis of a transmission object signal and convert the signal into a high-frequency signal and execute demodulation processing on the basis of a received radio signal and convert the signal into a baseband signal and transmits the radio signal; and a coupling structure that is coupled with the other connector apparatus, wherein the connector apparatus is coupled with the other connector apparatus to form an electromagnetic field coupling unit between the radio coupling unit and the radio coupling unit of the other connector apparatus, and the connector apparatus further includes a timing signal generating unit that generates a timing signal used as a signal processing reference, on the basis of a carrier signal used by the modulation processing and the demodulation processing of the signal converting unit.

<Note 10>

The connector apparatus according to note 9, wherein the signal converting unit has a carrier signal generating unit that generates the carrier signal used by the modulation processing, and the timing signal generating unit has a phase synchronization loop circuit that uses the carrier signal generating unit as an oscillating unit.

<Note 11>

The connector apparatus according to note 10, wherein the timing signal generating unit has a phase/frequency comparing unit that is supplied with the timing signal, with respect to one system of a plurality of parallelized signal systems, and a phase correcting unit that adjusts a phase of the timing signal input to the phase/frequency comparing unit and generates the timing signal of the corresponding systems, with respect to the remaining systems of the plurality of parallelized signal systems.

<Note 12>

The connector apparatus according to note 9, wherein the timing signal generating unit has a dividing unit that divides the carrier signal used by the demodulation processing, a phase comparing unit that compares phases of the timing signal and a signal processed by the demodulation processing of the signal converting unit, and a phase adjusting unit that adjusts a phase of the timing signal, on the basis of phase difference information output from the phase comparing unit.

<Note 13>

The connector apparatus according to note 12, wherein the dividing unit is configured to adjust a phase of an output signal under control of the phase adjusting unit and outputs the output signal as the timing signal.

<Note 14>

The connector apparatus according to note 12, wherein a plurality of steps of delay elements that sequentially delay output signals of the dividing unit are arranged in the phase adjusting unit and the phase adjusting unit adjusts whether an output signal of any delay element is used as the timing signal, on the basis of the phase difference information output from the phase comparing unit, and adjusts a phase of the timing signal.

<Note 15>

The connector apparatus according to any one of notes 9 to 14, wherein the signal converting unit generates the carrier signal used by the modulation processing by an injection synchronization method.

<Note 16>

An electronic device including:

a connector unit that has a coupling structure coupled with the other connector unit; and a signal converting unit that executes modulation processing on the basis of a transmission object signal and converts the signal into a high-frequency signal and executes demodulation processing on the basis of a received radio signal and converts the signal into a baseband signal, wherein the connector unit has a radio coupling unit that is connected to the signal converting unit and transmits the radio signal, the connector unit is coupled with the other connector unit to form an electromagnetic field coupling unit between the radio coupling unit and the radio coupling unit of the other connector apparatus, and the electronic device further includes a timing signal generating unit that generates a timing signal used as a signal processing reference, on the basis of a carrier signal used by the modulation processing and the demodulation processing of the signal converting unit.

<Note 17>

The electronic device according to note 16, wherein the signal converting unit generates the carrier signal used by the demodulation processing by a signal injection method.

<Note 18>

A signal transmission method including:

using a first connector apparatus and a second connector apparatus, the first connector apparatus having a first radio coupling unit electrically connected to a first signal converting unit executing modulation processing on the basis of the transmission object signal and converting the signal into a high-frequency signal and transmitting a radio signal, the second connector apparatus having a second radio coupling unit electrically connected to a second signal converting unit executing demodulation processing on the basis of the received radio signal and converting the signal into a baseband signal and transmitting the radio signal;

coupling the first connector apparatus with the second connector apparatus to form an electromagnetic field coupling unit between the first radio coupling unit and the second radio coupling unit; and generating a timing signal used as a signal processing reference, on the basis of a carrier signal used by the modulation processing and the demodulation processing of the signal converting unit, when the transmission object signal is converted into a radio signal by the first signal converting unit, which is then transmitted to the second signal converting unit through the electromagnetic field coupling unit.

<Note 19>

The signal transmission method according to note 18, wherein the carrier signal used by the demodulation processing is generated by an injection synchronization method.

<Name, Technical Field, and Effect of Third Note Technology>

The third note technology relates to a signal transmission system, a connector apparatus, an electronic device, and a signal transmission method.

According to one aspect of the third note technology, connection interfaces of signals for which high speed and large capacity are required can be realized, different from connection interfaces using contacts. The third note technology can be applied to a connector not having a structural room in which contact pins cannot be additionally provided. The connection interfaces using the contacts can be continuously maintained. Therefore, connection interfaces of signals for which high speed and large capacity are required can be realized while backward compatibility with an existing connector is maintained.

Because a timing signal used at the time of signal processing is generated on the basis of the carrier signal used by the modulation processing and the demodulation processing, a circuit scale of the timing signal generating unit can be decreased and a modulation characteristic can be suppressed from being changed.

<<Fourth Note Technology>>

<Note 1>

A signal transmission system including:

a first connector apparatus that includes an electrical/optical converting unit to convert an electrical signal obtained by demodulating a received radio signal into an optical signal;

an optical cable that transmits the optical signal;

a second connector apparatus that includes an optical/electrical converting unit to convert the optical signal transmitted through the optical cable into the electrical signal;

a third connector apparatus that is coupled with the first connector apparatus; and a fourth connector apparatus that is coupled with the second connector apparatus, wherein a radio signal is transmitted between the first connector apparatus and the third connector apparatus and between the second connector apparatus and the fourth connector apparatus.

<Note 2>

The signal transmission system according to note 1, wherein the first connector apparatus and the third connector apparatus are coupled together to form a first electromagnetic field coupling unit, and the second connector apparatus and the fourth connector apparatus are coupled together to form a second electromagnetic field coupling unit.

<Note 3>

The signal transmission system according to note 1 or 2, wherein the third connector apparatus converts a transmission object signal into a radio signal and transmits the radio signal to the first connector apparatus through the first electromagnetic field coupling unit, the first connector apparatus converts the radio signal into an optical signal by the electric/optical converting unit and transmits the optical signal to the second connector apparatus through the optical cable, and the second connector apparatus converts the electrical signal obtained by converting the optical signal by the optical/electrical converting unit into the radio signal and transmits the radio signal to the fourth connector apparatus through the second electromagnetic field coupling unit.

<Note 4>

A connector apparatus including:

a signal converting unit that has a coupling structure coupled with the other connector apparatus and executes demodulation processing on the basis of a received radio signal and converts the signal into an electrical signal;

a radio coupling unit that is connected to the signal converting unit and transmits the radio signal; and an electrical/optical converting unit that converts the electrical signal converted by the signal converting unit into the optical signal and supplies the optical signal to an optical cable, wherein the connector apparatus is coupled with the other connector unit to form an electromagnetic field coupling unit between the radio coupling unit and the radio coupling unit of the other connector unit.

<Note 5>

A connector apparatus including:

a signal converting unit that has a coupling structure coupled with the other connector apparatus and executes modulation processing and converts a signal into a high-frequency signal;

a radio coupling unit that is connected to the signal converting unit and transmits the radio signal; and an electrical/optical converting unit that converts an optical signal transmitted through an optical cable into an electrical signal and supplies the electrical signal to the signal converting unit, wherein the connector apparatus is coupled with the other connector unit to form an electromagnetic field coupling unit between the radio coupling unit and the radio coupling unit of the other connector unit.

<Note 6>

A connector apparatus including:

an optical cable that transmits an optical signal;

a first signal converting unit that has a coupling structure coupled with a first other connector apparatus and executes demodulation processing on the basis of a received radio signal and converts the signal into an electrical signal;

a first radio coupling unit that is connected to the first signal converting unit and transmits the radio signal;

an electrical/optical converting unit that converts the electrical signal converted by the first signal converting unit into an optical signal and supplies the optical signal to the optical cable;

a second signal converting unit that has a coupling structure coupled with a second other connector apparatus and executes modulation processing and converts the signal into a high-frequency signal;

a second radio coupling unit that is connected to the second signal converting unit and transmits the radio signal;

an electrical/optical converting unit that converts the optical signal transmitted through the optical cable into the electrical signal and supplies the electrical signal to the second signal converting unit, wherein the connector apparatus is coupled with the first other connector unit to form a first electromagnetic field coupling unit between the first radio coupling unit and the first radio coupling unit of the first other connector unit, and the connector apparatus is coupled with the second other connector unit to form a second electromagnetic field coupling unit between the second radio coupling unit and the second radio coupling unit of the second other connector unit.

<Note 7>

A signal transmission method including:

using an optical cable transmitting an optical signal, a first connector apparatus, a second connector apparatus coupled with the first connector apparatus through the optical cable, a third connector apparatus coupled with the first connector apparatus, and a fourth connector apparatus coupled with the second connector apparatus;

transmitting a radio signal between the first connector apparatus and the third connector apparatus;

converting an electrical signal obtained by demodulating the radio signal received from the third connector apparatus into an optical signal and supplying the optical signal to the optical cable, by the first connector apparatus;

converting the optical signal transmitted through the optical cable into the electrical signal and converting the electrical signal into the radio signal, by the second connector apparatus; and transmitting the radio signal between the second connector apparatus and the fourth connector apparatus.

<Name, Technical Field, and Effect of Fourth Note Technology>

The fourth note technology relates to a signal transmission system, a connector apparatus, an electronic device, and a signal transmission method.

According to one aspect of the fourth note technology, connection interfaces of signals for which high speed and large capacity are required can be realized, different from connection interfaces using contacts. The fourth note technology can be applied to a connector not having a structural room in which contact pins cannot be additionally provided. The connection interfaces using the contacts can be continuously maintained. Therefore, connection interfaces of signals for which high speed and large capacity are required can be realized while backward compatibility with an existing connector is maintained.

Because the signal transmission before and after the radio transmission is performed using an optical signal, the high speed and the large capacity can be securely realized.

REFERENCE SIGNS LIST

| | |
|---|---|
| 1 | signal transmission system |
| 2, 8 | electronic device |
| 4 | connection cable |
| 5 | power supply cable |
| 12, 14 | electromagnetic field coupling unit |
| 22, 84 | receptacle |
| 40 | cable unit |
| 42, 44, 52, 54 | plug |
| 120, 125, 130, 135 | coupler unit |
| 200 | broadband information processing unit |
| 202, 402, 602, 802 | wireless communication unit |
| 404, 406, 604, 606 | wired communication unit |

-continued

| | |
|---|---|
| 800 | broadband information processing unit |
| 1100 | radio transmission circuit |
| 1200 | signal processing unit |
| 1300, 3300, 3500, 5300, 7300 | timing signal generating unit |
| 3100 | radio reception circuit |
| 5100 | front-stage signal processing unit |
| 5200 | rear-stage signal processing unit |
| 9010 | conductor wire |
| 9020 | optical fiber |

The invention claimed is:

1. A signal transmission system comprising:

a first connector apparatus; and a second connector apparatus configured to couple with the first connector apparatus to form an electromagnetic field coupler, wherein the first connector apparatus includes a radio coupler having a first waveguide, the second connector apparatus includes a second radio coupler having a second waveguide, the first waveguide and the second waveguide are configured to face each other to pass radio transmissions through the first and second waveguides, and electromagnetic waves of the radio transmissions traverse at least one interface between a dielectric of the first connector apparatus and the second connector apparatus via a cavity formed by coupling the first connector apparatus and the second connector apparatus to form the electromagnetic field coupler.

2. The signal transmission system according to claim 1, further comprising:

a first signal converting circuit that executes modulation processing on the basis of the signal and converts the signal into a high-frequency signal; and a second signal converting circuit that executes demodulation processing on the basis of a received radio signal and converts the signal into a baseband signal, wherein the first radio coupler of the first connector apparatus is electrically connected to the first signal converting circuit, the second radio coupler of the second connector apparatus is electrically connected to the second signal converting circuit, and the first connector apparatus and the second connector apparatus are coupled together to form the electromagnetic field coupler to transmit the radio signal between the first radio coupler and the second radio coupler, the signal is converted into the high-frequency signal by the first signal converting circuit, and a radio signal based on the high-frequency signal is transmitted to the second signal converting circuit through the electromagnetic field coupler.

3. The signal transmission system according to claim 2, wherein the first radio coupler has a first transmission path coupler connected to the first signal converting circuit through a first high-frequency transmission path, the second radio coupler has a second transmission path coupler connected to the second signal converting circuit through a second high-frequency transmission path, and radio transmission is performed in a space between the first transmission path coupler and the second transmission path coupler that is formed when the first connector apparatus and the second connector apparatus are coupled together.

4. A signal transmission system comprising:

a first connector apparatus; and a second connector apparatus coupled with the first connector apparatus, wherein the first connector apparatus and the second connector apparatus are configured to be coupled together to form an electromagnetic field coupler, wherein the first connector apparatus includes a first radio coupler, the second connector apparatus includes a second radio coupler and a waveguide, and electromagnetic waves traverse at least one interface between a dielectric of the first connector apparatus and the second connector apparatus via a cavity formed by coupling the first connector apparatus and the second connector apparatus to form the electromagnetic field coupler.

5. The signal transmission system according to claim 1, further comprising a signal system that performs signal transmission by an electrical contact between the first connector apparatus and the second connector apparatus, when the first connector apparatus and the second connector apparatus are coupled together.

6. The signal transmission system according to claim 1, wherein any one of the first connector apparatus and the second connector apparatus is provided in an electronic device, and the signal transmission system further comprises a power supply system that supplies power when the first connector apparatus is coupled with the second connector apparatus.

7. The signal transmission system according to claim 1, further comprising:

an electronic device; and a connection cable that performs signal transmission between the electronic device and the connection cable, wherein the electronic device has one of the first connector apparatus and the second connector apparatus, the connection cable has the other of the first connector apparatus and the second connector apparatus, and the connector apparatus that is provided in the connection cable has a wired communication circuit that performs a conversion of a radio signal and a wired signal transmitted through the connection cable.

8. The signal transmission system according to claim 7, wherein the connection cable has a conducting wire that transmits an electrical signal corresponding to the radio signal; and the wired communication circuit generates the electrical signal corresponding to the radio signal, as the wired signal.

9. The signal transmission system according to claim 7, wherein the wired communication circuit executes signal processing for decreasing a transmission speed per signal line by parallelization of signals.

10. The signal transmission system according to claim 7, wherein any one of the first connector apparatus and the second connector apparatus is provided in each of a plurality of electronic devices, and the other of the first connector apparatus and the second connector apparatus is provided in both ends of the connection cable.

11. The signal transmission system according to claim 1, wherein the signal transmission system corresponds to bidirectional communication, and one set of electromagnetic field couplers are shared in each direction of the bidirectional communication.

12. The signal transmission system according to claim 11, further comprising:

a direction managing circuit that separates a radio signal to be transmitted to the electromagnetic field coupler and a radio signal transmitted from the electromagnetic field coupler.

13. The signal transmission system according to claim 11, wherein the bidirectional communication is performed using each different carrier frequency, and a frequency selection functional circuit corresponding to each different carrier frequency is provided in each reception system of each direction.

14. A connector apparatus, having a coupling structure that is coupled with another connector apparatus, comprising:

a radio coupler connected to a signal converting circuit to execute modulation processing on the basis of a signal and convert the signal into a high-frequency signal and execute demodulation processing on the basis of a received radio signal and convert the signal into a baseband signal and transmits the radio signal, and the connector apparatus is coupled with the other connector apparatus to form an electromagnetic field coupler between the radio coupler and a radio coupler of the other connector apparatus, wherein the connector apparatus includes a first waveguide, the other connector apparatus includes a second waveguide, and the first waveguide and the second waveguide are configured to face each other to pass radio transmissions through the first and second waveguides, and electromagnetic waves corresponding to the radio transmissions traverse at least one interface between a dielectric of the first connector apparatus and the second connector apparatus via a cavity formed by coupling the first connector apparatus and the second connector apparatus.

15. The connector apparatus according to claim 14, further comprising:

the signal converting circuit.

16. The connector apparatus according to claim 14, further comprising:

a connection cable that performs signal transmission; and a wired communication circuit that performs communication using a wired signal through the connection cable and performs a conversion of the wired signal transmitted through the connection cable and a high-frequency signal corresponding to the radio signal.

17. An electronic device comprising:

a connector that has a coupling structure coupled with another connector apparatus; and a signal converting circuit that executes modulation processing on the basis of a signal and converts the signal into a high-frequency signal and executes demodulation processing on the basis of a received radio signal and converts the signal into a baseband signal, wherein the connector has a radio coupler that is connected to the signal converting circuit and transmits the radio signal, and the connector is coupled with the other connector apparatus to form an electromagnetic field coupler between the radio coupler and a radio coupler of the other connector apparatus, wherein the connector apparatus includes a first waveguide, the other connector apparatus includes a second waveguide, and the first waveguide and the second waveguide are configured to face each other to pass radio transmissions through the first and second waveguides, and electromagnetic waves corresponding to the radio transmissions traverse at least one interface between a dielectric of the first connector apparatus and the second connector apparatus via a cavity formed by coupling the first connector apparatus and the second connector apparatus.

18. The electronic device according to claim 17, further comprising:

a connection cable that performs signal transmission between the other connector apparatus and the connection cable; and a wired communication circuit that performs communication using a wired signal through the connection cable and performs a conversion of the wired signal transmitted through the connection cable and a high-frequency signal corresponding to the radio signal.

19. A signal transmission method comprising:

using a first connector apparatus and a second connector apparatus, the first connector apparatus having a first radio coupler electrically connected to a first signal converting circuit executing modulation processing on the basis of a signal and converting the signal into a high-frequency signal, the second connector apparatus having a second radio coupler electrically connected to a second signal converting circuit executing demodulation processing on the basis of a received radio signal and converting the signal into a baseband signal;

coupling the first connector apparatus with the second connector apparatus to form an electromagnetic field coupler between the first radio coupler and the second radio coupler;

converting the signal into a high-frequency signal by the first signal converting circuit; and transmitting a radio signal based on the high-frequency signal to the second signal converting circuit through the electromagnetic field coupler, wherein the first connector apparatus includes a first waveguide, the second connector apparatus includes a second waveguide, and the first waveguide and the second waveguide are configured to face each other to pass radio transmissions through the first and second waveguides, and electromagnetic waves corresponding to the radio transmissions traverse at least one interface between a dielectric of the first connector apparatus and the second connector apparatus via a cavity formed by coupling the first connector apparatus and the second connector apparatus.

20. The signal transmission system according to claim 4, wherein when the first connector apparatus and the second connector apparatus are coupled together, the first radio coupler and the second radio coupler are electromagnetically coupled through the waveguide and radio transmission is performed.

21. A signal transmission system comprising:

a first connector apparatus; and a second connector apparatus coupled with the first connector apparatus, wherein the first connector apparatus and the second connector apparatus are configured to be coupled together to form an electromagnetic field coupler, wherein the first connector apparatus includes a radio coupler having a first waveguide, the second connector apparatus includes a second radio coupler having a second waveguide, the first waveguide and the second waveguide are configured to face each other to pass radio transmissions through the first and second waveguides, and wherein when the first connector apparatus and the second connector apparatus are coupled, a cross-section of the first waveguide in a longitudinal direction and a cross-section of the second waveguide in a longitudinal direction form a waveguide joining structure, and radio transmission is performed through the waveguide joining structure.

22. The signal transmission system according to claim 1, wherein the at least one interface between the dielectric of the first connector apparatus and the second connector apparatus is at least one interface between the dielectric of the first connector apparatus and a slot formed on the second connector apparatus.

23. The signal transmission system according to claim 1, wherein at least one of the first and second waveguides is hollow.

24. The signal transmission system according to claim 1, wherein the radio transmission are passed through the first and second waveguides using a millimeter-wave signal.

25. The signal transmission system according to claim 1, wherein at least one of the first and second waveguides include a shielding material.

26. The signal transmission system according to claim 4, wherein the waveguide includes at least one opening.

27. The signal transmission system according to claim 26, wherein the waveguide includes two openings.

* * * * *